US007451371B2

(12) United States Patent
Wang et al.

(10) Patent No.: US 7,451,371 B2
(45) Date of Patent: *Nov. 11, 2008

(54) MULTIPLE-CAPTURE DFT SYSTEM FOR SCAN-BASED INTEGRATED CIRCUITS

(75) Inventors: Laung-Terng Wang, Sunnyvale, CA (US); Xiaoqing Wen, Sunnyvale, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 528 days.

This patent is subject to a terminal disclaimer.

(21) Appl. No.: 11/151,258

(22) Filed: Jun. 14, 2005

(65) Prior Publication Data
US 2005/0235186 A1 Oct. 20, 2005

Related U.S. Application Data

(62) Division of application No. 10/101,517, filed on Mar. 20, 2002, now Pat. No. 6,954,887.

(60) Provisional application No. 60/277,654, filed on Mar. 22, 2001.

(51) Int. Cl.
*G01R 31/28* (2006.01)
(52) U.S. Cl. ...................... 714/729; 714/731
(58) Field of Classification Search .................. 714/729, 714/731
See application file for complete search history.

(56) References Cited

U.S. PATENT DOCUMENTS 5,349,587 A * 9/1994 Nadeau-Dostie et al. ..... 714/729
5,680,543 A 10/1997 Bhawmik ..................... 714/30

(Continued)

FOREIGN PATENT DOCUMENTS

EP 0 965 850 A 12/1999
WO WO 02/067001 A1 8/2002

OTHER PUBLICATIONS

G. Hetherington et al, "Logic BIST for Large Industrial Designs: Real Issues and Case Studies", Proc., IEEE International Test Conference, Paper No. 142, 1999, pp. 358-367.
U.S. Appl. No. 60/089,620, filed Jun. 16, 1998, Hassan et al.

*Primary Examiner*—Joseph D Torres
(74) *Attorney, Agent, or Firm*—Bacon & Thomas, PLLC

(57) ABSTRACT

A method and apparatus for providing ordered capture clocks to detect or locate faults within N clock domains and faults crossing any two clock domains in a scan-based integrated circuit or circuit assembly in self-test or scan-test mode, where N>1 and each domain has a plurality of scan cells. The method and apparatus will apply an ordered sequence of capture clocks to all scan cells within N clock domains where one or more capture clocks must contain one or more shift clock pulses during the capture operation. A computer-aided design (CAD) method is further developed to realize the method and synthesize the apparatus. In order to further improve the circuit's fault coverage, a CAD method and apparatus are further developed to minimize the memory usage and generate scan patterns for full-scan and feed-forward partial-scan designs containing transparent storage cells, asynchronous set/reset signals, tri-state busses, and low-power gated clocks.

33 Claims, 34 Drawing Sheets

U.S. PATENT DOCUMENTS

| | | |
|---|---|---|
| 5,909,451 A | 6/1999 | Lach et al. |
| 5,991,909 A * | 11/1999 | Rajski et al. ................ 714/729 |
| 6,070,260 A | 5/2000 | Buch et al. ................. 714/731 |
| 6,085,336 A | 7/2000 | Swoboda et al. |
| 6,115,763 A | 9/2000 | Douskey et al. |
| 6,195,776 B1 | 2/2001 | Ruiz et al. .................. 714/738 |
| 6,327,684 B1 * | 12/2001 | Nadeau-Dostie et al. .... 714/731 |
| 6,442,722 B1 * | 8/2002 | Nadeau-Dostie et al. .... 714/731 |
| 6,954,887 B2 * | 10/2005 | Wang et al. ................. 714/729 |
| 2003/0097614 A1 | 5/2003 | Rajski et al. |

\* cited by examiner

MULTIPLE-CAPTURE DFT SYSTEM FOR SCAN-BASED INTEGRATED CIRCUITS

RELATED APPLICATION DATA

The present application is a divisional application of Ser. No. 10/101,517 filed Mar. 20, 2002 now U.S. Pat. No. 6,954,887 which claims the benefit of provisional application No. 60/277,654 filed Mar. 22, 2001.

TECHNICAL FIELD

The present invention generally relates to the field of CAD (computer-aided design) for testing a scan-based integrated circuit or circuit assembly. Specifically, the present invention relates to test clock control and combinational ATPG (automatic test pattern generation) for generating very-high fault coverage scan patterns for testing a scan-based integrated circuit or circuit assembly with multiple clock domains.

BACKGROUND

In this specification, the term integrated circuit is used to indicate a single chip or MCM (multi-chip module), while the term circuit assembly is used to indicate a combination of integrated circuits.

An integrated circuit or circuit assembly generally contains multiple clocks, either generated internally or controlled externally. Each clock is distributed to a set of storage cells via a skew-minimized network, which delivers a clock pulse to all the storage cells at virtually the same time. Such a clock, its related storage cells, and all combinational logic blocks bounded by the storage cells, form a clock domain. It should be noted that, however, although the clock skew of any clock domain is minimized, the clock skew between any two clock domains could be large and unpredictable.

Scan design is the most widely used design-for-test technique, which replaces all or part of original storage cells with scan cells that form one or more scan chains. A scan-based integrated circuit or circuit assembly can be tested by repeating a shift cycle followed by a capture cycle. In a shift cycle, pseudorandom or predetermined test stimuli are shifted into all scan cells, making their outputs as controllable as primary inputs. In a capture cycle, test responses are latched into some or all scan cells, making their inputs as observable as primary outputs, because the values captured into scan cells can be shifted out in the next shift cycle.

Now consider the testing of a scan-based integrated circuit or circuit assembly with multiple clock domains. In a shift cycle, since scan cells in different clock domains are usually connected into different scan chains, it is easy to guarantee that each scan chain operates correctly as a shift register. In a capture cycle, however, a race problem might occur due to multiple clock domains. For example, suppose that clock domain CD1 is connected to clock domain CD2 through a crossing clock-domain logic block. In this case, if both clock domains capture at the same time, clock domain CD2 may capture different values depending on the clock skew between the two clock domains CD1 and CD2. This race problem in a capture cycle makes it difficult to test a scan-based integrated circuit or circuit assembly with multiple clock domains, in either scan-test or self-test mode.

Prior-art solutions for this race problem are based on either a single-capture approach or a multiple-capture approach, depending on if skewed capture clock pulses are applied to multiple clock domains in one capture cycle. The prior-art solutions based on the single-capture approach include the isolated DFT (design-for-test) technique (prior-art solution #1), the ratio'ed DFT technique (prior-art solution #2), and the one-hot DFT technique (prior-art solution #3), while the prior-art solutions based on the multiple-capture approach include four solutions, two for scan-test (prior-art solution #4 and prior-art solution #5), one for self-test (prior-art solution #6), and one for both scan-test and self-test (prior-art solution #7), as summarized below:

Prior-art solution #1 is described in U.S. Pat. No. 6,327,684 by Nadeau-Dostie et al. (2001). In this so-called isolated DFT technique, signal propagation from one clock domain to another is blocked by adding additional logic, thus preventing any adverse effect caused by the potential race problem. This solution, however, suffers from several disadvantages: First, it requires that blocking logic be inserted between interacting clock domains, which has adverse impact on design cost, chip size, and performance. Second, the scan enable signal associated with each clock domain should be able to operate at-speed, which requires complicated routing as in CTS (clock tree synthesis). Third, since two clock domains may interact with each other in both directions, crossing clock-domain faults have to be tested in two or more test sessions. This bi-directional interaction not only increases the test time but also complicates blocking logic insertion.

Prior-art solution #2 is described in U.S. Pat. No. 5,349,587 by Nadeau-Dostie et al. (1994). In this so-called ratio'ed DFT technique, the clocks for all clock domains are required to operate at one of three frequencies: F, F/2, and F/4, where F is the highest system clock frequency or a reference clock frequency. For example, even though a design has 3 clocks running at 150 MHz, 80 MHz, and 45 MHz, respectively, they have to be reconfigured to operate at 150 MHz, 75 MHz, and 37.5 MHz, respectively, during test. This technique makes it easy to align capture clock pulses for all clock domains which is capable of testing all clock domains and all crossing clock-domain logic blocks in parallel. This solution, however, suffers from several disadvantages: First, the test quality of this technique is low since test clock frequencies are not at-speed for all clock domains. Second, this technique requires a clock pre-scaler which increases the risk of clock glitches. Third, this technique requires significant physical design efforts related to aligning capture clock edges for all clock domains. Finally, power consumption could be too high since all scan cells are triggered simultaneously every few clock cycles.

Prior-art solution #3 is described in U.S. Pat. No. 5,680,543 by Bhawmik et al. (1997). The first step in this so-called one-hot DFT technique is to initialize all crossing clock-domain signals flowing into their receiving clock domains by shifting in predetermined logic values to all clock domains. The second step is to test one clock domain after another. The major advantage of this technique is its ability to detect or locate crossing clock-domain faults without inserting any blocking logic into any paths, in particular critical paths. This solution, however, suffers from several disadvantages: First, this technique tests one clock domain at a time, resulting in long test time. Second, it requires significant design and layout efforts for synchronizing all clock domains.

Prior-art solution #4 and prior-art solution #5 are described in U.S. Pat. No. 6,070,260 by Buch et al. (2000) and U.S. Pat. No. 6,195,776 by Ruiz et al. (2001), respectively. These multiple-capture DFT techniques are proposed to test faults within each clock domain and faults between any two clock domains in scan-test mode. These techniques use multiple skewed scan clocks or multiple skewed capture events, each operating at the same reduced clock speed, in an ATE (automatic test equipment), to detect or locate faults. Combinational ATPG (automatic test pattern generation) is used to generate scan patterns, and ATE test programs are created, to detect or locate faults in an integrated circuit or circuit assembly. These solutions, however, suffer from a major disadvantage that they apply only one capture clock pulse to each clock domain in a capture cycle. This means that only stuck-at faults can be detected or located in scan-test mode. Delay faults, as well as stuck-at faults in a partial scan design, cannot be detected or located since multiple skewed capture clock pulses are needed for that purpose.

Prior-art solution #6 is described in a paper by Hetherington et al. (1999). This multiple-capture DFT approach is proposed to test faults within each clock domain and faults between any two clock domains in self-test mode. This technique basically generates a transition during the last shift-in operation, and then capture the test response to the transition with an at-speed capture clock pulse. This at-speed capture is conducted in a programmable capture window on all clock domains to detect or locate faults within each clock domain and faults between any two clock domains. This solution, however, suffers from two disadvantages: First, this technique requires complicated clock manipulation including clock suppression and clock multiplexing, which increases the risk of clock glitches. Second, the last shift clock edges need to be precisely aligned for all clock domains, which makes it difficult to perform at-speed self-test for integrated circuits with clock domains operating at unrelated frequencies, e.g. 60 MHz and 133 MHz.

Prior-art solution #7 is described in International Patent Application No. PCT/US 02/01251 by Wang et al. (2002). This multiple-capture DFT technique applies a sequence of ordered capture clocks to all clock domains in a capture cycle. This technique can be used to test faults within each clock domain and faults between any two clock domains in either self-test or scan-test mode. Both stuck-type faults, including open, IDDQ (IDD quiescent current), and bridging faults, as well as delay-type faults, including transition or gate-delay, path-delay, and multiple-cycle delay faults, can be detected or located. In addition, both reduced-speed (slow-speed) test and at-speed test can be conducted. The key advantage of the technique is that no clock edge alignment in either a shift cycle or a capture cycle is needed, making it easy to complete physical design. Another key feature of the technique is the use of two capture clock pulses in testing delay-type faults, which requires processing more time frames in fault simulation or ATPG (automatic test pattern generation). For a very large scale integrated circuit, efforts should be made to reduce time needed for such fault simulation or ATPG.

Therefore, there is a need for an improved scan design system, comprising a method, apparatus, and a CAD (computer-aided design) system, which uses a multiple-capture DFT technique to conduct at-speed or slow-speed testing of both stuck-type and delay-type faults within each clock domain and between any two clock domains in an integrated circuit or circuit assembly. This multiple-capture DFT technique should be less intrusive (refer to prior-art solution #1), changes no clock frequencies during test (refer to prior-art solution #2), applies capture clock pulses to all clock domains in each capture cycle (refer to prior-art solution #3), can apply multiple capture clock pulses for one clock domain to detect or locate delay-type faults (refer to prior-art solution #4 and prior-art solution #5), needs less clock manipulation (refer to prior-art solution #6), and processes less time frames in fault simulation or ATPG (automatic test pattern generation) (refer to prior-art solution #7).

In addition to the race problem discussed above, the testing of a scan-based integrated circuit or circuit assembly with multiple clock domains also suffers from some problems related to fault simulation in both self-test and scan-test modes and ATPG in scan-test mode. Prior-art solutions for fault simulation or ATPG related problems are based on either a single-capture approach or a multiple-capture approach, depending on if skewed clock pulses are applied to multiple clock domains in one capture cycle. The prior-art solution based on the single-capture approach includes the one-hot DFT technique (prior-art solution #8), while the prior-art solution based on the multiple-capture approach includes the PCE (primary capture event) based ATPG technique (prior-art solution #9), as summarized below:

Prior-art solution #8 is known as the so-called one-hot DFT technique. The major disadvantage of this technique is that the number of test patterns tends to be large since the capture clock is active for only one clock domain in each capture cycle. This results in not only long test time but also large test data volume, which will in turn increase the test cost.

Prior-art solution #9 is described in U.S. Pat. No. 6,195,776 by Ruiz et al. (2001). The DFT (design-for-test) technique uses multiple skewed capture events for all clock domains in one capture cycle to test faults in an integrated circuit, which is composed of a combinational logic portion and scan cells. When this DFT technique is applied, the circuit behavior during a capture cycle can be fully represented by several copies of the combinational logic portion, each with a different set of constraints on its inputs and outputs and each corresponding to a time frame. In the fault simulation or ATPG solution associated with this DFT technique, only one copy of the combinational logic portion corresponding to the so-called PCE (primary capture event) is selected for circuit transformation. As a result, a combinational circuit model is obtained to perform fault simulation or ATPG. The disadvantage of this solution is that all other copies of the combinational logic portion are discarded, and that some of the constrained values on the selected copy are set to unknown values. Obviously, the fault coverage will be low given a certain number of test patterns. To increase the fault coverage, a large number of test patterns may have to be used. In addition, this DFT technique forces unknown values on asynchronous set/reset pins to avoid any destructive race problem. However, this will result in lower fault coverage due to the unknown values.

Therefore, there is also a need for an improved fault simulation or test pattern generation system, comprising a method and a CAD system, that uses a fault simulation or ATPG solution to achieve a high coverage with a small number of test patterns for both stuck-type and delay-type faults within each clock domain and between any two clock domains in an integrated circuit or circuit assembly implemented with a multiple-capture DFT technique. The memory size needed to implement the fault simulation or ATPG solution should be as small as possible. In addition, the ATPG solution should be able to properly handle such special structures as asynchronous set/reset pins, tri-state buses, and low-power gated clocks. Furthermore, there is a need for an improved apparatus that can properly handle such special structures as asynchronous set/reset signals, tri-state busses, and low-power gated clocks.

SUMMARY

An objective of the present invention is to provide an improved multiple-capture DFT (design-for-test) system for both self-test and scan-test. This DFT system comprises a method or apparatus for allowing both at-speed and slow-speed detection or location of both stuck-type faults, including open, IDDQ (IDD quiescent current), and bridging faults, as well as delay-type faults, including transition (gate-delay), multiple-cycle delay, and path-delay faults, within and between all clock domains in a scan-based integrated circuit or circuit assembly, which can be a full-scan, almost-full scan, or feed-forward partial scan design. In the present invention, the method or apparatus can be implemented either inside or outside the integrated circuit or circuit assembly. The present invention further comprises a CAD (computer-aided design) system that synthesizes such a DFT system and generates desired HDL (hardware description language) test benches and ATE (automatic test equipment) test programs.

A scan-based integrated circuit or circuit assembly generally contains multiple clock domains, each controlled by a capture clock. Testing such an integrated circuit or circuit assembly requires conducting a shift cycle followed by a capture cycle repeatedly until predetermined test criteria are met. In a shift cycle, all scan cells operate as one or more shift registers where pseudorandom or predetermined stimuli are loaded into all scan cells within all clock domains concurrently. At the same time, test responses, previously captured into scan cells, are shifted out for either compaction or comparison. After a shift cycle is completed, a capture cycle is entered where scan cells capture values or test responses propagating through functional logic blocks from one stage of scan cells to the next. The switch between a shift cycle and a capture cycle in each clock domain is controlled by an embedded scan enable (SE) signal. Usually, setting a SE signal to logic value 1 starts a shift cycle, while setting a SE signal to logic value 0 starts a capture cycle. In order to test such a scan-based integrated circuit or circuit assembly with multiple clock domains by using a multiple-capture DFT technique, it is necessary to properly control all scan enable (SE) signals and all capture clocks in both shift and capture cycles. The multiple-capture DFT technique specified in the present invention is summarized as follow:

(a) Improved Scan Enable Design

The present invention comprises any method or apparatus that allows each clock domain have its own embedded scan enable (SE) signal, either generated internally or controlled externally, in self-test or scan-test mode. In addition, any SE signal can operate either at the rated clock speed (at-speed) or at a selectively reduced clock speed. Furthermore, it is allowed to selectively use one or more global scan enable (GSE) signals to drive a plurality of embedded SE signals, wherein such a GSE signal runs at a selected clock speed. The benefit is the easiness of physical design for SE signals.

The present invention further comprises any method or apparatus that allows totally independent scan enable (SE) control among different SE signals, in self-test or scan-test mode. The benefit is that there is no need to align last shift pulse edges for all clock domains, which can be hardware-costly and timing-risky.

(b) Improved Shift Cycle Control

The present invention comprises any method or apparatus that shifts or loads pseudorandom or predetermined stimuli into all scan cells within all clock domains in a shift cycle for a scan-based integrated circuit or circuit assembly, in self-test or scan-test mode. At the same time, test responses previously captured into scan cells are shifted out of scan chains either for compaction in self-test mode or for comparison in scan-test mode. The shift operation in each clock domain can be conducted either at its own selected clock speed or at the same clock speed with other clock domains. If all clock domains conduct shift operations at the same clock speed, capture clocks can be selectively skewed in phase so that at any given time only scan cells within one clock domain can change their states. The benefit is lower power consumption.

(c) Improved Capture Cycle Control

The present invention comprises any method or apparatus that applies an ordered sequence of capture clocks to all scan cells within all clock domains in a capture cycle, for self-test or scan-test mode. It is required that one or more capture clocks must contain one or more shift clock pulses during the capture operation, which can be realized by setting different logic values to scan enable (SE) signals of different clock domains. The benefits are that there is no clock skew related problem and that faults crossing clock domains can be detected and located.

The present invention further comprises any method or apparatus that applies an ordered- sequence of capture clocks to conduct capture operations concurrently on a plurality of clock domains, which do not interact with each other, in self-test or scan-test mode. The benefit is shorter test time.

The present invention further comprises any method or apparatus that applies different ordered sequences of capture clocks in different capture cycles, for self-test or scan-test. One ordered sequence of capture clocks could be selectively longer or shorter than another. The benefit is that additional faults in a scan-based integrated circuit or circuit assembly can be detected or located.

The present invention further comprises any method or apparatus that can selectively operate a capture clock at a selected clock speed for detecting or locating stuck-type faults within the clock domain controlled by the capture clock, in self-test or scan-test mode. In this case, only one capture clock pulse is needed, and the delay between the last shift pulse and the capture pulse can be any time period that is longer than the logic delay from one stage of scan cells to the next. Note that there is no need to align last shift pulses or capture pulses across all clock domains. The benefits are the flexibility and the easiness in controlling capture clocks.

The present invention further comprises any method or apparatus that can selectively operate a capture clock at its rated clock speed for detecting or locating delay-type faults within the clock domain controlled by the capture clock, in self-test or scan-test mode. First, transitions, such as 0-to-1 or 1-to-0, are launched at the outputs of scan cells during the last shift-in operation. Then, one at-speed capture clock pulse is applied to capture the responses to the transitions, which propagate through functional logic blocks, at the next stage of scan cells. Note that there is no need to align any shift pulses or capture pulses across any clock domains. The benefits are the flexibility and the easiness in capture clock control. In addition, since only one capture clock pulse is used in testing delay-type faults, its related fault simulation or ATPG (automatic test pattern generation) will need less memory and shorter execution time.

Furthermore, the present invention allows a hybrid approach in which, in addition to the above scheme wherein one capture pulse is used, double capture pulses can be used in some clock domains for detecting or locating delay-type faults. In this case, a transition is launched by the last shift pulse and the first capture pulse. Then, the second capture pulse is applied at-speed to capture the response to the transition.

The present invention further comprises any method or apparatus that can selectively reduce a capture clock speed to the level where delay-type faults associated with all multiple-cycle paths of equal cycle latency within the clock domain can be tested at a predetermined rated clock speed, in self-test or scan-test mode. The benefit is that delay-type faults associated with multiple-cycle paths can be tested by properly controlling capture clocks instead of incurring circuit changes. As a result, the hardware overhead is low. In addition, there is no functional performance degradation.

The present invention further comprises any method or apparatus that can selectively operate two capture clocks at selected clock speeds for detecting or locating stuck-type faults crossing two clock domains, in self-test or scan-test mode. In this case, the delay time period between the capture clock pulse in one clock domain and the capture clock pulse in another clock domain can be any time period that is longer than the delay of the crossing clock-domain logic block between the two clock domains. The benefit is that crossing clock-domain stuck-type faults can be tested by properly controlling capture clocks instead of incurring circuit changes or aligning capture clock edges. As a result, the hardware overhead is low and timing control is easy. In addition, there is no functional performance degradation.

The present invention further comprises any method or apparatus that can selectively adjust the relative clock delay between two capture clocks operating at selected clock speeds for detecting or locating delay-type faults crossing two clock domains, in self-test or scan-test mode. In this case, the delay time period between the capture clock pulse in one clock domain and the capture clock pulse in another clock domain should be the same as functionally specified, i.e. at-speed. The benefit is that crossing clock-domain delay-type faults can be tested by properly controlling capture clocks instead of incurring circuit changes or aligning capture clock edges. As a result, the hardware overhead is low and timing control is easy. In addition, there is no functional performance degradation.

The present invention further comprises any method or apparatus that can selectively adjust the relative clock delay between two capture clocks to the level where delay-type faults associated with all multiple-cycle paths of equal cycle latency crossing two clock domains are tested at a predetermined rated clock speed, in self-test or scan-test mode. The benefit is that crossing clock-domain delay-type faults with multiple-cycle paths are tested by properly controlling capture clocks instead of incurring circuit changes or aligning capture clock edges. As a result, the hardware overhead is slow and timing control is easy. In addition, there is no functional performance degradation.

The present invention further comprises any method or apparatus that can disable one or more capture clocks in self-test or scan-test mode. The benefit is that it helps in fault diagnosis.

The present invention further comprises any method or apparatus that selectively compares shifted-out test responses with expected ones after each capture cycle on an ATE (automatic test equipment) during scan-test.

The present invention further comprises any method or apparatus that compacts shifted-out test responses into a signature in self-test after each capture cycle. When a predetermined limiting criteria is reached, the final signature can be shifted out of an integrated circuit or circuit assembly to be compared with the expected signature. In addition, the final signature can also be compared directly with the expected signature the integrated circuit or circuit assembly.

Another objective of the present invention is to efficiently conduct fault simulation in self-test or generate as compact as possible a set of test patterns to achieve as high as possible coverage in scan-test, for both stuck-type and delay-type faults with reduced memory usage by providing an improved fault simulation or test generation system, comprising a method and a CAD system, for a scan-based integrated circuit or circuit assembly. This objective is realized by the following key improvements of the present invention:

(1) Single-Frequency Embedded Clock Minimization

The present invention comprises any software means that uses a CAD method to perform a clock-domain analysis based on the HDL (hardware description language) code or netlist of an integrated circuit or circuit assembly in order to identify clock domains that can share the same capture clock pulses in scan-test mode. The CAD method starts from embedded clock input signals in the analysis process and generates a minimum set of system clocks needed to test the integrated circuit or circuit assembly at a reduce clock speed but concurrently. This clock-domain analysis will result in less memory usage in fault simulation or test pattern generation and shorter test time. The present invention further comprises any apparatus that can merge and share embedded or system clocks with primary data input pins.

For example, consider a scan-based integrated circuit or circuit assembly with 8 clock domains, CD1 to CD8, controlled by embedded clocks, CK1 or CK8, respectively. Assume that one clock frequency, which may be applied with several different clock phases, is to be used to test the integrated circuit or circuit assembly on an ATE (automatic test equipment). Conventionally, in order to test all clock domains in a multiple-capture DFT technique, 8 different set of clock waveforms need to be applied. However, if two clock domains, e.g. CD2 and CD4, have no crossing clock-domain logic between them, in other words, if CD2 and CD4 do not interact with each other, the same set of clock waveforms can be applied to both CD2 and CD4.

(2) Multiple-Frequency Embedded Clock Minimization

The present invention comprises any software means that uses a CAD method to perform a clock-domain analysis based on the HDL (hardware description language) code or netlist of an integrated circuit or circuit assembly in order to identify clock domains that can share the same capture clock pulses in both scan-test and self-test modes. The CAD method starts from embedded clock input signals in the analysis process and generates the minimum set of system clocks needed to test the integrated circuit or circuit assembly at a reduce clock speed but concurrently. If used in scan-test mode, this clock-domain analysis will result in less memory usage in fault simulation or test pattern generation and shorter test time. If used in self-test mode, this clock-domain analysis will result in less memory usage is self-test circuitry synthesis, smaller self-test circuitry, shorter fault simulation time, and shorter test time. The present invention further comprises any apparatus that can merge and share embedded or system clocks with primary data input pins.

For example, consider a scan-based integrated circuit or circuit assembly with 8 clock domains, CD1 to CD8, controlled by embedded clocks, CK1 or CK8, respectively. Assume that each clock domain is to be tested at its intended clock frequency. Conventionally, in order to test all clock domains in a multiple-capture DFT technique, 8 different set of clock waveforms need to be applied. However, if two clock domains running at the same frequency, e.g. CD2 and CD4, have no crossing clock-domain logic between them, in other words, if CD2 and CD4 do not interact with each other, the same set of clock waveforms can be applied to both CD2 and CD4.

(3) Capture Clock Order Optimization

When a multiple-capture DFT technique is applied for a scan-based integrated circuit or circuit assembly, it is necessary to carefully determine the order of activating capture clocks in a capture cycle. The reason is that different orders may result in different memory usages for transforming such an integrated circuit or circuit assembly for fault simulation or ATPG.

For example, consider a scan-based integrated circuit or circuit assembly with 2 clock domains, CD1 and CD2, controlled by 2 embedded clocks, CK1 and CK2, respectively. Assume that there is a unidirectional crossing clock domain logic block CCD from clock domain CD1 to clock domain CD2. Also assume that, the sizes of CD1, CD2, and CCD, measured by the number of combinational logic primitives, are S(CD1), S(CD2), and S(CCD). In addition, assume that a single capture clock pulse is applied to each capture clock in a capture cycle. First, consider the capture order from CK1 to CK2. When CK1 captures, S(CD1) of memory is needed for circuit transformation; when CK2 captures, S(CD1l )+S(CCD)+S(CD2) of memory is needed for circuit transformation since values in clock domain CD1 have already changed because of the CK1 capture. That is, the total memory usage for this capture clock order is proportional to 2*S (CD1)+S(CCD)+S(CD2). Second, consider the capture order from CK2 to CK1. When CK2 captures, S(CCD)+S(CD2) of memory is needed for circuit transformation since values in clock domain CD1 have yet changed; when CK1 captures, S(CD1) of memory is needed for circuit transformation because there is no signal traveling from CD2 to CD1. That is, the total memory usage for this capture clock order is proportional to S(CD1)+S(CCD)+S(CD2). Obviously, it is better to use the order from CK2 to CK1 for conducting multiple-capture in a capture cycle.

The present invention comprises any software means that uses a CAD method to identify an optimal order for applying a sequence of capture clocks to all clock domains in a capture cycle, minimizing the memory usage in transforming a scan-based integrated circuit or circuit assembly for fault simulation or ATPG. In addition, a near-optimal capture clock order identified by any heuristic algorithm can also be used.

(4) Single-Frequency Multiple-Capture Test Generation Using Multiple Time Frames The present invention comprises any software means that uses a CAD method to transform the HDL (hardware description language) code or netlist of an integrated circuit or circuit assembly into a set of copies of its combinational portion corresponding to all capture clock edges or time frames, whose number is determined by the fault type to be targeted and the selected clock edge relation (overlapping or non-overlapping). Note that combinational fault simulation or scan test pattern generation is conducted based on the information contained in all time frames. Note also that each copy of the combinational portion has its own input and output constraints. The present invention further comprises any input text means for specifying the system clock phases, either in overlapping or non-overlapping mode.

For example, consider using a single-frequency multiple-capture DFT technique to test stuck-at faults in a scan-based integrated circuit or circuit assembly with 3 clock domains, CD1 to CD3, controlled by 3 clocks, CK1 to CK3, respectively. Assume that the three clock domains interact with each other and that the capture clock order has been determined to be CK1 first, CK2 second, and CK3 third. If an overlapping clock scheme is used, the 3 clocks, CK1 to CK3, can be specified as 0111000, 0011100, and 0001110, respectively, which have a total of 7 clock phases. If a non-overlapping clock scheme is used, the 3 clocks, CK1 to CK3, can be specified as 0100000, 0001000, and 0000010, respectively, which have a total of 7 clock phases. The single frequency that the 3 clocks, CK1 to CK3, share needs to be determined based on the ATE (automatic test equipment) to be used in test.

Note that circuit transformation involves removing or pruning constant logic tied to logic value 0, 1, unknown (X) or high-impedance (Z), uncontrollable logic, unobservable logic, and uncontrollable/unobservable logic from the original design database. This will reduce memory usage.

(5) Multiple-Frequency Multiple-Capture Test Generation Using Multiple Time Frames The present invention comprises any software means that uses a CAD method to transform the HDL (hardware description language) code or netlist of an integrated circuit or circuit assembly into a set of copies of its combinational portion corresponding to all capture clock edges or time frames, whose number is determined by the fault type to be targeted and the selected clock edge relation (overlapping or non-overlapping). Note that combinational fault simulation or scan test pattern generation is conducted based on the information contained in all time frames. Note also that each copy of the combinational portion has its own input and output constraints. The present invention further comprises any input text means for specifying the system clock phases, either in overlapping or non-overlapping mode.

For example, consider using a multiple-frequency multiple-capture DFT technique to test delay faults in a scan-based integrated circuit or circuit assembly with 4 clock domains, CD1 to CD4, controlled by 4 clocks, CK1 to CK4, respectively. Assume that CK1 and CK2 run at different frequencies but do not interact with each other. Also assume that CK3 and CK4 run at the same frequency but interact with each other. If a non-overlapping clock scheme is used, the 4 clocks, CK1 to CK4, can be specified as 0100000, 0100000, 0001000, and 0000010, respectively. In this case, a total of 7 phases are used.

Note that circuit transformation involves removing or pruning constant logic tied to logic value 0, 1, unknown (X) or high-impedance (Z), uncontrollable logic, unobservable logic, and uncontrollable/unobservable logic from the original design database. This will reduce memory usage.

(6) Feed-Forward Multiple-Capture Test Generation Using Multiple Time Frames

In some cases, the overhead associated with a scan design, including area increase introduced by replacing original storage cells with larger scan cells and routing difficulty introduced by the need of connecting scan cells into scan chains, can become too high to accept. To solve this problem, one can choose to replace only part of storage cells with scan cells., resulting in a partial-scan design, as against full-scan or almost full-scan design. Especially, one can choose to replace only part of storage cells with scan cells in such a manner that all sequential feedback loops are removed. Such a partial-scan design, called feed-forward partial-scale or pipe-lined partial-scan design, may have several non-scanned storage cells between two stages of scan cells. This property is characterized by cell-depth. For example, a partial-scan design of a cell depth of 2 means that a signal value can be propagated from one stage of scan cells to another by at most two clock pulses. Note that a full-scan or almost full-scan design has a cell-depth of 0.

The present invention comprises any software means that uses the CAD method to first transform or duplicate the netlist database as many times as needed for a feed-forward partial-scan design and then use a single-frequency or multiple-frequency multiple-capture test generation system, as specified in present invention, to detect or locate additional faults associated with non-scanned storage cells. During circuit transformation, the present invention further comprises any software means for removing or pruning constant logic tied to logic value 0, 1, unknown (X) or high-impedance (Z), uncontrollable logic, unobservable logic, and uncontrollable/unobservable logic from the original design database. This will reduce memory usage.

For example, consider a feed-forward partial-scan design with a cell depth of 2. For scan-test generation, one can shift a scan test pattern to all scan cells in a shift cycle. In the capture cycle, one first applies 2 system clock pulses in each clock domain for stuck-type faults or 3 system clocks for delay-type faults, and then capture the test response at scan cells for comparison or compaction.

(7) Transparent Scan Cell Retiming

A scan-based integrated circuit or circuit assembly may suffer from hold-time timing violations that prevent scan chains from operating correctly. For example, assume that the data output port of scan cell SC1 is connected directly to the scan data input port of scan cell SC2 in a scan chain. Also assume that the clock ports of scan cells SC1 and SC2 are CK1 and CK2, respectively, which can come form the same clock tree CT or from two different clock trees CT1 and CT2. In this case, if the clock skew in CT or between CT1 and CT2 is too large, a shift clock pulse may reach scan cell SC1 substantially faster than scan cell SC2. As a result, a hold-time violation may occur that renders scan cell SC2 to catch the value appearing at the D input of scan cell SC1 instead of the value appearing at the Q output of scan cell SC1.

Such a hold-time violation problem can be fixed at the layout level by minimizing clock skew or adding lock-up storage elements; but it could become very costly when there is no enough time to change layout. In this case, one needs to compensate for the hold-time violation problem in test pattern generation. The conventional solution is to force unknown values on scan cells in question, such as scan cell SC2 in the above example. Obviously, this will result in low fault coverage.

The present invention comprises any software means that uses a CAD method to force any specified scan cell transparent during a shift cycle. That is, if a scan cell receives shift clock pulses slower than its previous scan cell or faster than its next scan cell within the same scan chain, the ATPG in the present invention will be forced to understand this fact and use this information in test pattern generation. As a result, there is no need to fix hold-time violations at the layout level. In addition, higher fault coverage will be achieved since no unknown values are introduced.

(8) Asynchronous Set and Reset Detection Using Multiple Captures

A scan-based integrated circuit or circuit assembly generally contains asynchronous set/reset signals, which could ripple from the outputs of some scan cells to the set/reset pins of other scan cells. This could destroy the intended values of some scan cells in the process of shifting pseudorandom or predetermined values into scan cells for testing the integrated circuit or circuit assembly. In addition, incorrect values may be captured in a capture cycle due to hazardous value changes on some asynchronous set/reset signals. The conventional solution for this problem is to use a test enable signal to disable asynchronous set/reset signals or force unknown values on asynchronous set/reset signals to avoid any potential problem. Since a test enable signal remains unchanged during the whole test session or because of unknown asynchronous set/reset signal values, all faults feeding into asynchronous set/reset signals of scan cells become untestable, resulting in low fault coverage.

The present invention comprises any apparatus that uses a scan enable signal to fix the asynchronous set/reset problem. A scan enable signal has logic value 1 in a shift cycle, which can be used to disable asynchronous set/reset signals only in a shift cycle. In a capture cycle, since a scan enable signal can take both logic value 0 and logic value 1, asynchronous set/reset signals are released from disabling. As a result, all faults feeding into the asynchronous set/reset signals of the storage cells can be detected or located. This will result in higher fault coverage in fault simulation or test pattern generation.

The present invention further comprises any software means that uses a CAD method to generate a hazard-free test pattern during a capture cycle. That is, the test pattern will activate only one path leading to the asynchronous set/reset port of any scan cell. As a result, even though asynchronous set/reset signals are allowed to change values during a capture cycle, they would not create any hazard, which may invalidate a test pattern. This will result in higher test pattern quality as well as higher fault coverage.

(9) Potential Bus Contention Detection Using Multiple Captures

A scan-based integrated circuit may contain tri-state busses whose bus driver enable signals are not fully decoded. If the bus enable signals are affected by scan cells, there is a possibility that more than one bus drivers are turned on in a shift cycle, creating a bus contention problem. Conventional ATPG uses either a scan enable (SE) signal or a test enable (TE) signal to avoid bus contention only in any before-capture operation, where system clocks are held at logic value 0. Such ATPG may not be able to avoid bus contention in an after-capture operation, where system clocks are triggered. This is mainly due to the inefficiency of conventional combinational scan test generation algorithms.

The present invention comprises any apparatus that uses a scan enable signal to prevent bus contention in any shift cycle. During multiple-capture test generation, since a scan enable signal can take both logic value 0 and logic value 1 and a multiple-capture test generation algorithm is used, all faults feeding into tri-state busses can be detected or located by scan patterns guaranteed to be contention-free both before-capture and after-capture.

The present invention further comprises any software means that uses a CAD method to first transform the tri-state busses in an scan-based integrated circuit or circuit assembly into an internal model that allows the generation of contention-free scan patterns, and then use the single-frequency or multiple-frequency multiple-capture fault simulation or test generation algorithm, as specified in (4) and (5), to detect or locate additional faults associated with the tri-state busses.

(10) Low-Power Multiple-Capture Test Generation Using Multiple Time Frames

A scan-based integrated circuit or circuit assembly may contain power-saving circuitry for purposes such as increasing battery lifetime, reducing heat dissipation, etc. Such circuitry is commonly used in microprocessor IP's (intellectual properties) and wireless communications designs. The present invention comprises any software means that uses a CAD method to handle power-saving circuitry so that faults associated the circuitry can be test in fault simulation or test pattern generation in a full-scan, almost full-scan, or a feed-forward partial-scan design.

To summarize, the present invention uses an improved multiple-capture DFT technique, which has flexible scan enable (SE) design, flexible shift cycle control, and advanced capture cycle control. Separate or merged SE signals can be used, and a shift cycle for one clock domain can overlap with a capture cycle for another clock domain. In addition, shift clock control is conducted in a flexible way that reduced clock speeds or skewed clock phases can be used to reduce power consumption. Furthermore, capture clock pulses are generated in a highly sophisticated manner that both stuck-type faults and delay-type faults, with or without multiple-cycle paths, within all clock domains and between any two clock domains, can be detected or located without aligning capture clock edges or modifying with additional hardware. This multiple-capture DFT technique will greatly improve fault coverage, reduce test time, and lower hardware overhead. In addition, this technique is easy to implement in terms of physical design. The present invention further comprises an improved conventional fault simulation and conventional test pattern generation method based on a multiple-capture DFT technique. It reduces the number of clock domains that need to be controlled independently, optimizes the order of applying capture clocks, bases fault simulation or ATPG on a complete set of multiple time frames, and employs advanced methods to handle asynchronous set/reset signals, tri-state busses, and lower-power gated clocks. This fault simulation and test pattern generation system will greatly improve fault coverage with less memory usage.

In conclusion, the present invention provides an efficient solution to testing complicated and large-scale scan-based integrated circuits or circuit assemblies by achieving high test quality, in terms of high fault coverage for both stuck-type and delay-type faults in all clock domains and between any two clock domains, at a low test cost, in terms of less hardware overhead, shorter test time, less functional performance degradation, and less physical design efforts.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

The following description is of presently contemplated as the best mode of carrying out the present invention. This description is not to be taken in a limiting sense but is made merely for the purpose of describing the principles of the invention. The scope of the invention should be determined by referring to the appended claims.

Figure 1:
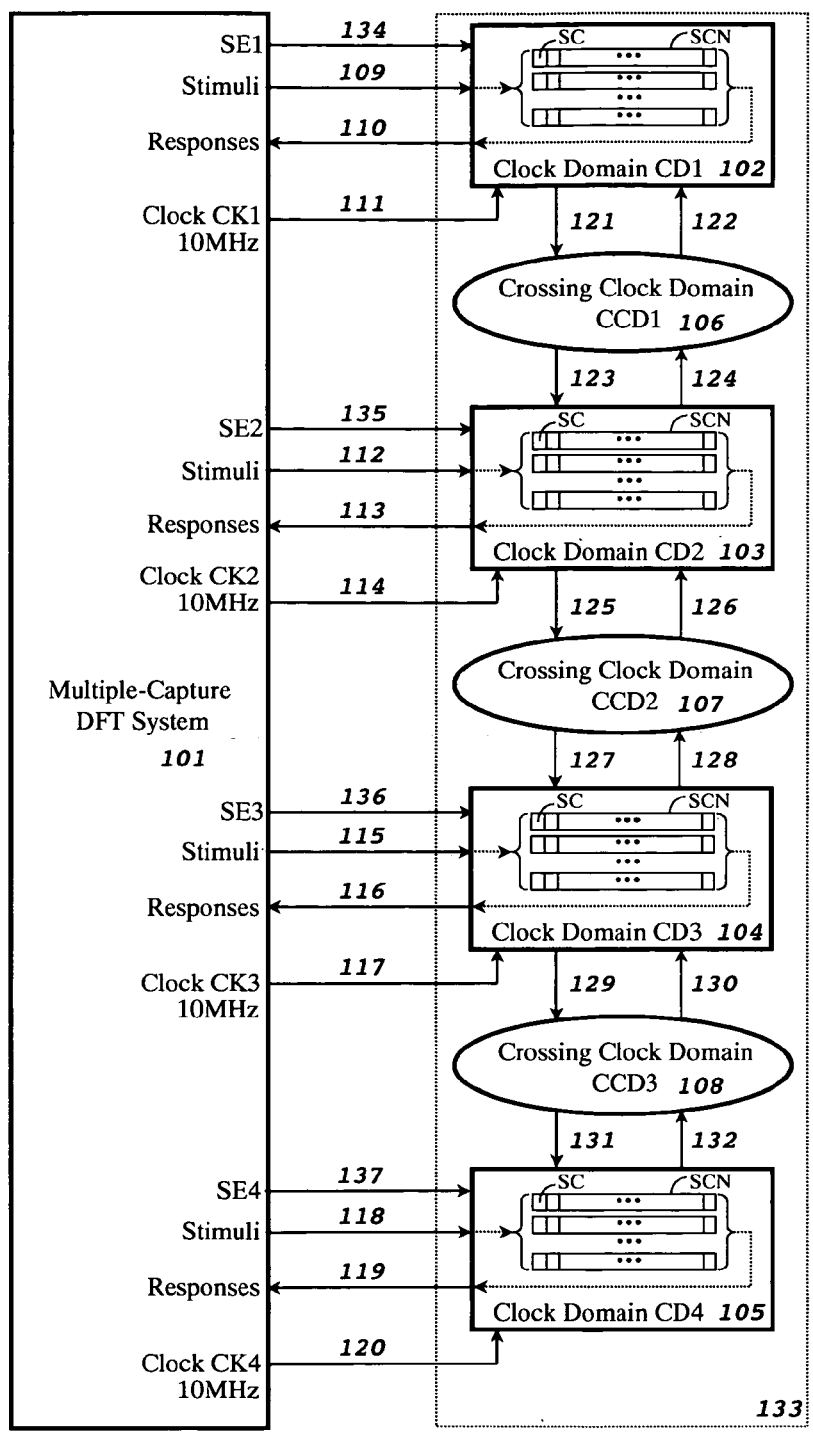
FIG. 1 shows an example full-scan or partial-scan design with 4 clock domains and 4 system clocks, where a multiple-capture DFT (design-for-test) system in accordance with the present invention is used to detect or locate stuck-at faults at a reduced clock speed in self-test or scan-test mode.

FIG. 1 shows an example full-scan or partial-scan design with a multiple-capture DFT (design-for-test) system, of one embodiment of the present invention. The design 133 contains 4 clock domains, CD1 102 to CD4 105, and 4 system clocks, CK1 111 to CK4 120, each controlling one clock domain. CD1 102 and CD2 103 interact with each other via a crossing clock-domain logic block CCD1 106; CD2 103 and CD3 104 interact with each other via a crossing clock-domain logic block CCD2 107; and CD3 104 and CD4 105 interact with each other via a crossing clock-domain logic block CCD3 108.

The 4 clock domains, CD1 102 to CD4 105, are originally designed to run at 150 MHz, 100 MHz, 100 MHz, and 66 MHz, respectively. However, in this example, since a DFT technique is only employed in either self-test or scan-test mode to detect or locate stuck-at faults in design 133, all system clocks, CK1 111 to CK4 120, are reconfigured to operate at 10 MHz. These reconfigured system clocks are called capture clocks.

In self-test or scan-test mode, the multiple-capture DFT system 101 will take over the control of all stimuli, 109, 112, 115, and 118, all system clocks, CK1 111 to CK4 120, all scan enable signals, SE1 134 to SE4 137, and all output responses, 110, 113, 116, and 119.

In a shift cycle, the multiple-capture DFT system 101 first generates and shifts pseudorandom or predetermined stimuli through 109, 112, 115, and 118 to all scan cells SC in all scan chains SCN within the 4 clock domains, CD1 102 to CD4 105, simultaneously. The multiple-capture DFT system 101 shall wait until all stimuli, 109, 112, 115, and 118, have been shifted into all scan cells SC. It should be noted that, during the shift operation, the capture clock could run either at its rated clock speed (at-speed) or at a desired clock speed.

After the shift operation is completed, an ordered sequence of capture clocks is applied to all clock domains, CD1 102 to CD4 105. In a capture cycle, each capture clock can operate at its rated clock speed (at-speed) or at a slow-speed, and can be generated internally or controlled externally. In this example, all system clocks, CK1 111 to CK4 120, are reconfigured to operate at a reduced frequency of 10 MHz.

After the capture operation is completed, the output responses captured into all scan cells SC are shifted out through responses 110, 113, 116, and 119 to the multiple-capture DFT system 101 for compaction during the compact operation in self-test mode or direct comparison during the compare operation in scan-test mode.

Based on FIG. 1, the timing diagrams given in FIG. 2 to FIG. 6 are used to illustrate that, by properly ordering the sequence of capture clocks and by adjusting relative inter-clock delays, stuck-at faults within each clock domain and stuck-at faults crossing clock domains can be detected or located in self-test or scan-test mode. Please note that different ways of ordering the sequence of capture clocks and adjusting relative inter-clock delays will detect or locate different faults.

Figure 2:
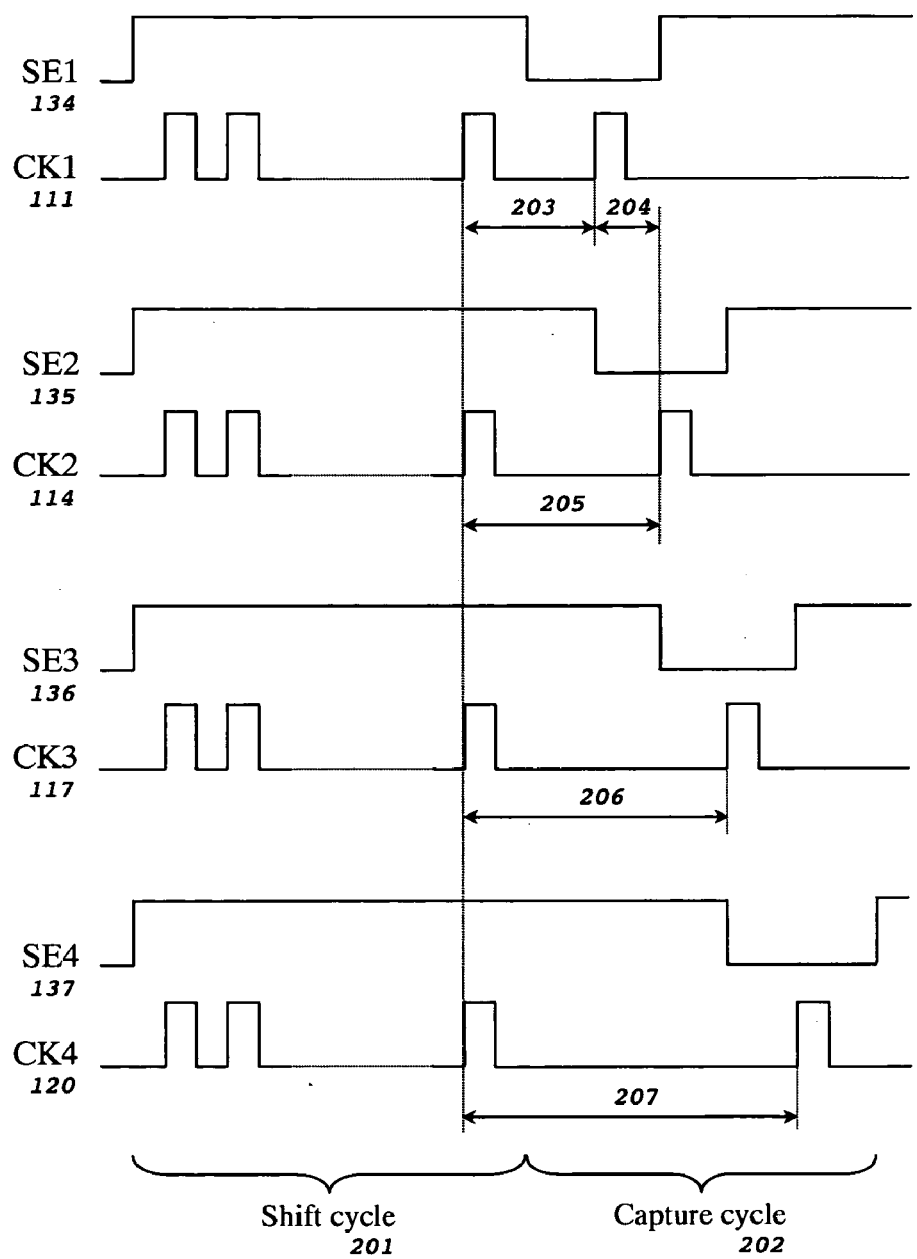
FIG. 2 shows a timing diagram of the full-scan design given in FIG. 1, in accordance with the present invention, where an ordered sequence of capture clocks is used to detect or locate stuck-at faults within each clock domain and stuck-at faults crossing clock domains in self-test or scan-test mode.

FIG. 2 shows a timing diagram of a full-scan design given in FIG. 1, of one embodiment of the present invention for detecting or locating stuck-at faults within each clock domain and stuck-at faults crossing clock domains with an ordered sequence of capture clocks in self-test or scan-test mode. The timing diagram 200 shows the sequence of waveforms of the 4 capture clocks, CK1 111 to CK4 120, operating at the same frequency, and the 4 scan enable (SE) signals, SE1 134 to SE4 137.

In each shift cycle 201, a series of pulses of 10 MHz are applied through capture clocks, CK1 111 to CK4 120, to shift stimuli to all scan cells SC within all clock domains, CD1 102 to CD4 105. In each capture cycle 202, 4 sets of capture clock pulses are applied in the following order: First, one capture pulse is applied to CK1 111; second, one capture pulse is applied to CK2 114; third, one capture pulse is applied to CK3 117; and fourth, one capture pulse is applied to CK4 120. As a result, stuck-at faults within all clock domains CD1 102 to CD4 105 are detected or located if the relative clock delays 203, 205, 206, and 207 are long enough so that no races or timing violations would occur while the capture operation is conducted within clock domains CD1 102 to CD4 105, respectively.

In addition, stuck-at faults within all crossing clock-domain logic blocks CCD1 106 to CCD3 108 are also detected or located. For example, consider the crossing clock-domain logic block CCD1 106. First, stuck-at faults that can be reached from line 124 in CCD1 106 are detected or located if the relative clock delay 203 is long enough so that no races or timing violations would occur while the output response 122 is captured. Second, stuck-at faults that can be reached from line 121 in CCD1 106 are detected or located if the relative clock delay 204 is long enough so that no races or timing violations would occur while the output response 123 is captured. The same principle also applies to crossing clock-domain logic blocks CCD2 107 and CCD3 108.

Figure 3:
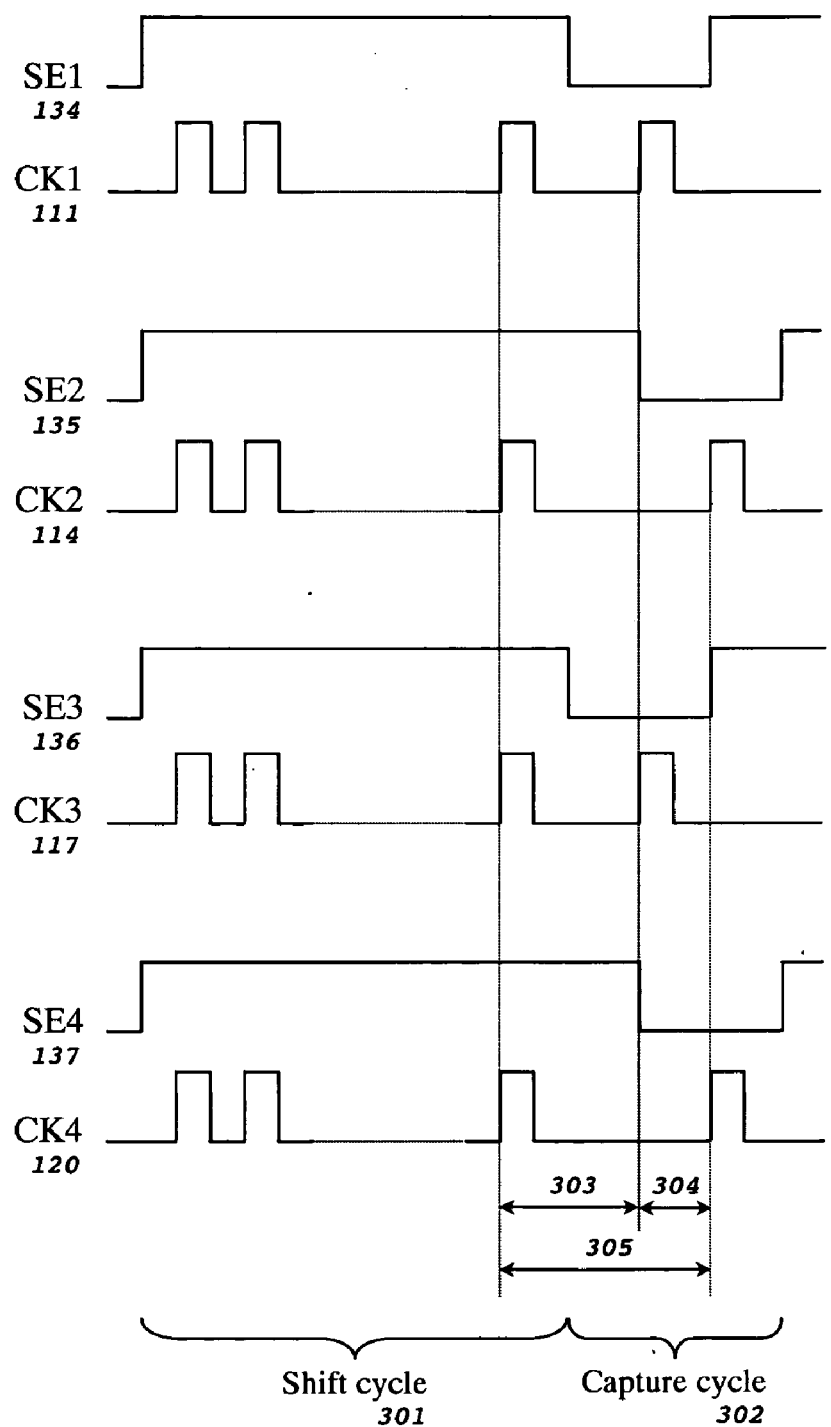
FIG. 3 shows a timing diagram of the full-scan design given in FIG. 1, in accordance with the present invention, where a shortened yet ordered sequence of capture clocks is used to detect or locate stuck-at faults within each clock domain and stuck-at faults crossing clock domains in self-test or scan-test mode.

FIG. 3 shows a timing diagram of a full-scan design given in FIG. 1, of one embodiment of the present invention for detecting or locating stuck-at faults within each clock domain and stuck-at faults crossing clock domains with a shortened yet ordered sequence of capture clocks in self-test or scan-test mode. The timing diagram 300 shows the sequence of waveforms of the 4 capture clocks, CK1 111 to CK4 120, operating at the same frequency, and the 4 scan enable (SE) signals, SE1 134 to SE4 137.

In each shift cycle 301, a series of clock pulses of 10 MHz are applied through capture clocks, CK1 111 to CK4 120, to shift stimuli to all scan cells SC within all clock domains, CD1 102 to CD4 105. In each capture cycle 302, two sets of capture clock pulses are applied in the following order: First, one capture pulse is applied to CK1 111 and CK3 117 simultaneously; and second, one capture pulse is applied to CK2 114 and CK4 120 simultaneously.

As a result, stuck-at faults within all clock domains CD1 102 to CD4 105 are detected or located if the relative clock delays 303 and 305 are long enough so that no races or timing violations would occur while the capture operation is conducted within clock domains CD1 102 to CD4 105, respectively.

In addition, stuck-at faults within all crossing clock-domain logic blocks CCD1 106 to CCD3 108 are also detected or located. For example, consider the crossing clock-domain logic block CCD1 106. First, stuck-at faults that can be reached from line 124 in CCD1 106 are detected or located if the relative clock delay 303 is long enough so that no races or timing violations would occur while the output response 122 is captured. Second, stuck-at faults that can be reached from line 121 in CCD1 106 are detected or located if the relative clock delay 304 is long enough so that no races or timing violations would occur while the output response 123 is captured. The same principle also applies to crossing clock-domain logic blocks CCD2 107 and CCD3 108.

Figure 4:
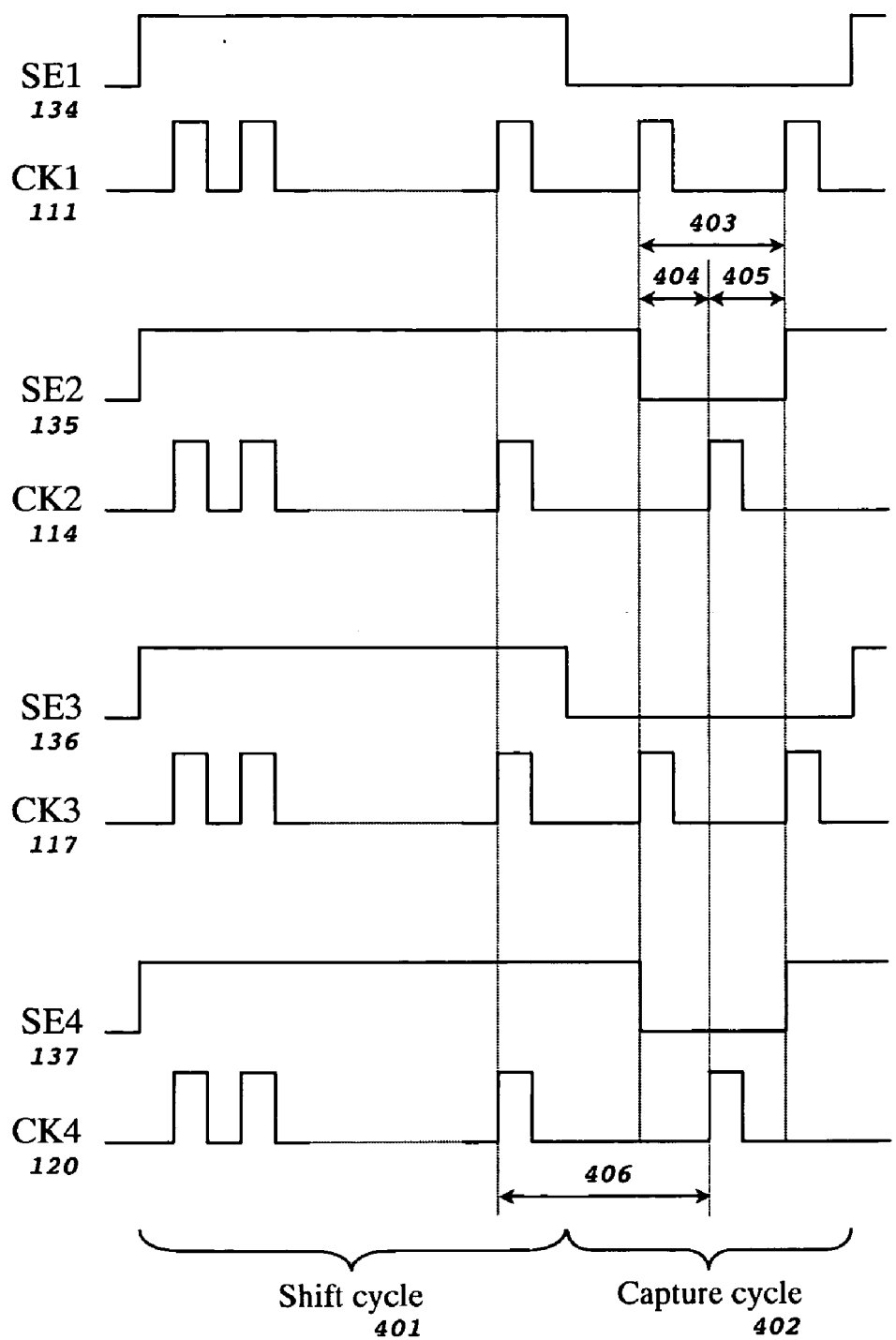
FIG. 4 shows a timing diagram of the full-scan design given in FIG. 1, in accordance with the present invention, where an expanded yet ordered sequence of capture clocks is used to detect or locate other stuck-type faults within each clock domain and other stuck-type faults crossing clock domains in self-test or scan-test mode.

FIG. 4 shows a timing diagram of a full-scan design in FIG. 1, of one embodiment of the present invention for detecting or locating other stuck-type faults within each clock domain and other stuck-type faults crossing clock domains with an expanded yet ordered sequence of capture clocks in self-test or scan-test mode. The timing diagram 400 shows the sequence of waveforms of the 4 capture clocks, CK1 111 to CK4 120, operating at the same frequency, and the 4 scan enable (SE) signals, SE1 134 to SE4 137.

In each shift cycle 401, a series of clock pulses of 10 MHz are applied through capture clocks, CK1 111 to CK4 120, to shift stimuli to all scan cells SC within all clock domains, CD1 102 to CD4 105. In each capture cycle 402, two sets of capture clock pulses are applied in the following order: First, two capture pulses are applied to CK1 111 and CK3 117 simultaneously; and second, one capture pulse is applied to CK2 114 and CK4 120 simultaneously.

As a result, stuck-at faults within all clock domains CD1 102 to CD4 105 are detected or located if the relative clock delays 403 and 406 are long enough so that no races or timing violations would occur while the capture operation is conducted within clock domains CD1 102 to CD4 105, respectively.

In addition, stuck-at faults within all crossing clock-domain logic blocks CCD1 106 to CCD3 108 are also detected or located. For example, consider the crossing clock-domain logic block CCD1 106. First, stuck-at faults that can be reached from line 124 in CCD1 106 are detected or located if the relative clock delay 405 is long enough so that no races or timing violations would occur while the output response 122 is captured. Second, stuck-at faults that can be reached from line 121 in CCD1 106 are detected or located if the relative clock delay 404 is long enough so that no races or timing violations would occur while the output response 123 is captured. The same principle also applies to crossing clock-domain logic blocks CCD2 107 and CCD3 108.

Figure 5:
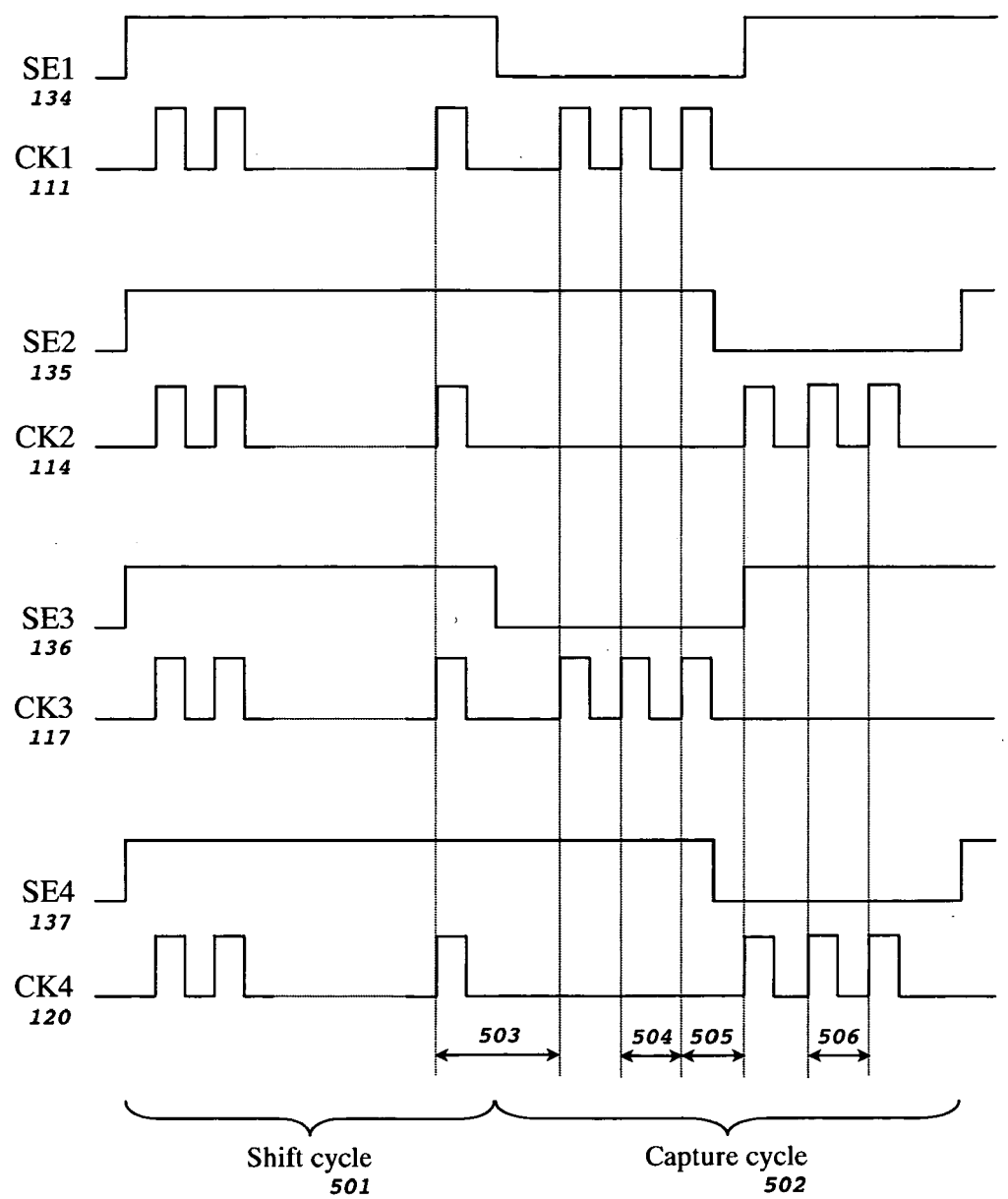
FIG. 5 shows a timing diagram of the partial-scan design given in FIG. 1, in accordance with the present invention, where an ordered sequence of capture clocks is used to detect or locate stuck-at faults within each clock domain and stuck-at faults crossing clock domains in self-test or scan-test mode.

FIG. 5 shows a timing diagram of a feed-forward partial-scan design given in FIG. 1, of one embodiment of the present invention for detecting or locating stuck-at faults within each clock domain and stuck-at faults crossing clock domains with a shortened yet ordered sequence of capture clocks in self-test or scan-test mode. It is assumed that the clock domains CD1 102 to CD4 105 contain a number of un-scanned storage cells that form a sequential depth of no more than 2. The timing diagram 500 shows the sequence of waveforms of the 4 capture clocks, CK1 111 to CK4 120, operating at the same frequency, and the 4 scan enable (SE) signals, SE1 134 to SE4 137.

In each shift cycle 501, a series of clock pulses of 10 MHz are applied through capture clocks, CK1 111 to CK4 120, to shift stimuli to all scan cells SC within all clock domains, CD1 102 to CD4 105. In each capture cycle 502, two sets of capture clock pulses are applied in the following order: First, three pulses of 10 MHz, two being functional pulses and one being a capture pulse, are applied to CK1 111 and CK3 117 simultaneously; second, three pulses of 10 MHz, two being functional pulses and one being a capture pulse, are applied to CK2 114 and CK4 120 simultaneously.

As a result, stuck-at faults within all clock domains CD1 102 to CD4 105 are detected or located if the relative clock delays 504 and 506 are long enough so that no races or timing violations would occur while the capture operation is conducted within clock domains CD1 102 to CD4 105, respectively.

In addition, stuck-at faults within all crossing clock-domain logic blocks CCD1 106 to CCD3 108 are also detected or located. For example, consider the crossing clock-domain logic block CCD1 106. First, stuck-at faults that can be reached from line 124 in CCD1 106 are detected or located if the relative clock delay 503 is long enough so that no races or timing violations would occur while the circuit response 122 is captured. Second, stuck-at faults that can be reached from line 121 in CCD1 106 are detected or located if the relative clock delay 505 is long enough so that no races or timing violations would occur while the output response 123 is captured. The same principle also applies to crossing clock-domain logic blocks CCD2 107 and CCD3 108.

Figure 6:
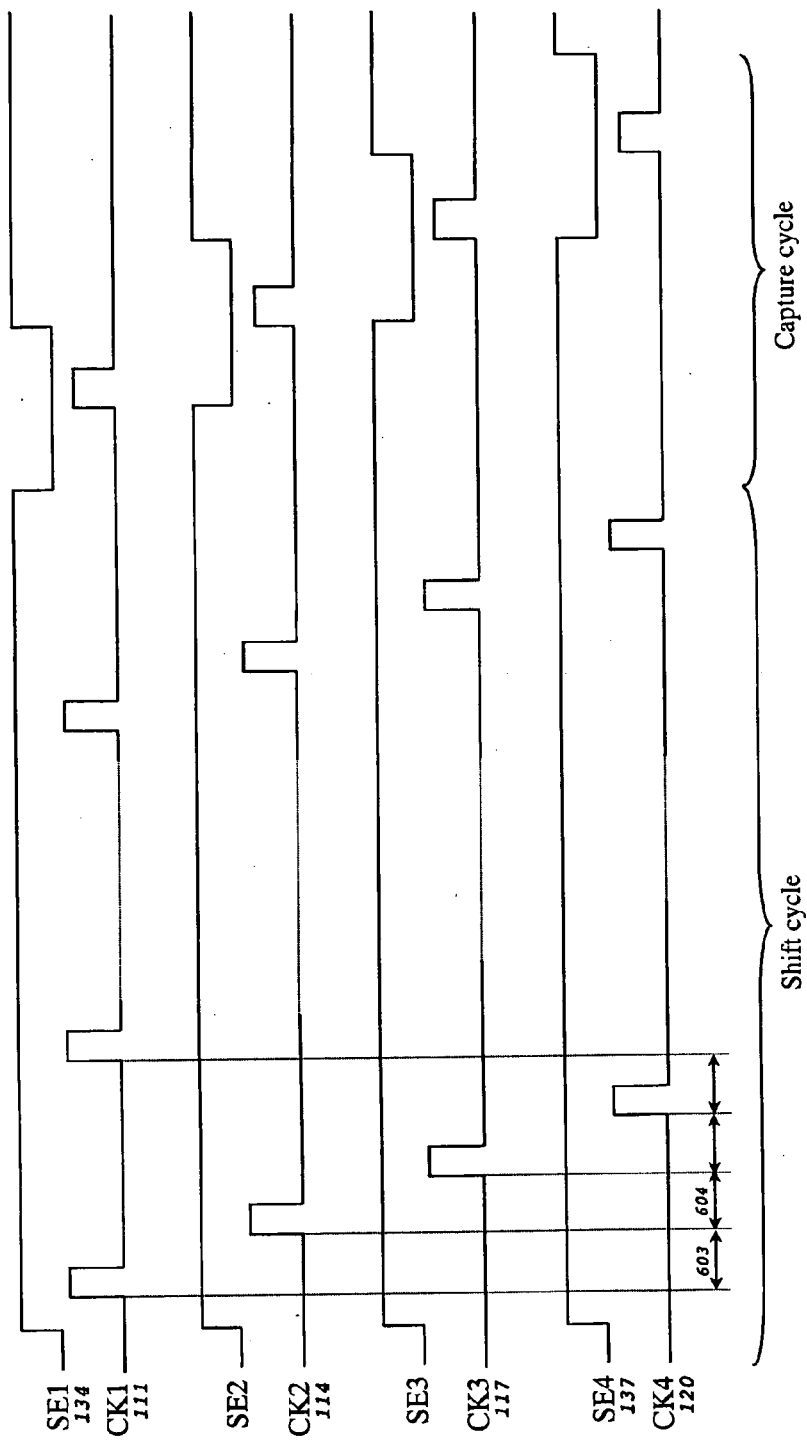
FIG. 6 shows a timing diagram of the full-scan design given in FIG. 1, in accordance with the present invention, where all capture clocks during the shift cycle are skewed in order to reduce power consumption in self-test or scan-test mode.

FIG. 6 shows a timing diagram of the full-scan design given in FIG. 1, in accordance with the present invention, where all capture clocks in a shift cycle are skewed in order to reduce power consumption. The timing diagram 600 shows the required waveforms for the 4 capture clocks, CK1 111 to CK4 120, and the 4 scan enable (SE) signals, SE1 134 to SE4 137, in a shift cycle. Note that any capture timing control methods claimed in this patent can be applied in a capture cycle.

In each shift cycle 601, shift pulses for the clocks CK1 111 to CK4 120 are skewed by properly setting the delay 603 between the shift pulses for the clocks CK1 111 and CK2 114, the delay 604 between the shift pulses for the clocks CK2 114 and CK3 117, the delay 605 between the shift pulses for the clocks CK3 117 and CK4 120, the delay 606 between the shift pulses for the clocks CK4 120 and CK1 111. As a result, both peak power consumption and average power consumption are reduced.

Figure 7:
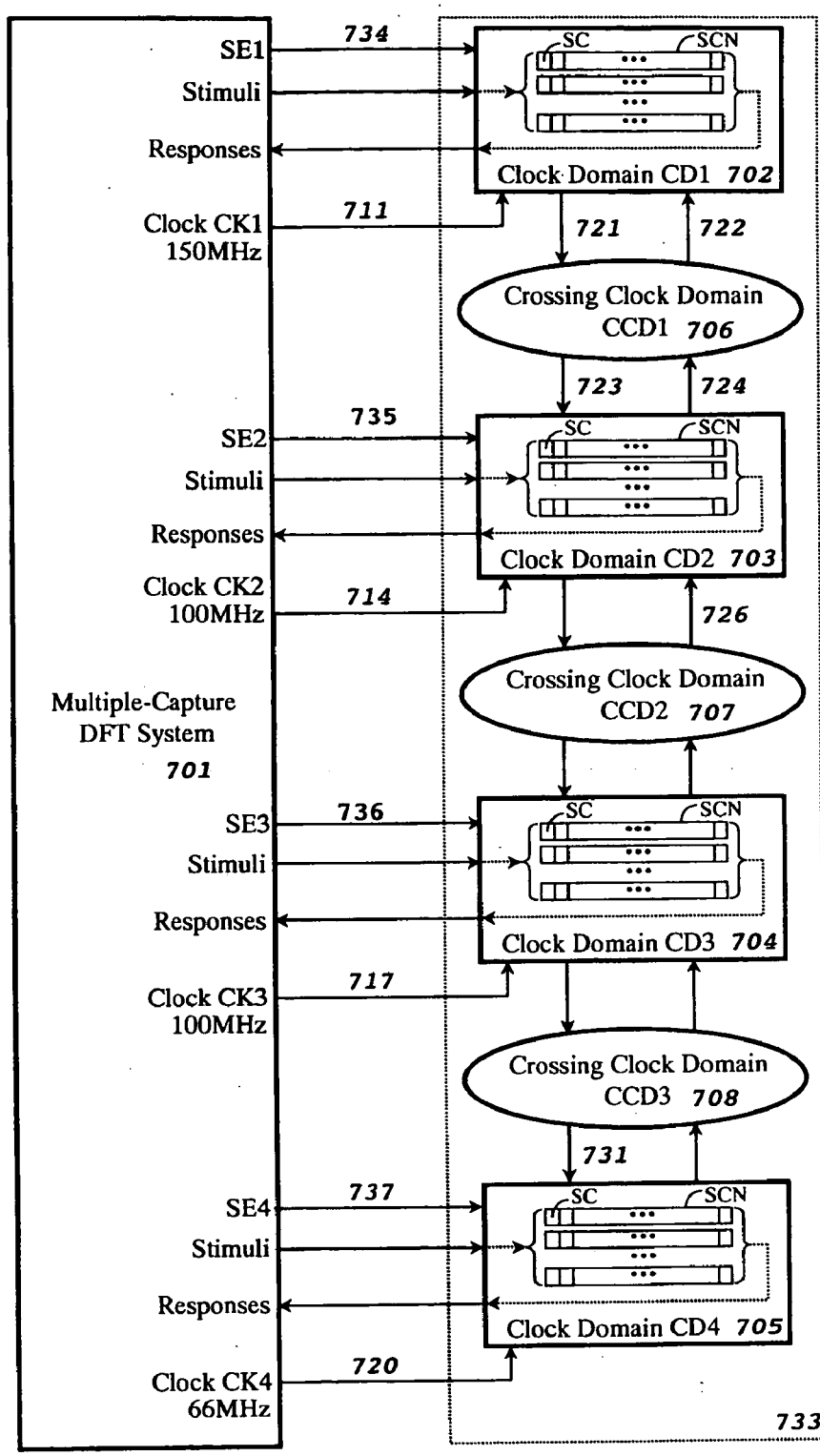
FIG. 7 shows an example full-scan or partial-scan design with 4 clock domains and 4 system clocks, where a multiple-capture DFT system in accordance with the present invention is used to detect or locate stuck-at, delay, and multiple-cycle delay faults at its desired clock speed in self-test or scan-test mode.

FIG. 7 shows an example full-scan or partial-scan design with a multiple-capture DFT (design-for-test) system, of one embodiment of the present invention. The design 733 is the same as the design 133 given in FIG. 1. Same as in FIG. 1, the 4 clock domains, CD1 702 to CD4 705, are originally designed to run at 150 MHz, 100 MHz, 100 MHz, and 66 MHz, respectively. The only difference between FIG. 7 and FIG. 1 is that these clock frequencies will be used directly without alternation in FIG. 7 in order to implement at-speed self-test or scan-test for stuck-at, delay, and multiple-cycle delay faults within each clock domain and crossing clock domains.

Figure 8:
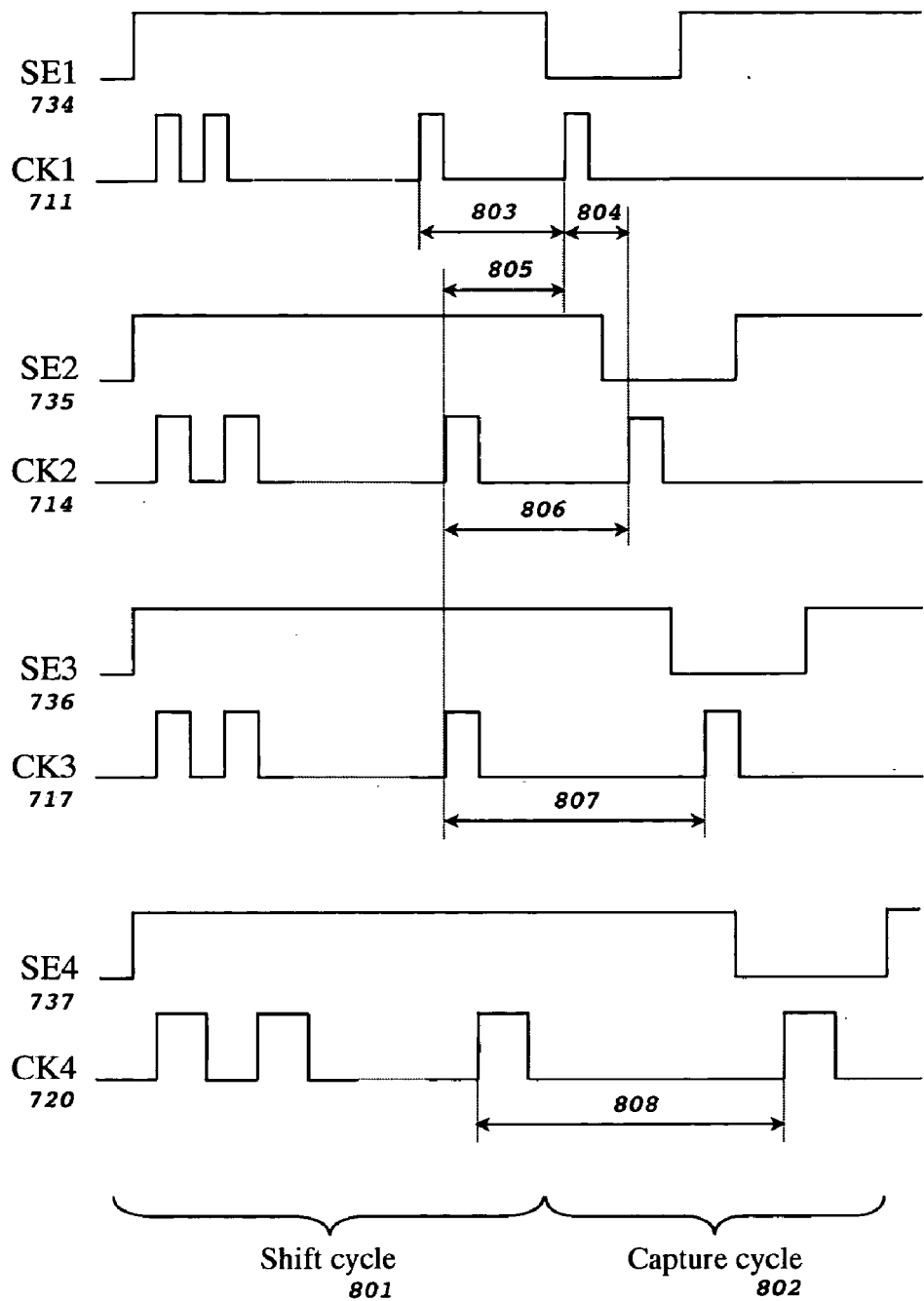
FIG. 8 shows a timing diagram of the full-scan design given in FIG. 7, in accordance with the present invention, where an ordered sequence of capture clocks is used to detect or locate stuck-at faults within each clock domain and stuck-at faults crossing clock domains in self-test or scan-test mode.

Based on FIG. 7, the timing diagrams given in FIG. 8 to FIG. 21 are used to illustrate that, by properly ordering the sequence of capture pulses and by adjusting relative inter-clock delays, the at-speed detection or location of stuck-at, delay, and multiple-cycle delay faults within each clock domain and crossing clock domains can be achieved in self-test or scan-test mode. Please note that different ways of ordering the sequence of capture pulses and adjusting relative inter-clock delays will detect or locate different faults FIG. 8 shows a timing diagram of a full-scan design given in FIG. 7, of one embodiment of the present invention for detecting or locating stuck-at faults within each clock domain and stuck-at faults crossing clock domains with an ordered sequence of capture clocks in self-test or scan-test mode. The timing diagram 800 shows the sequence of waveforms of the 4 capture clocks, CK1 711 to CK4 720, operating at different frequencies, and the 4 scan enable (SE) signals, SE1 734 to SE4 737. This timing diagram is basically the same as the one given in FIG. 2 except the capture clocks, CK1 711 to CK4 720, run at 150 MHz, 100 MHz, 100 MHz, and 66 MHz, respectively, in both shift and capture cycles, instead of 10 MHz as shown in FIG. 2.

In each shift cycle 801, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 802, 4 sets of capture clock pulses are applied in the following order: First, one capture pulse is applied to CK1 711; second, one capture pulse is applied to CK2 714; third, one capture pulse is applied to CK3 717; and fourth, one capture pulse is applied to CK4 720.

As a result, stuck-at faults within all clock domains CD1 702 to CD4 705 are detected or located if the relative clock delays 803, 806, 807, and 808 are long enough so that no races or timing violations would occur while the capture operation is conducted within clock domains CD1 702 to CD4 705, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 805 is long enough so that no races or timing violations would occur while the output response 722 is captured. Second, stuck-at faults that can be reached from line 721 in CCD1 706 are detected or located if the relative clock delay 804 is long enough so that no races or timing violations would occur while the output response 723 is captured. The same principle also applies to crossing clock-domain logic blocks CCD2 707 and CCD3 708.

Figure 9:
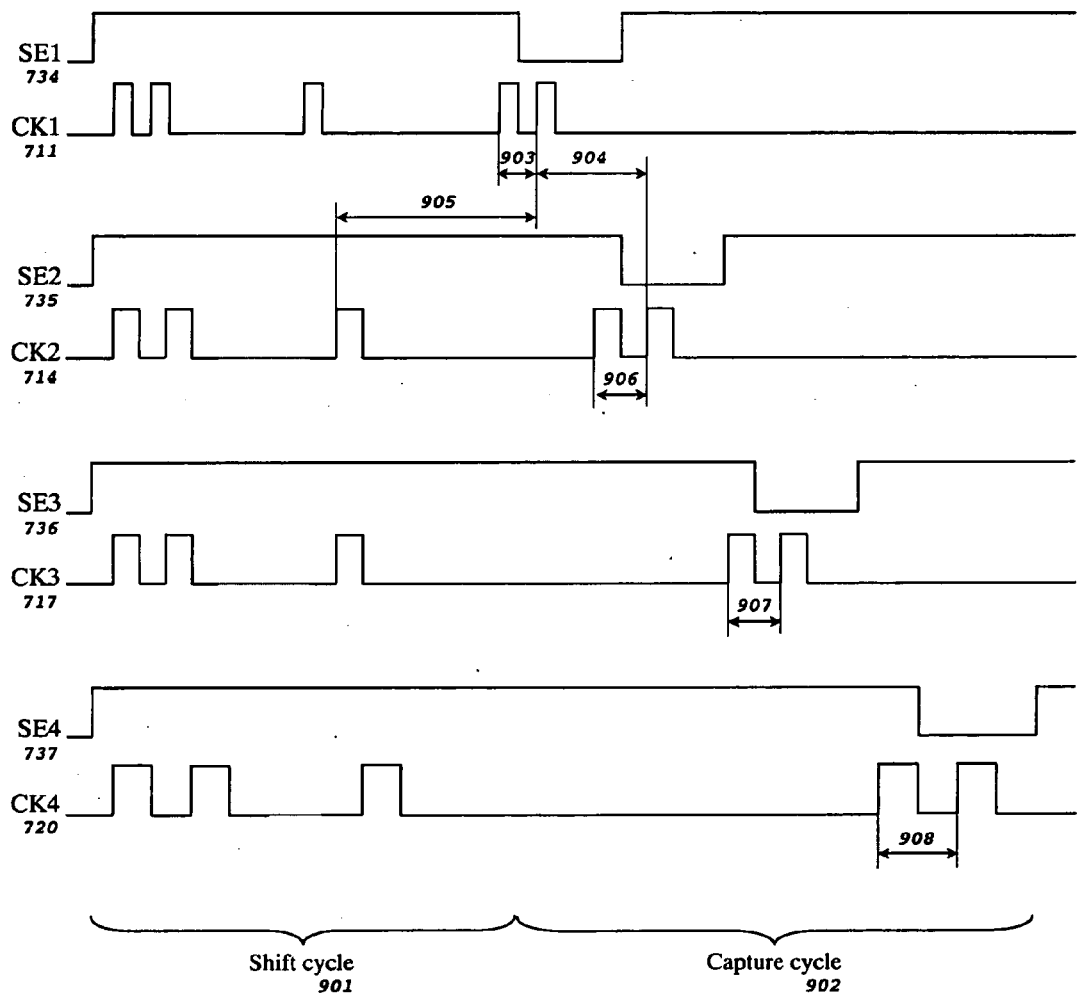
FIG. 9 shows a timing diagram of the full-scan design given in FIG. 7, in accordance with the present invention, where an ordered sequence of capture clocks is used to detect or locate delay faults within each clock domain and stuck-at faults crossing clock domains in self-test or scan-test mode.

FIG. 9 shows a timing diagram of a full-scan design given in FIG. 7, of one embodiment of the present invention for detecting or locating delay faults within each clock domain and stuck-at faults crossing clock domains with an ordered sequence of capture clocks in self-test or scan-test mode. The timing diagram 900 shows the sequence of waveforms of the 4 capture clocks, CK1 711 to CK4 720, operating at different frequencies, and the 4 scan enable (SE) signals, SE1 734 to SE4 737.

In each shift cycle 901, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705.

In each shift cycle 901, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 902, 4 sets of capture clock pulses are applied in the following order: First, one shift pulse and one at-speed (150 MHZ) capture pulse are applied to CK1 711; second, one shift pulse and one at-speed (100 MHZ) capture pulse are applied to CK2 714; third, one shift pulse and one at-speed (100 MHz) capture pulse are applied to CK3 717; and fourth, one shift pulse and one at-speed (66 MHz) capture pulse are applied to CK4 720.

As a result, delay faults within all clock domains CD1 702 to CP4 705 are detected or located since the relative clock delays 903, 906, 907, and 908 are rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 905 is long enough so that no races or timing violations would occur while the output response 722 is captured. Second, stuck-at faults that can be reached from line 721 in CCD1 706 are detected or located if the relative clock delay 904 is long enough so that no races or timing violations would occur while the output response 723 is captured. The same principle also applies to crossing clock-domain logic blocks CCD2 707 and CCD3 708.

Figure 10:
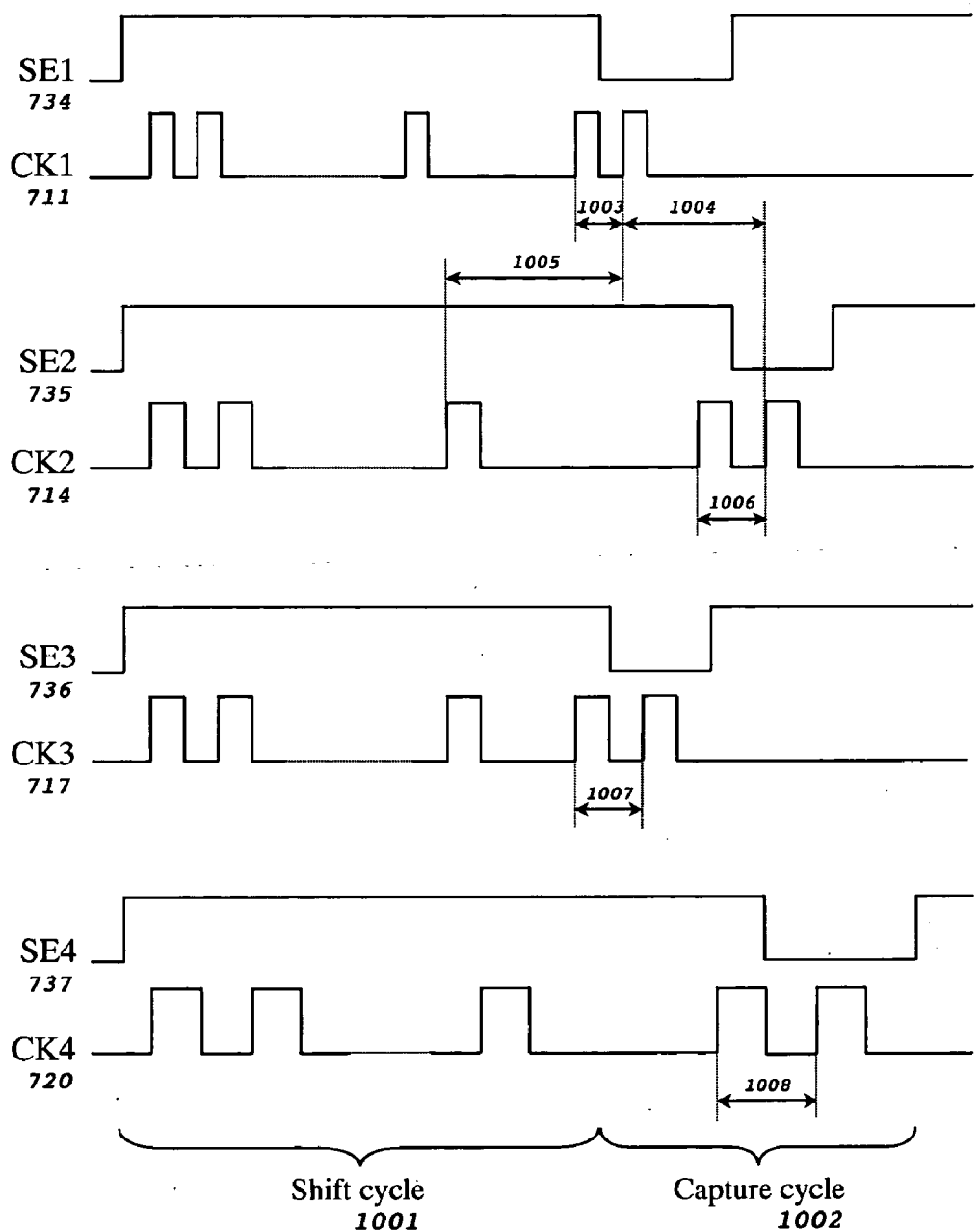
FIG. 10 shows a timing diagram of the full-scan design given in FIG. 7, in accordance with the present invention, where a shortened yet ordered sequence of capture clocks is used to detect or locate delay faults within each clock domain and stuck-at faults crossing clock domains in self-test or scan-test mode.

FIG. 10 shows a timing diagram of a full-scan design given in FIG. 7, of one embodiment of the present invention for detecting or locating delay faults within each clock domain and stuck-at faults crossing clock domains with a shortened yet ordered sequence of capture clocks in self-test or scan-test mode. The timing diagram 1000 shows the sequence of waveforms of the 4 capture clocks, CK1 711 to CK4 720, operating at different frequencies, and the 4 scan enable (SE) signals, SE1 734 to SE4 737.

In each shift cycle 1001, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1002, 4 sets of capture clock pulses are applied in the following order: First, one shift pulse and one at-speed (150 MHz) capture pulse are applied to CK1 711 and one shift pulse and one at-speed (100 MHz) capture pulse are applied to CK3 717, simultaneously; and second, one shift pulse and one at-speed (100 MHz) capture pulse are applied to CK2 714 and one shift pulse and one at-speed (66 Mhz) capture pulse are applied to CK4 720, simultaneously.

As a result, delay faults within all clock domains CD1 702 to CD4 705 are detected or located since the relative clock delays 1003, 1006, 1007, and 1008 are rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1005 is long enough so that no races or timing violations would occur while the output response 722 is captured. Second, stuck-at faults that can be reached from line 721 in CCD1 706 are detected or located if the relative clock delay 1004 is long enough so that no races or timing violations would occur while the output response 723 is captured. The same principle also applies to crossing clock-domain logic blocks CCD2 707 and CCD3 708.

Figure 11:
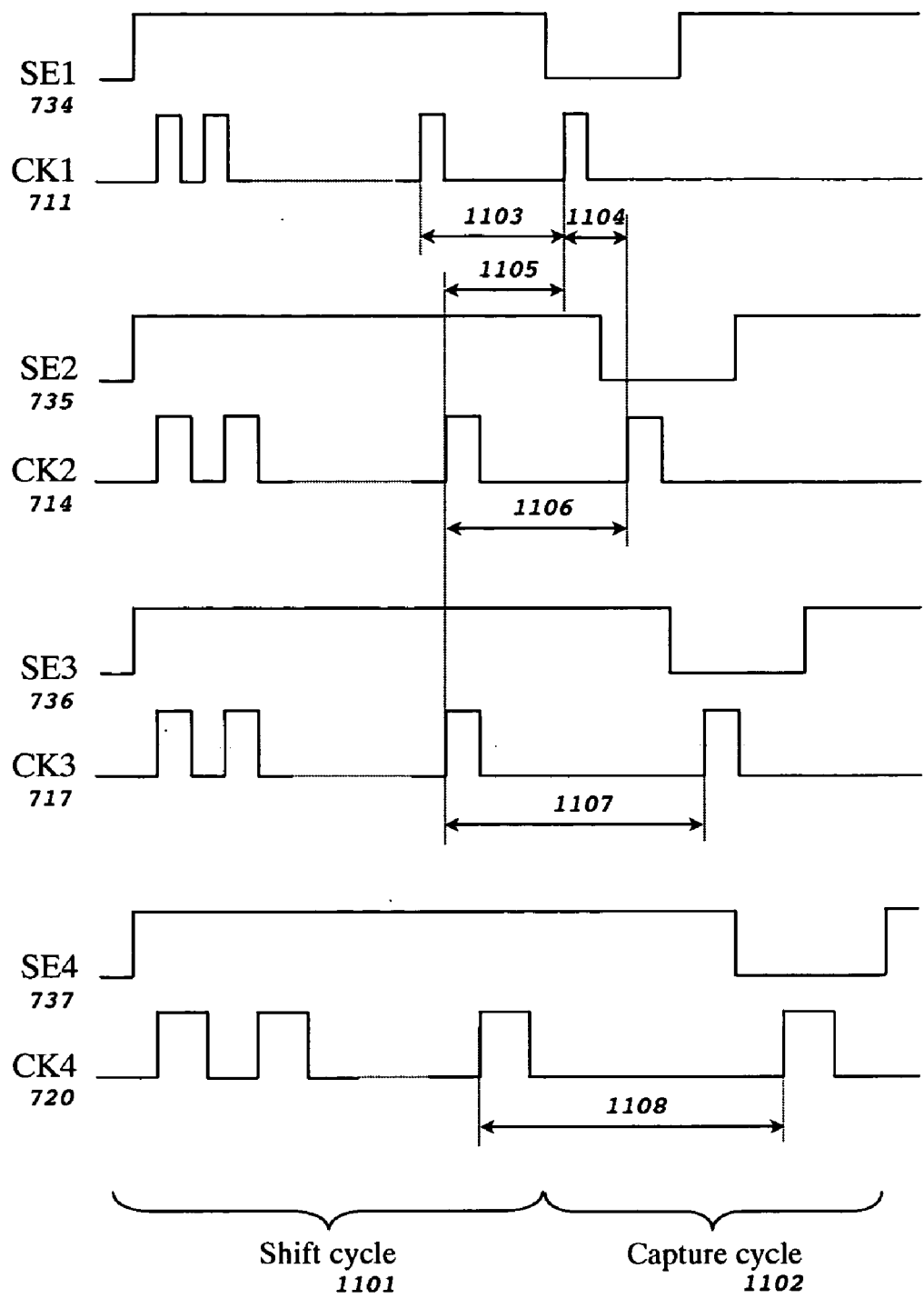
FIG. 11 shows a timing diagram of the full-scan design given in FIG. 7, in accordance with the present invention, where an ordered sequence of capture clocks is used to detect or locate stuck-at faults within each clock domain and delay faults crossing clock domains in self-test or scan-test mode.

FIG. 11 shows a timing diagram of a full-scan design given in FIG. 7, of one embodiment of the present invention for detecting or locating stuck-at faults within each clock domain and delay faults crossing clock domains with an ordered sequence of capture clocks in self-test or scan-test mode. The timing diagram 1100 shows the sequence of waveforms of the 4 capture clocks, CK1 711 to CK4 720, operating at different frequencies, and the 4 scan enable (SE) signals, SE1 734 to SE4 737.

In each shift cycle 1101, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1102, 4 sets of capture clock pulses are applied in the following order: First, one capture pulse of 150 MHz is applied to CK1 711; second, one capture pulse of 100 MHz is applied to CK2 714; third, one capture pulse of 100 MHz is applied to CK3 717; and fourth, one capture pulse of 66 MHz is applied to CK4 720.

As a result, stuck-at faults within all clock domains CD1 702 to CD4 705 are detected or located if the relative clock delays 1103, 1106, 1107, and 1108 are long enough so that no races or timing violations would occur while the capture operation is conducted within clock domains CD1 702 to CD4 705, respectively.

In addition, delay faults within all crossing clock-domain logic blocks CCD1 706 to CCD3 708 are also detected or located. For example, consider the crossing clock-domain logic block CCD1 706. First, delay faults that can be reached from line 724 in CCD1 706 are detected or located if the relative clock delay 1105 meets the at-speed timing requirements for paths from 724 to 722. Second, delay faults that can be reached from line 721 in CCD1 706 are detected or located if the relative clock delay 1104 meets the at-speed timing requirements for paths from 721 to 723. The same principle also applies to crossing clock-domain logic blocks CCD2 707 and CCD3 708.

Figure 12:
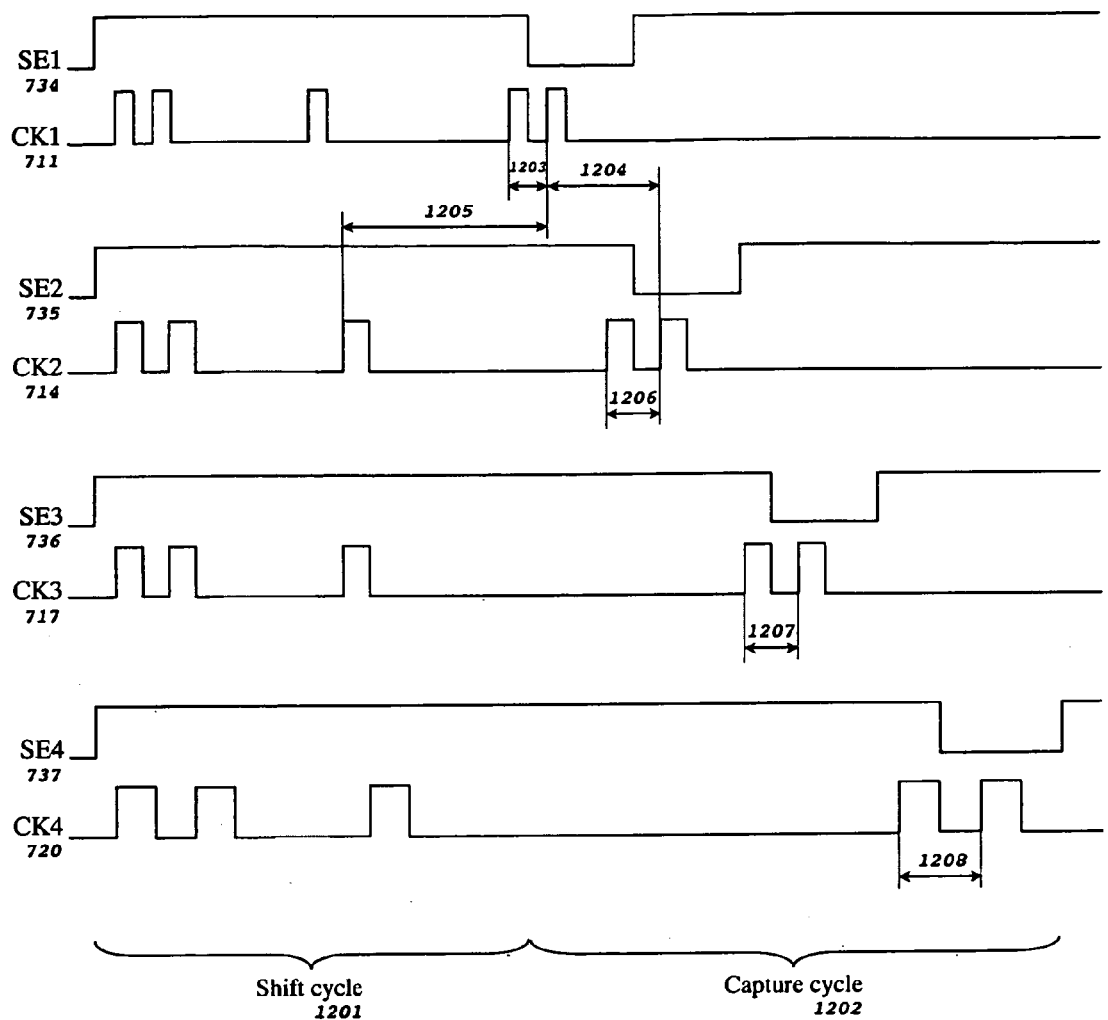
FIG. 12 shows a timing diagram of the full-scan design given in FIG. 7, in accordance with the present invention, where an ordered sequence of capture clocks is used to detect or locate delay faults within each clock domain and delay faults crossing clock domains in self-test or scan-test mode.

FIG. 12 shows a timing diagram of a full-scan design given in FIG. 7, of one embodiment of the present invention for detecting or locating delay faults within each clock domain and delay faults crossing clock domains with an ordered sequence of capture clocks in self-test or scan-test mode. The timing diagram 1200 shows the sequence of waveforms of the 4 capture clocks, CK1 711 to CK4 7.20, operating at different frequencies, and the 4 scan enable (SE) signals, SE1 734 to SE4 737.

In each shift cycle 1201, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1202, 4 sets of capture clock pulses are applied in the following order: First, one shift pulse and one at-speed (150 MHz) capture pulse are applied to CK1 711; second, one shift pulse and one at-speed (100 MHz) capture pulse are applied to CK2 714; third, one shift pulse and one at-speed (100 MHz) capture pulse are applied to CK3 717; and fourth, one shift pulse and one at-speed (66 MHz) capture pulse are applied to CK4 720.

As a result, delay faults within all clock domains CD1 702 to CD4 705 are detected or located since the relative clock delays 1203, 1206, 1207, and 1208 are rated cock periods for clocks CK1 711 to CK4 720, respectively.

In addition, delay faults within all crossing clock-domain logic blocks CCD1 706 to CCD3 708 are also detected or located. For example, consider the crossing clock-domain logic block CCD1 706. First, delay faults that can be reached from line 724 in CCD1 706 are detected or located if the relative clock delay 1205 meets the at-speed timing requirements for paths from 724 to 722. Second, delay faults that can be reached from line 721 in CCD1 706 are detected or located if the relative clock delay 1264 meets the at-speed timing requirements for paths from 721 to 723. The same principle also applies to crossing clock-domain logic blocks CCD2 707 and CCD3 708.

Figure 13:
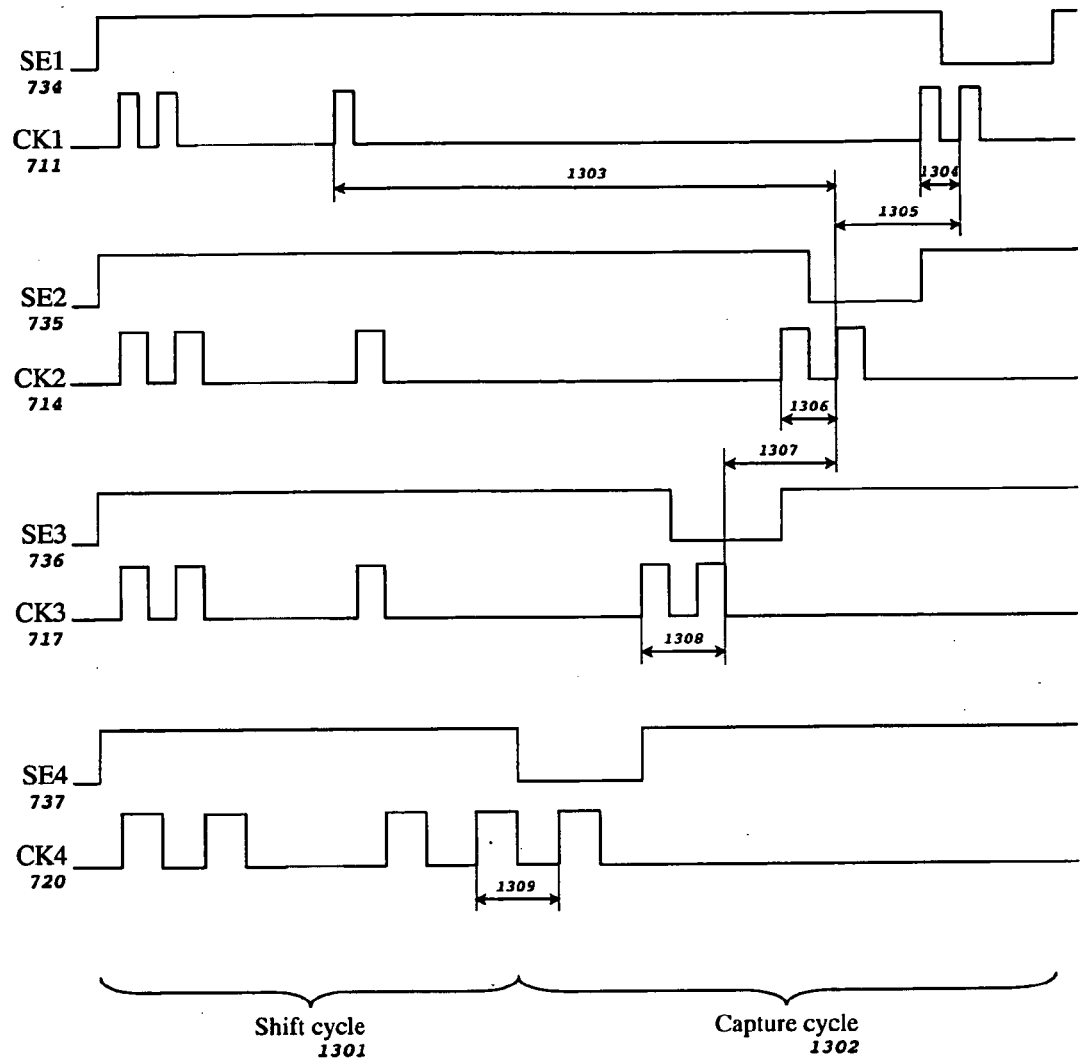
FIG. 13 shows a timing diagram of the full-scan design given in FIG. 7, in accordance with the present invention, where a reordered sequence of capture clocks is used to detect or locate delay faults within each clock domain and stuck-at faults crossing clock domains in self-test or scan-test mode.

FIG. 13 shows a timing diagram of a full-scan design given in FIG. 7, of one embodiment of the present invention for detecting or locating delay faults within each clock domain and stuck-at faults crossing clock-domains with a reordered sequence of capture clocks in self-test or scan-test mode. The timing diagram 1300 shows the sequence of waveforms of the 4 capture clocks, CK1 711 to CK4 720, operating at different frequencies, and the 4 scan enable (SE) signals, SE1 734 to SE4 737.

In each shift cycle 1301, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1302, 4 sets of capture clock pulses are applied in the following order: First, one shift pulse and one at-speed (66 MHz) capture pulse are applied to CK4 720; second, one shift pulse and one at-speed (100 MHz) capture pulse are applied to CK3 717; third, one shift pulse and one at-speed (100 MHz) capture pulse are applied to CK2 714; and fourth, one shift pulse and one at-speed (150 MHZ) capture pulse are applied to CK1 711.

As a result, delay faults within all clock domains CD1 702 to CD4 705 are detected or located since the relative clock delays 1304, 1306, 1308, and 1309 are rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1305 is long enough so that no races or timing violations would occur while the output response 722 is captured. Second, stuck-at faults that can be reached from line 721 in CCD1 706 are detected or located if the relative clock delay 1303 is long enough so that no races or timing violations would occur while the output response 723 is captured. The same principle also applies to crossing clock-domain logic blocks CCD2 707 and CCD3 708.

Figure 14:
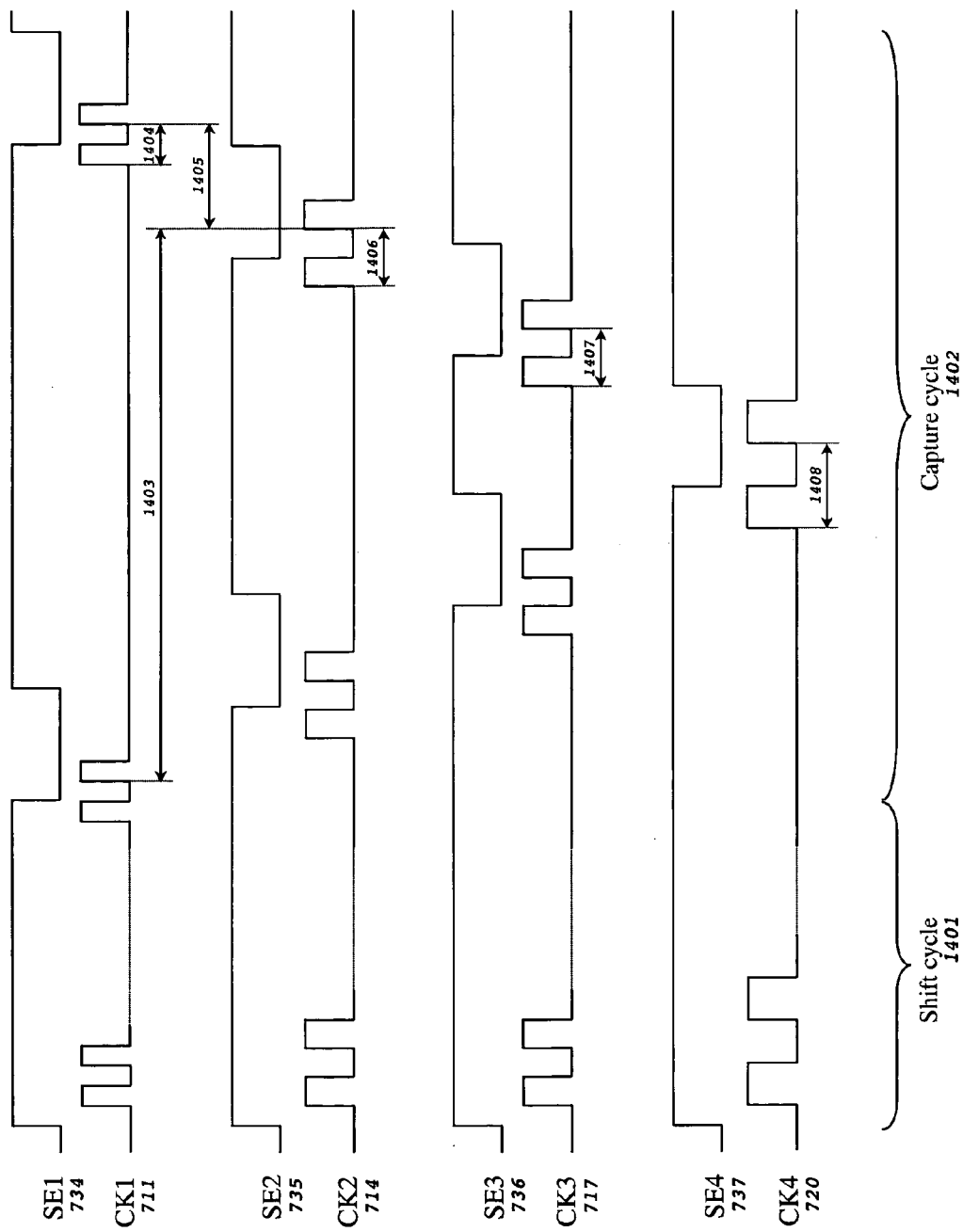
FIG. 14 shows a timing diagram of the full-scan design given in FIG. 7, in accordance with the present invention, where an expanded yet ordered sequence of capture clocks is used to detect or locate additional delay faults within each clock domain and additional stuck-at faults crossing clock domains in self-test or scan-test mode.

FIG. 14 shows a timing diagram of a full-scan design given in FIG. 7, of one embodiment of the present invention for detecting or locating additional delay faults within each clock domain and additional stuck-at faults crossing clock domains with an expanded yet ordered sequence of capture clocks in self-test or scan-test mode. The timing diagram 1400 shows the sequence of waveforms of the 4 capture clocks, CK1 711 to CK4 720, operating at different frequencies, and the 4 scan enable (SE) signals, SE1 734 to SE4 737.

In each shift cycle 1401, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1402, 7 sets of capture clock pulses are applied in the following order: First, one shift pulse and one at-speed (150 MHz) capture pulse are applied to CK1 711; second, one shift pulse and one at-speed (100 MHz) capture pulse are applied to CK2 714; third, one shift pulse and one at-speed (100 MHz) capture pulse are applied to CK3 717, fourth, one shift pulse and one at-speed (66 MHz) capture pulse are applied to CK4 720, fifth, one shift pulse and one at-speed (100 MHz) capture pulse are applied to CK3 717, sixth, one shift pulse and one at-speed (100 MHz) capture pulse are applied to CK2 714; and seventh, one shift pulse and one at-speed (150 MHz) capture pulse are applied to CK1 711.

As a result, delay faults within all clock domains CD1 702 to CD4 705 are detected or located since the relative clock delays 1404, 1406, 1407, and 1408 are rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1405 is long enough so that no races or timing violations would occur while the output response 722 is captured. Second, stuck-at faults that can be reached from line 721 in CCD1 706 are detected or located if the relative clock delay 1403 is long enough so that no races or timing violations would occur while the output response 723 is captured. The same principle also applies to crossing clock-domain logic blocks CCD2 707 and CCD3 708.

Figure 15:
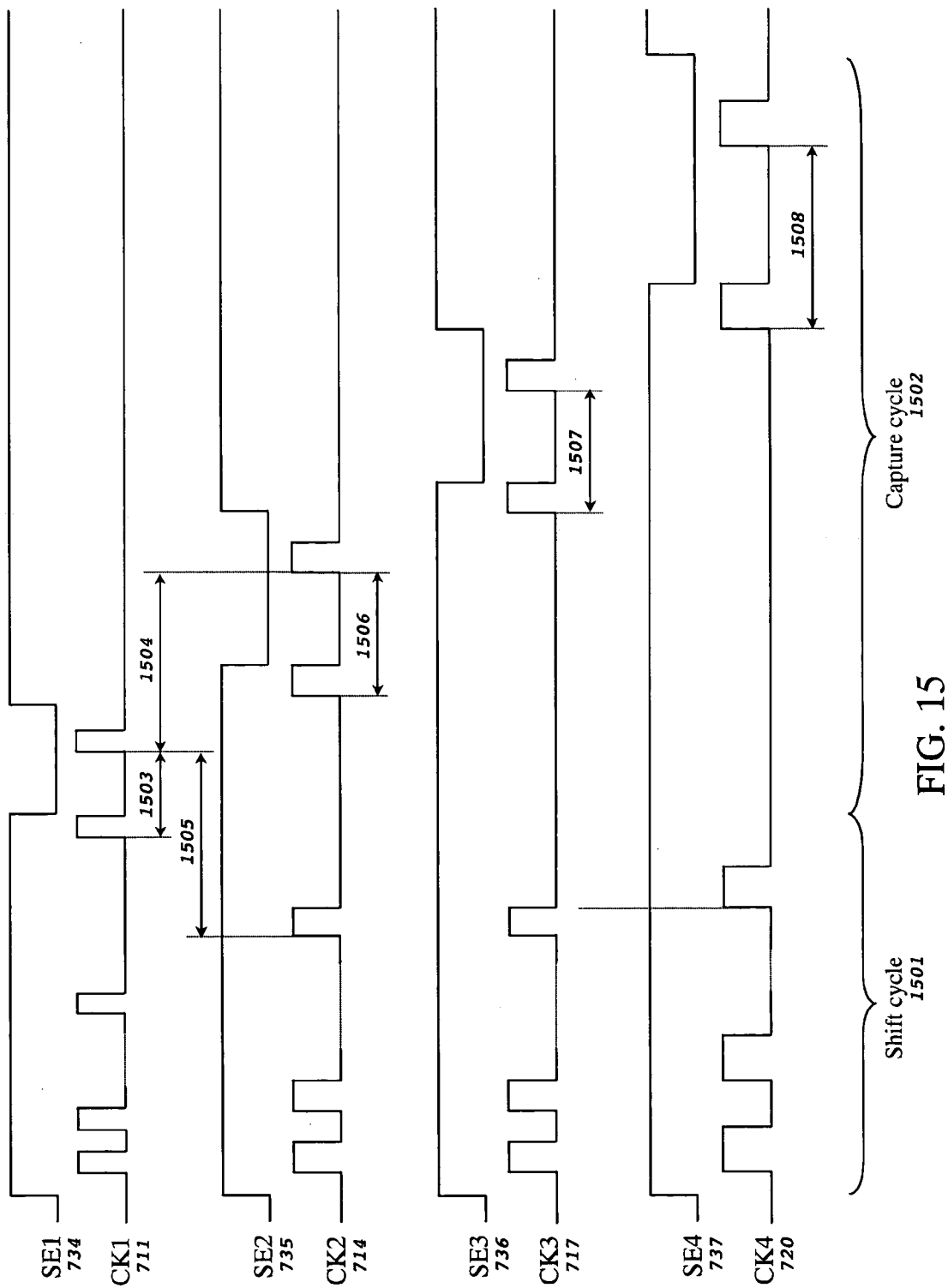
FIG. 15 shows a timing diagram of the full-scan design given in FIG. 7, in accordance with the present invention, where an ordered sequence of capture clocks is used to detect or locate 2-cycle delay faults within each clock domain and stuck-at faults crossing clock domains in self-test or scan-test mode.

FIG. 15 shows a timing diagram of a full-scan design given in FIG. 7, of one embodiment of the present invention for detecting or locating 2-cycle delay faults within each clock domain and stuck-at faults crossing clock domains with an ordered sequence of capture clocks in self-test or scan-test mode. It is assumed that some paths in the clock domains, CD1 702 to CD4 705, need two cycles for signals to pass through. The timing diagram 1600 shows the sequence of waveforms of the 4 capture clocks, CK1 711 to CK4 720, operating at different frequencies, and the 4 scan enable (SE) signals, SE1 734 to SE4 737.

In each shift cycle 1501, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1502, 4 sets of capture clock pulses are applied in the following order: First, one shift pulse and one capture pulse of 75 MHz (half of 150 MHZ) are applied to CK1 711; second, one shift pulse and one capture pulse of 50 MHz (half of 100 MHZ) are applied to CK2 714; third, one shift pulse and one capture pulse of 50 MHz (half of 100 MHz) are applied to CK3 717; and fourth, one shift pulse and one capture pulse of 33 MHz (half of 66 MHz) are applied to CK4 720.

As a result, 2-cycle delay faults within all clock domains CD1 702 to CD4 705 are detected or located since the relative clock delays 1503, 1506, 1507, and 1508 are half of rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1505 is long enough so that no races or timing violations would occur while the output response 722 is captured. Second, stuck-at faults that can be reached from line 721 in CCD1 706 are detected or located if the relative clock delay 1504 is long enough so that no races or timing violations would occur while the output response 723 is captured. The same principle also applies to crossing clock-domain logic blocks CCD2 707 and CCD3 708.

Figure 16:
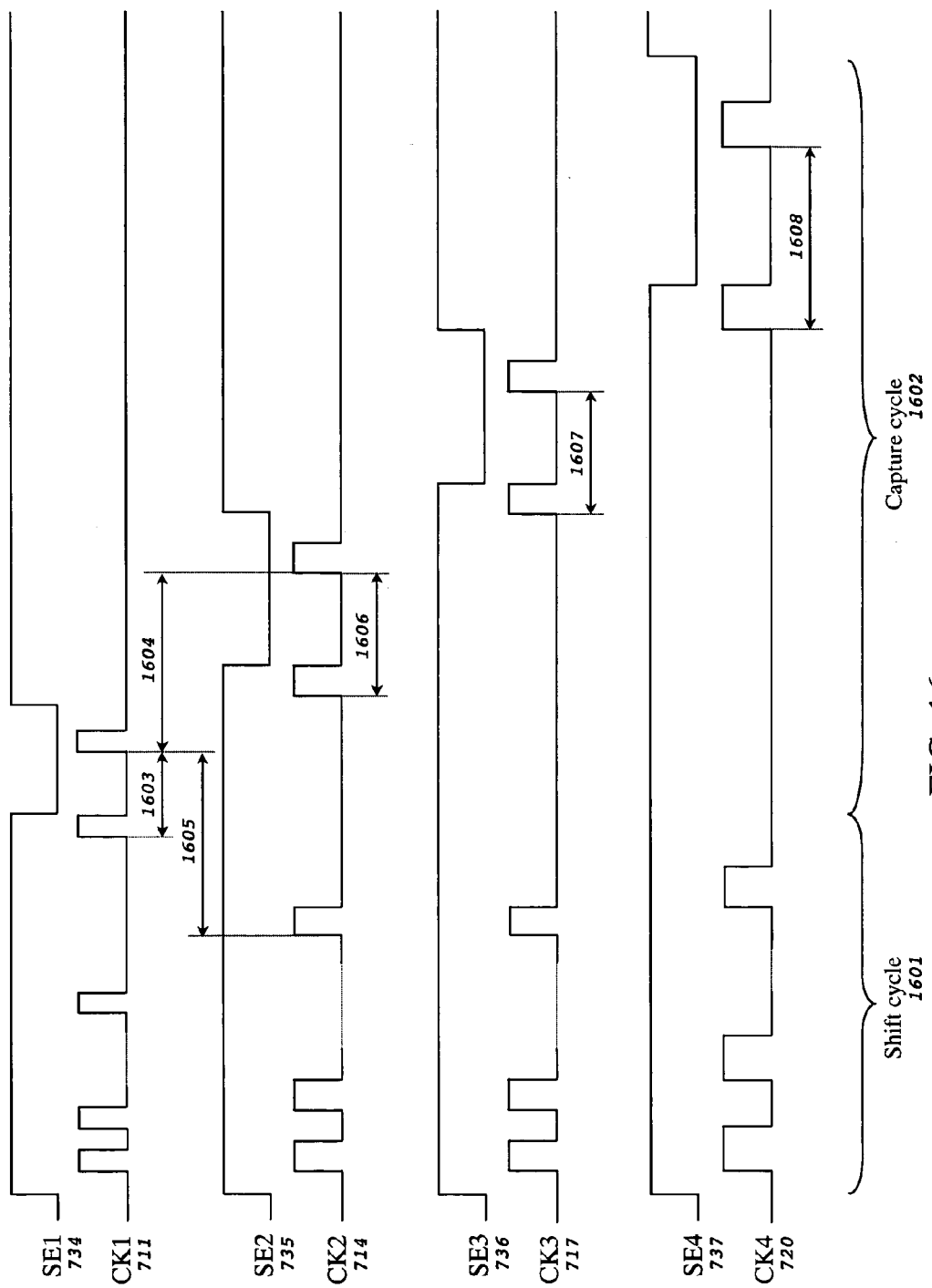
FIG. 16 shows a timing diagram of the full-scan design given in FIG. 7, in accordance with the present invention, where an ordered sequence of capture clocks is used to detect or locate 2-cycle delay faults within each clock domain and 2-cycle delay faults crossing clock domains in self-test or scan-test mode.

FIG. 16 shows a timing diagram of a full-scan design given in FIG. 7, of one embodiment of the present invention for detecting or locating 2-cycle delay faults within each clock domain and 2-cycle delay faults crossing clock domains with an ordered sequence of capture clocks in self-test or scan-test mode. It is assumed that some paths in the clock domains, CD1 702 to CD4 705, and the crossing clock-domain logic blocks, CCD1 706 to CCD3 708, need two cycles for signals to pass through. The timing diagram 1600 shows the sequence of waveforms of the 4 capture clocks, CK1 711 to CK4 720, operating at different frequencies, and the 4 scan enable (SE) signals, SE1 734 to SE4 737.

In each shift cycle 1601, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1602, 4 sets of capture clock pulses are applied in the following order: First, one shift pulse and one capture pulse of 75 MHz (half of 150 MHz) are applied to CK1 711; second, one shift pulse and one capture pulse of 50 MHz (half of 100 MHz) are applied to CK2 714; third, one shift pulse and one capture pulse of 50 MHz (half of 100 MHz) are applied to CK3 717; and fourth, one shift pulse and one capture pulse of 33 MHz (half of 66 MHz) are applied to CK4 720.

As a result, 2-cycle delay faults within all clock domains CD1 702 to CD4 705 are detected or located since the relative clock delays 1603, 1606, 1607, and 1608 are half of rated cock periods for clocks CK1 711 to CK4 720, respectively.

In addition, 2-cycle delay faults within all crossing clock-domain logic blocks CCD1 706 to CCD3 708 are also detected or located. For example, consider the crossing clock-domain logic block CCD1 706. First, 2-cycle delay faults that can be reached from line 724 in CCD1 706 are detected or located if the relative clock delay 1605 meets the at-speed timing requirements for paths from 724 to 722. Second, 2-cycle delay faults that can be reached from line 721 in CCD1 706 are detected or located if the relative clock delay 1604 meets the at-speed timing requirements for paths from 721 to 723. The same principle also applies to crossing clock-domain logic blocks CCD2 707 and CCD3 708.

Figure 17:
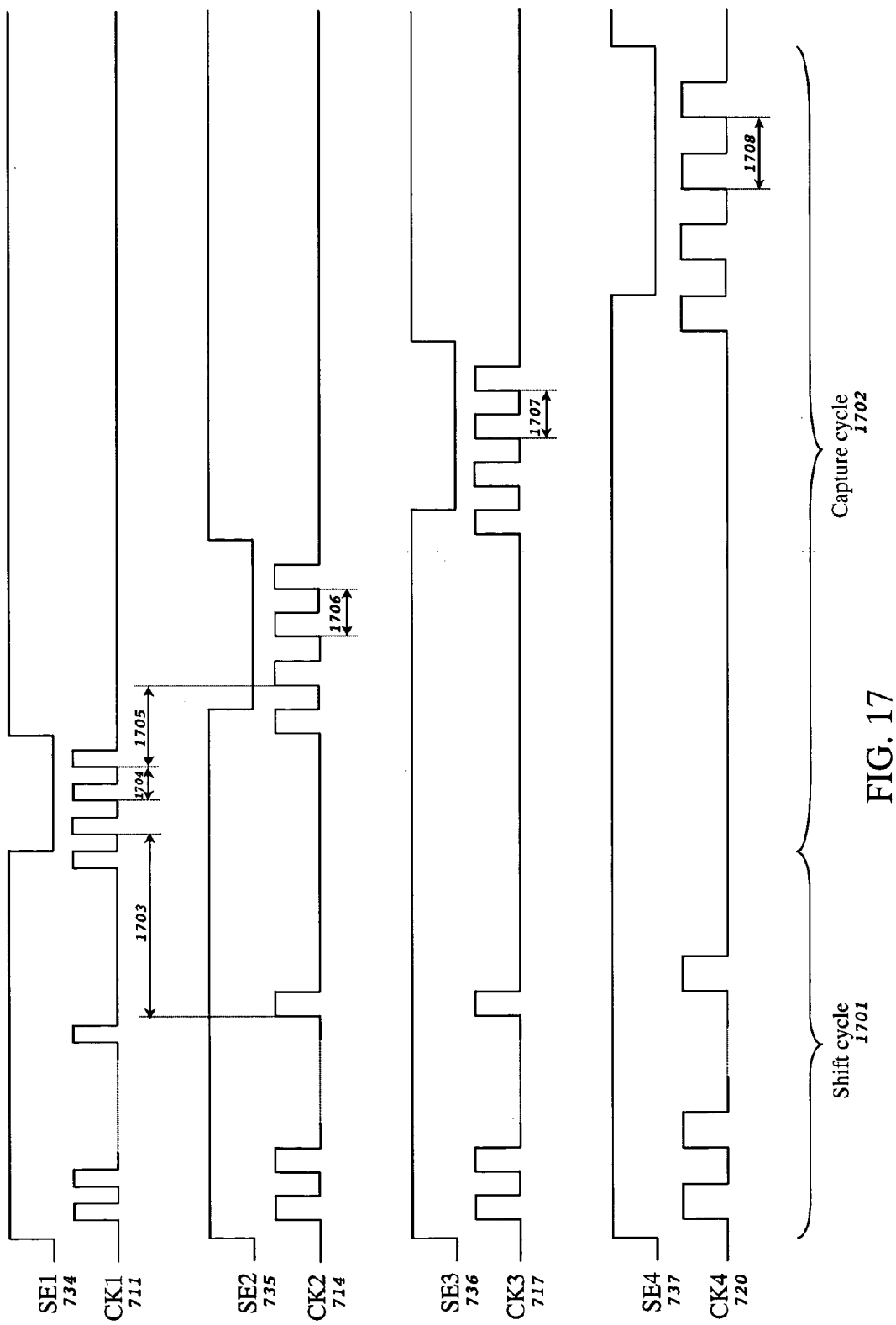
FIG. 17 shows a timing diagram of the partial-scan design given in FIG. 7, in accordance with the present invention, where an ordered sequence of capture clocks is used to detect or locate stuck-at faults within each clock domain and stuck-at faults crossing clock domains in self-test or scan-test mode.

FIG. 17 shows a timing diagram of a feed-forward partial-scan design given in FIG. 7, of one embodiment of the present invention for detecting or locating stuck-at faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. The timing diagram 1700 shows the sequence of waveforms of the 4 capture clocks, CK1 711 to CK4 720, operating at different frequencies, and the 4 scan enable (SE) signals, SE1 734 to SE4 737.

In each shift cycle 1701, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1702, 4 sets of capture clock pulses are applied in the following order: First, one shift pulse, two functional pulses and one capture pulse, are applied to CK1 711; second, one shift pulse, two functional pulses and one capture pulse, are applied to CK2 714; third, one shift pulse, two functional pulses and one capture pulse, are applied to CK3 717; and fourth, one shift pulse, two functional pulses and one capture pulse, are applied to CK4 717.

As a result, stuck-at faults within all clock domains CD1 702 to CD4 705 are detected or located if the relative clock delays 1704, 1706, 1707, and 1708 are long enough so that no races or timing violations would occur while the capture operation is conducted within clock domains CD1 702 to CD4 705, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1703 is long enough so that no races or timing violations would occur while the output response 722 is captured. Second, stuck-at faults that can be reached from line 721 in CCD1 706 are detected or located if the relative clock delay 1705 is long enough so that no races or timing violations would occur while the output response 723 is captured. The same principle also applies to crossing clock-domain logic blocks CCD2 707 and CCD3 708.

Figure 18:
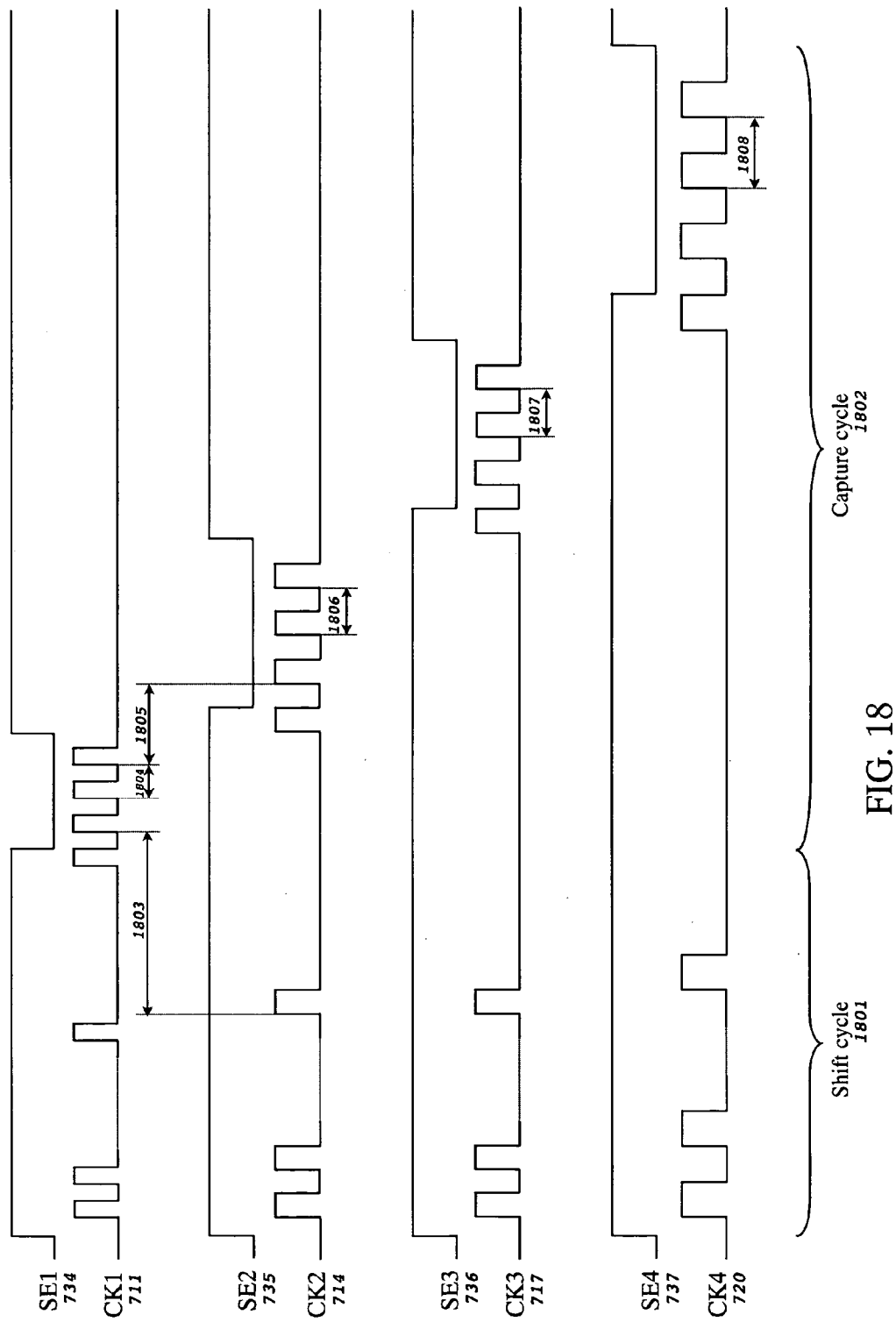
FIG. 18 shows a timing diagram of the partial-scan design given in FIG. 7, in accordance with the present invention, where an ordered sequence of capture clocks is used to detect or locate delay faults within each clock domain and stuck-at faults crossing clock domains in self-test or scan-test mode.

FIG. 18 shows a timing diagram of a feed-forward partial-scan design given in FIG. 7, of one embodiment of the present invention for detecting or locating delay faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. The timing diagram 1800 shows the sequence of waveforms of the 4 capture clocks, CK1 711 to CK4 720, operating at different frequencies, and the 4 scan enable (SE) signals, SE1 734 to SE4 737.

In each shift cycle 1801, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1802, 4 sets of capture clock pulses are applied in the following order: First, one shift pulse and three pulses of 150 MHz, two being functional pulses and one being a capture pulse, are applied to CK1 711; second, one shift pulse and three pulses of 100 MHz, two being functional pulses and one being a capture pulse, are applied to CK2 714; third, one shift pulse and three pulses of 100 MHz, two being functional pulses and one being a capture pulse, are applied to CK3 717; and fourth, one shift pulse and three pulses of 66 MHz, two being functional pulses and one being a capture pulse, are applied to CK4 720.

As a result, delay faults within all clock domains CD1 702 to CD4 705 are detected or located since the relative clock delays 1804, 1806, 1807, and 1808 are rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1803 is long enough so that no races or timing violations would occur while the output response 722 is captured. Second, stuck-at faults that can be reached from line 721 in CCD1 706 are detected or located if the relative clock delay 1805 is long enough so that no races or timing violations would occur while the output response 723 is captured. The same principle also applies to crossing clock-domain logic blocks CCD2 707 and CCD3 708.

Figure 19:
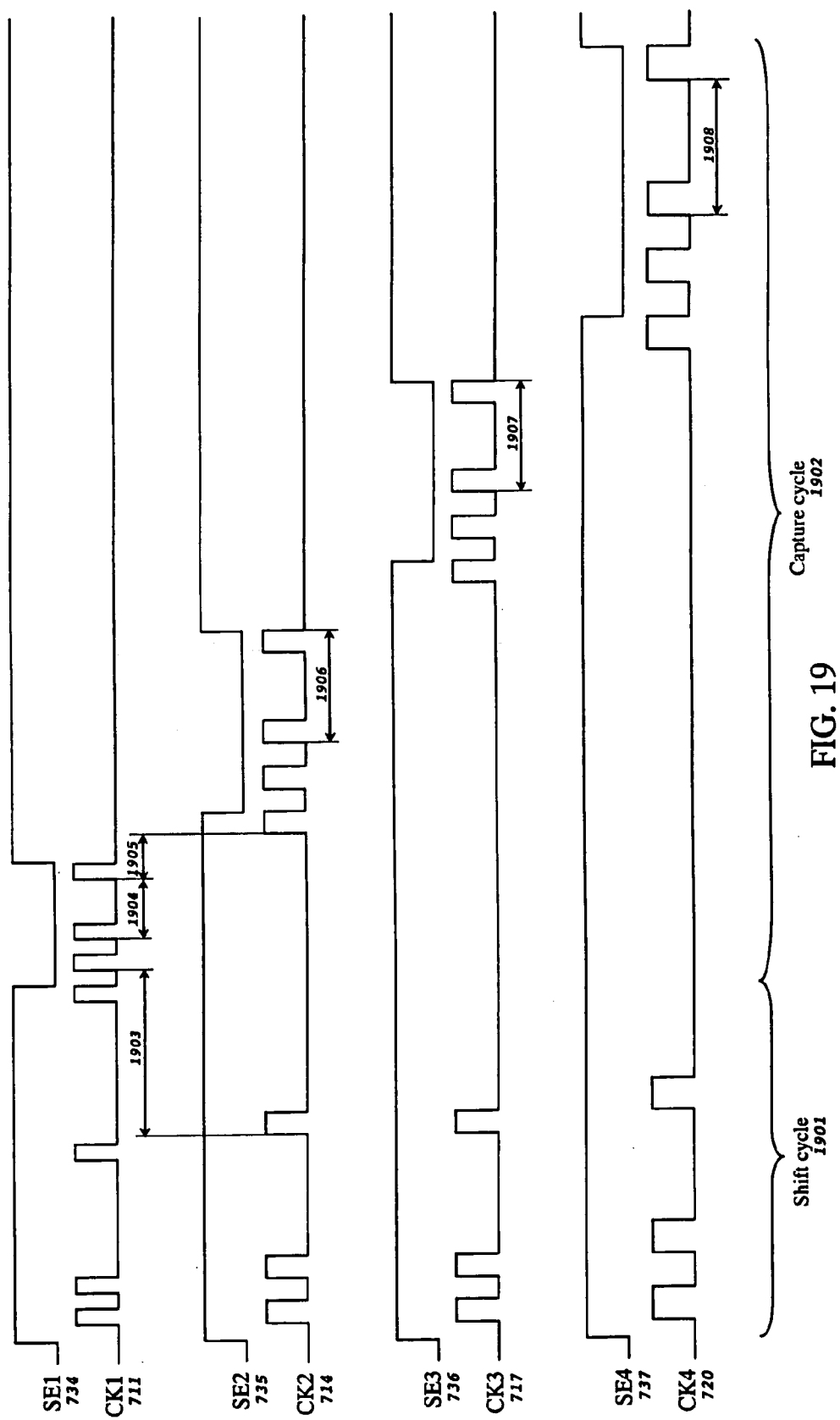
FIG. 19 shows a timing diagram of the partial-scan design given in FIG. 7, in accordance with the present invention, where an ordered sequence of capture clocks is used to detect or locate 2-cycle delay faults within each clock domain and stuck-at faults crossing clock domains in self-test or scan-test mode.

FIG. 19 shows a timing diagram of a feed-forward partial-scan design given in FIG. 7, of one embodiment of the present invention for detecting or locating 2-cycle delay faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. Also, it is assumed that some paths in the clock domains, CD1 702 to CD4 705, need two cycles for signals to pass through. The timing diagram 1900 shows the sequence of waveforms of the 4 capture clocks, CK1 711 to CK4 720, operating at different frequencies, and the 4 scan enable (SE) signals, SE1 734 to SE4 737.

In each shift cycle 1901, a series of clock pulses of different frequencies, 150 MHz, 100 MHz, 100 MHz, and 66 MHz, are applied through capture clocks, CK1 711 to CK4 720, to shift stimuli to all scan cells SC within all clock domains, CD1 702 to CD4 705. In each capture cycle 1902, 4 sets of capture clock pulses are applied in the following order: First, one shift pulse, two functional pulses of 150 MHz and one capture pulse of 75 MHz (half of 150 MHz), are applied to CK1 711; second, one shift pulse, two functional pulses of 100 MHz and one capture pulse of 50 MHz (half of 100 MHz), are applied to CK2 714; third, one shift pulse, two functional pulses of 100 MHz and one capture pulse of 50 MHz (half of 100 MHZ), are applied to CK3 717; and fourth, one shift pulse, two functional pulses of 66 MHz and one capture pulse of 33 MHz (half of 66 MHz), are applied to CK4 720.

As a result, 2-cycle delay faults within all clock domains CD1 702 to CD4 705 are detected or located since the relative clock delays 1904, 1906, 1907, and 1908 are half of rated cock periods for clocks CK1 711 to CK4 720, respectively.

In addition, stuck-at faults within all crossing clock-domain logic blocks CCD1 706 to CCD3 708 are also detected or located. For example, consider the crossing clock-domain logic block CCD1 706. First, stuck-at faults that can be reached from line 724 in CCD1 706 are detected or located if the relative clock delay 1903 is long enough so that no races or timing violations would occur while the output response 722 is captured. Second, stuck-at faults that can be reached from line 721 in CCD1 706 are detected or located if the relative clock delay 1905 is long enough so that no races or timing violations would occur while the output response 723 is captured. The same principle also applies to crossing clock-domain logic blocks CCD2 707 and CCD3 708.

Figure 20:
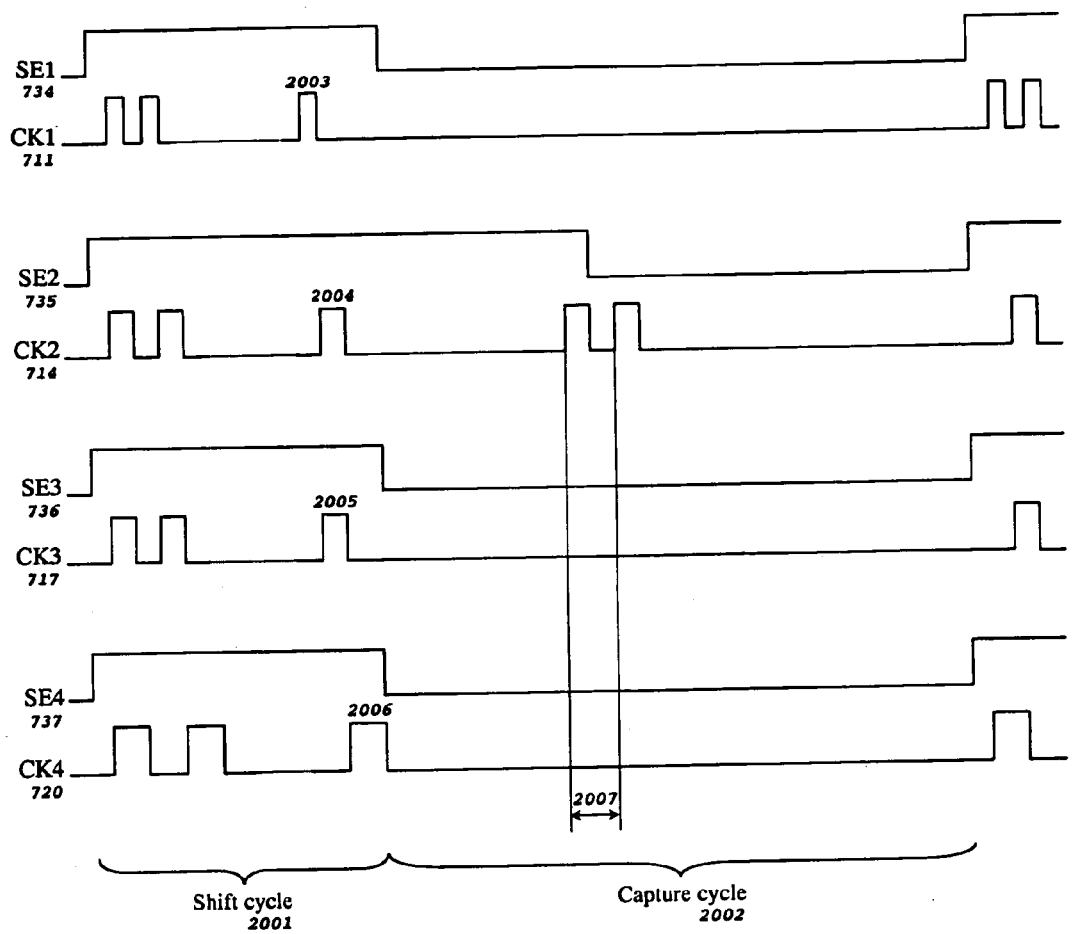
FIG. 20 shows a timing diagram of the full-scan design given in FIG. 7, in accordance with the present invention, where one capture clock in a capture cycle is chosen to diagnose faults captured by the clock in self-test or scan-test mode.

FIG. 20 shows a timing diagram of the full-scan design given in FIG. 7, in accordance with the present invention, where one capture clock CK2 714 in a capture cycle 2002 is chosen to diagnose faults captured by the clock in self-test or scan-test mode.

Fault diagnosis is the procedure by which a fault is located. In order to achieve this goal, it is often necessary to use an approach where a test pattern detects only a portion of faults while guaranteeing no other faults are detected. If the test pattern does produce a response that matches the observed response, it can then be declared that the portion must contain at least one actual fault. Then the same approach to the portion of the faults to further localize the actual faults.

The timing diagram 2000 shows a way to facilitate this approach. In the capture cycle 2002, one shift pulse and one capture pulse of 100 MHz are only applied to the capture clock CK2 714 while the other three capture clocks are held inactive. As a result, for delay faults, only those in the clock domain CD2 703 are detected. In addition, for stuck-at faults, only those in the crossing clock-domain logic blocks CCD1 706 and CCD2 707 and the clock domain CD2 703 are detected. Obviously, this clock timing helps in fault diagnosis.

Figure 21:
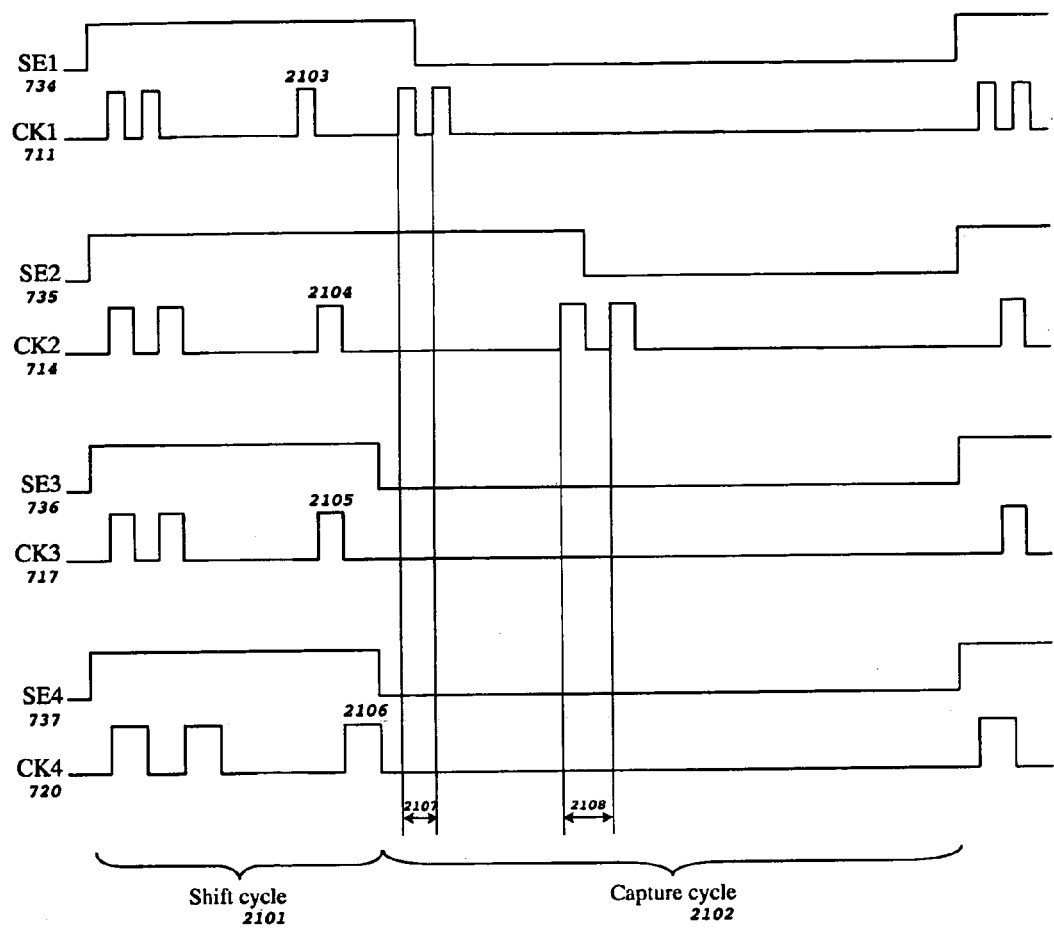
FIG. 21 shows a timing diagram of the full-scan design given in FIG. 7, in accordance with the present invention, where two capture clocks in a capture cycle are chosen to diagnose faults captured by the clocks in self-test or scan-test mode.

FIG. 21 shows a timing diagram of the full-scan design given in FIG. 7, in accordance with the present invention, where two capture clocks, CK1 711 and CK2 714, in a capture cycle 2102 are chosen to diagnose faults captured by the clocks in self-test or scan-test mode.

The diagram 2100 shows one more timing scheme that can help fault diagnosis as described in FIG. 20. In the capture cycle 2102, one shift pulse and one capture pulse of 150 MHz are applied to the capture clock CK1 711. In addition, one shift pulse and one capture pulse of 100 MHZ are applied to the capture clock CK2 714. The other two capture clocks are held inactive. As a result, for delay faults, only those in the clock domain CD1 702 and CD2 704 are detected. In addition, for stuck-at faults, only those in the crossing clock-domain logic blocks CCD1 706 to CCD2 707 and the clock domains CD1 702 and CD2 703 are detected. Obviously, this clock timing helps in fault diagnosis.

Figure 22:
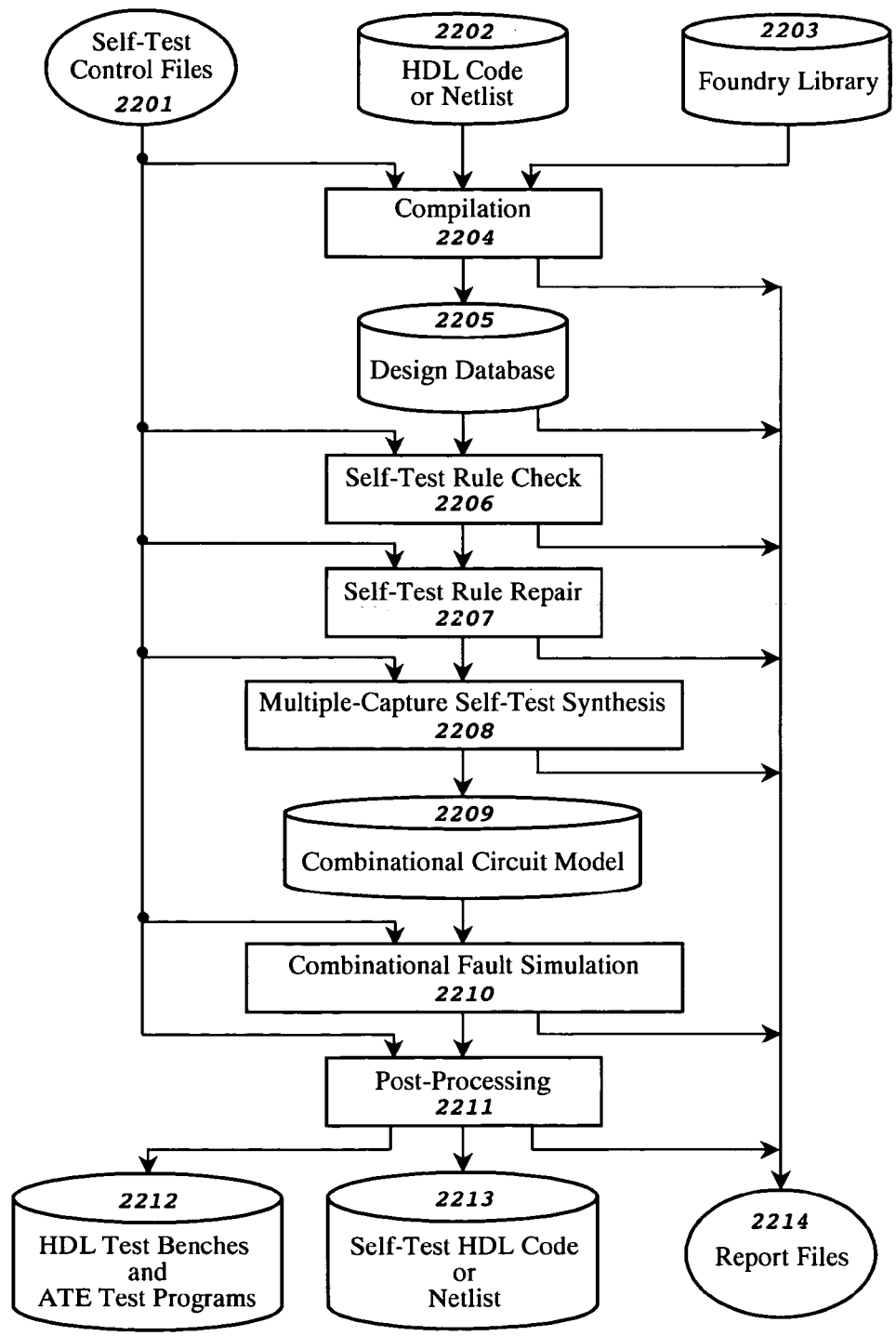
FIG. 22 shows a multiple-capture computer-aided design (CAD) system in accordance with the present invention, where a CAD system is used to implement the multiple-capture DFT technique on a full-scan or partial-scan design in self-test mode.

FIG. 22 shows a flow chart of one embodiment of the present invention. The multiple-capture self-test computer-aided design (CAD) system 2200 accepts the user-supplied HDL (hardware description language) code or netlist 2202 together with the self-test control files 2201 and the chosen foundry library 2203. The self-test control files 2201 contain all set-up information and scripts required for compilation 2204, self-test rule check 2206, self-test rule repair 2207, and multiple-capture self-test synthesis 2208. As a result, an equivalent combinational circuit model 2209 is generated. Then, combinational fault simulation 2210 can be performed. Finally, post-processing 2211 is used to produce the final self-test HDL code or netlist 2213 as well as the HDL test benches and ATE test programs 2212. All reports and errors are saved in the report files 2214.

Figure 23:
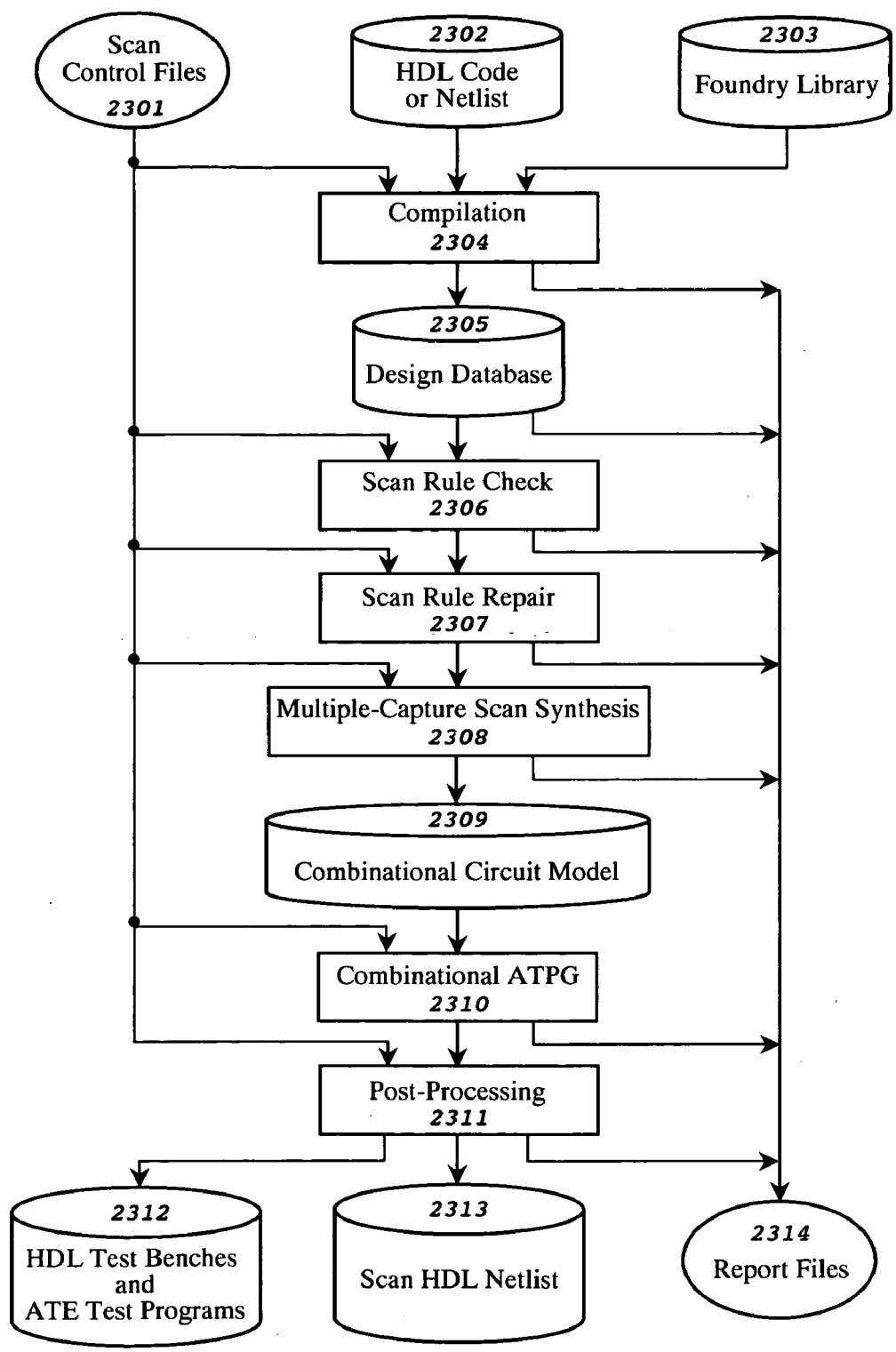
FIG. 23 shows a multiple-capture CAD system in accordance with the present invention, where a CAD system is used to implement the multiple-capture DFT (design-for-test) technique on a full-scan or partial-scan design in scan-test mode.

FIG. 23 shows a flow chart of one embodiment of the present invention. The multiple-capture scan-test computer-aided design (CAD) system 2300 accepts the user-supplied HDL (hardware description language) code or netlist 2302 together with the scan control files 2301 and the chosen foundry library 2303. The scan control files 2301 contain all set-up information and scripts required for compilation 2304, scan rule check 2306, scan rule repair 2307, and multiple-capture scan synthesis 2308. As a result, an equivalent combinational circuit model 2309 is generated. Then, combinational ATPG 2310 can be performed. Finally, post-processing 2311 is used to produce the final scan HDL netlist 2313 as well as the HDL test benches and ATE test programs 2312. All reports and errors are saved in the report files 2314.

Figure 24:
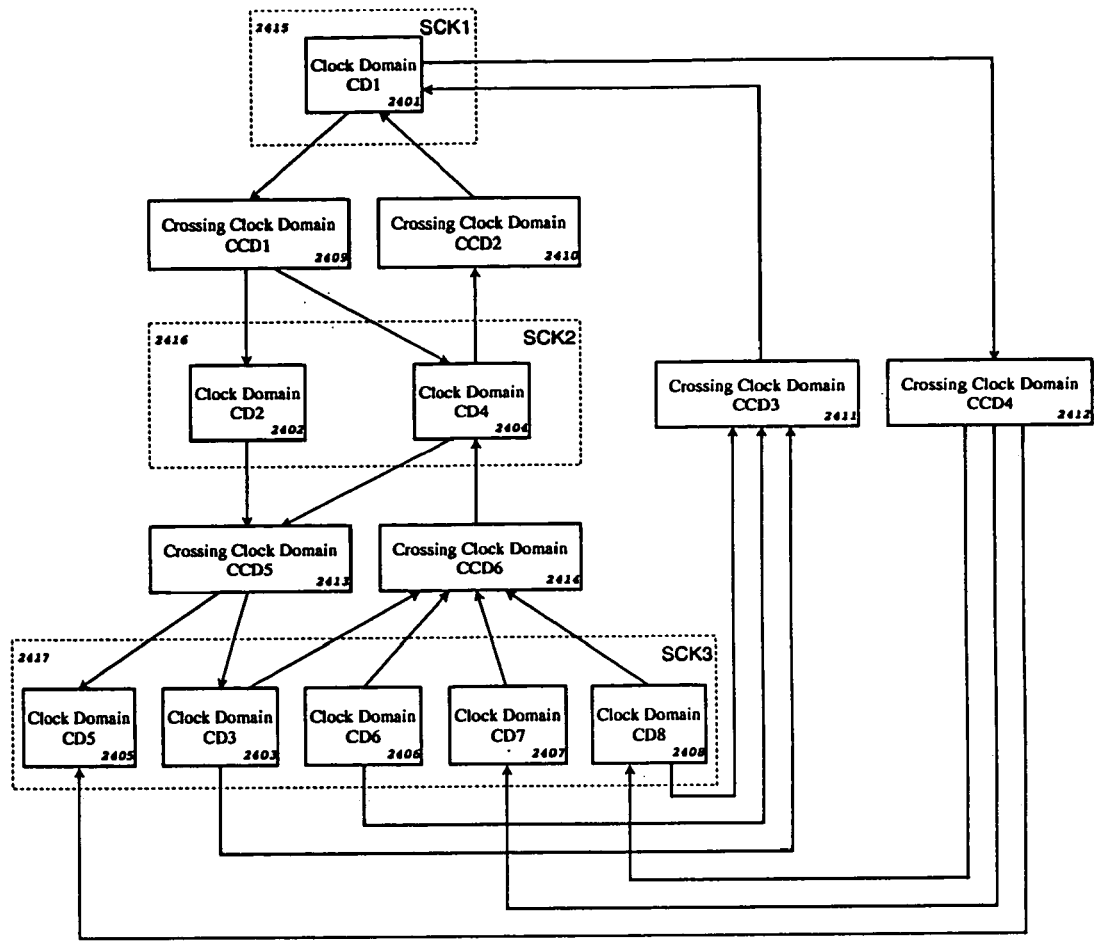
FIG. 24 shows an example design of a single-frequency multiple-capture scan design system with 8 clock domains in accordance with the present invention, where the number of system clocks needed to test the 8 clock domains at a single frequency or at slow-speed is reduced from 8 to 3.

FIG. 24 shows an example design of a single-frequency multiple-capture scan design system 2400 8 clock domains, CD1 2401 to CD8 2408, of one embodiment of the present invention. Assume that the clock domains CD1 2401 to CD8 2408 are controlled by embedded clocks CK1 to CK8 (not shown in FIG. 24), respectively. In order to minimize the number of embedded clocks needed for test, clock-domain analysis will be conducted. These embedded clocks can be specified in the ASCII format. An example is shown below:

```
%TA_CONSTRAINTS
{
    %CLOCK CK1 = '01000000000000000000000';
    %CLOCK CK2 = '00001000000000000000000';
    %CLOCK CK3 = '00000001000000000000000';
    %CLOCK CK4 = '00000000001000000000000';
    %CLOCK CK5 = '00000000000001000000000';
    %CLOCK CK6 = '00000000000000010000000';
    %CLOCK CK7 = '00000000000000000010000';
    %CLOCK CK8 = '00000000000000000000010';
}
```

Referring to FIG. 24, it is obvious that each embedded clock is assigned with a different phase. A total of 24 phases will be needed if nothing is done. During the clock-domain analysis, the CAD system will analyze the design 2400. It will be found that CK1 interacts with all other clock domains, CK2 and CK4 do not interact with each other, CK3, CK5, CK6, CK7, and CK8 do not interact with each other. In this case, the design 2400 can be tested by using only 3 system clocks, SCK1 2415 to SCK3 2417, in either non-overlapping or overlapping mode. Examples are shown as follows:

```
%CAPTURE_SEQUENCE    // In non-overlapping mode
{
    %CLOCK SCK1 = '0100000';
    %CLOCK SCK2 = '0001000';
    %CLOCK SCK3 = '0000010';
}
%CAPTURE_SEQUENCE    // In overlapping mode
{
    %CLOCK SCK1 = '0111000';
    %CLOCK SCK2 = '0011100';
    %CLOCK SCK3 = '0001110';
}
```

Here, SCK1={CK1}, SCK2={CK2, CK4}, and SCK3={CK3, CK5, CK6, CK7, CK8}. SCK2={CK2, CK4}, for example, means that system clock SCK2 2416 is wired to both embedded clocks CK2 and CK4 in full-scan or partial-scan mode to test stuck-at faults within both clock domains of CD2 2402 and CD4 2404, simultaneously. Each mode uses a total of 7 phases instead of 24 phases.

Figure 25:
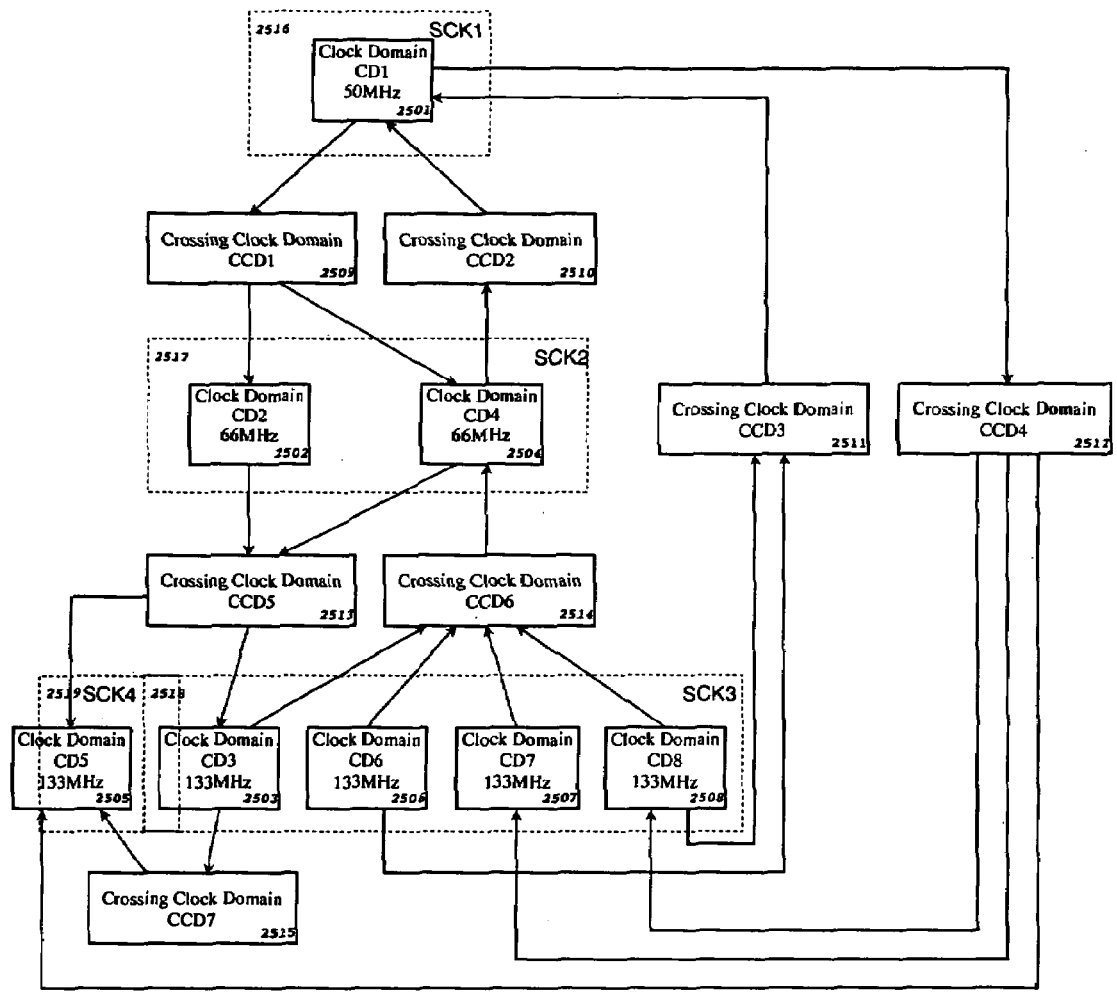
FIG. 25 shows an example design of a multiple-frequency multiple-capture scan design system with 8 clock domains in accordance with the present invention, the number of system clocks needed to test the 8 clock domains at-speed is reduced from 8 to 4.

FIG. 25 shows an example design of a multiple-frequency multiple-capture scan design system 2500 with 8 clock domains, CD1 2501 to CD8 2508, of one embodiment of the present invention. Assume that clock domains CD1 2501 to CD8 2508 are controlled by embedded clocks CK1 to CK8 (not shown in FIG. 25), respectively. In order to minimize the number of embedded clocks needed for test, clock-domain analysis will be conducted. These embedded clocks will be specified in the ASCII format. An example is shown below:

```
%TA_CONSTRAINTS
{
    %CLOCK CK1 = '010000000000000000000000';
    %CLOCK CK2 = '000010000000000000000000';
    %CLOCK CK3 = '000000010000000000000000';
    %CLOCK CK4 = '000000000010000000000000';
    %CLOCK CK5 = '000000000000010000000000';
    %CLOCK CK6 = '000000000000000010000000';
    %CLOCK CK7 = '000000000000000000010000';
    %CLOCK CK8 = '000000000000000000000010';
}
```

Referring to FIG. 25, it is obvious that each embedded clock is assigned with a different phase. A total of 24 phases will be needed if nothing is done. During clock-domain analysis, clock domains driven by clocks with the same frequency will be analyzed to see if they interact with each other. Assume that 3 different frequencies are used by the 8 clock domains, CD1 2501 to CD8 2508, as shown in FIG. 25. Since CD1 2501 is the only clock domain that operates at 50 MHz, there is no need to conduct clock-domain analysis on CK1 to check whether CD1 2501 interacts with other clock domains. That is, CD1 2501 should be tested independently with SCK1 2516.

Now assume that CK2 and CK4 operate at the same frequency of 66 MHz and that they do not interact with each other. In this case, the two embedded clocks, CK2 and CK4, can be merged into one clock SCK2 2517. Same assumption and analysis can be applied to clocks CK3, CK5, CK6, CK7, and CK8, all operating at 133 MHz. The result is that CK3, CK6, CK7, and CK8 can be merged into one clock SCK3 2518. However, clock CK5, though operating at the same frequency as clock CK3, CK6, CK7, and CK8, interacts with clock CK3 via CCD7 2515. That is, an independent clock, SCK4 2519, should be used for clock domain CD5 2505. Obviously, by conducting clock domain analysis, it can be found that the design 2500 can be tested with only 4 system clocks as shown below:

```
%CAPTURE_SEQUENCE    // In non-overlapping mode
{
    %CLOCK SCK1 = '0100000';
    %CLOCK SCK2 = '0001000';
    %CLOCK SCK3 = '0000010';
    %CLOCK SCK4 = '0001000';
}
```

The above 4 system clocks use only a total of 7 phases in this case, instead of 24 phases when clock domain analysis is not conducted. Here, SCK1={CK1}, SCK2={CK2, CK4}, SCK3={CK3, CK6, CK7, CK8}, and SCK4={CK5}. SCK2 ={CK2, CK4}, for example, means that SCK2 2517 is wired to both CK2 and CK4 in full-scan or partial-scan mode to detect or locate faults within both clock domains of CD2 2502 and CD4 2504 simultaneously. SCK2 2517 and SCK4 2519 can operate concurrently but at different frequencies. This is because the clock domains, CD2 2502 and CD4 2504, driven by SCK2 2517, and the clock domain DC5 2505 driven by SCK4 2519 do not interact with each other.

Figure 26:
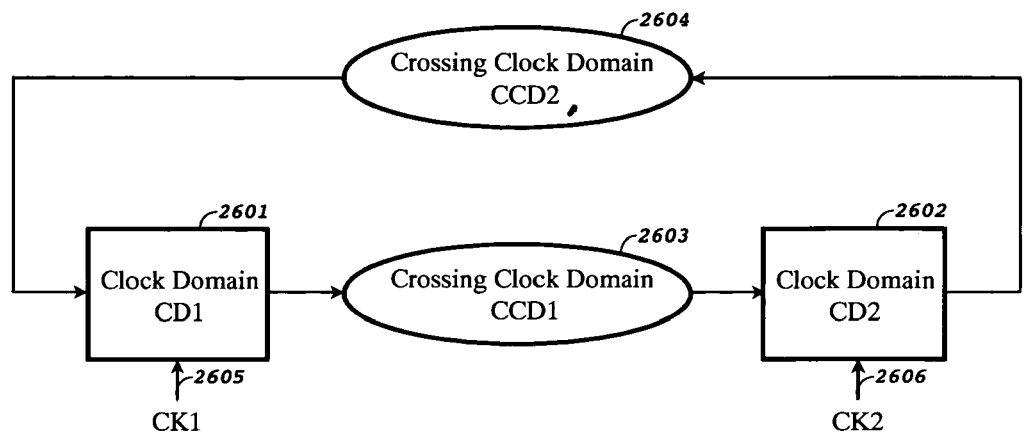
FIG. 26 shows an example design with 2 clock domains driven by 2 capture clocks in accordance with the present invention, where an optimal order for applying a sequence of the 2 capture clocks to the 2 clock domains in a capture cycle is identified in order to minimize the memory usage in transforming a scan-based integrated circuit or circuit assembly for fault simulation or ATPG (automatic test pattern generation)

FIG. 26 shows an example design with 2 clock domains driven by 2 capture clocks in accordance with the present invention, where an optimal order for applying a sequence of the 2 capture clocks to the 2 clock domains in a capture cycle is identified in order to minimize the memory usage in transforming a scan-based integrated circuit or circuit assembly for fault simulation or ATPG (automatic test pattern generation).

As shown in FIG. 26, clock domains CD1 2601 and CD2 2602 are driven by capture clocks CK1 2605 and CK2 2606, respectively. In addition, there is a unidirectional crossing clock domain logic block CCD1 2603 from CD1 2601 to CD2 2602, and there is a unidirectional crossing clock domain logic block CCD2 2604 from CD2 2602 to CD1 2601. Assume that, the sizes of CD1 2601, CD2 2602, CCD1 2603, and CCD2 2604, measured by the number of combinational logic primitives, are denoted by S(CD1), S(CD2), S(CCD1), and S(CCD2). In addition, assume that a single capture clock pulse is applied to each capture clock in a capture cycle.

First, consider the capture order of CK1 2605 to CK2 2606. When CK1 2605 captures, S(CD1)+S(CCD2) of memory is needed for circuit transformation; then, when CK2 2606 captures, S(CD1)+S(CD2)+S(CCD1)+S(CCD2) of memory is needed for circuit transformation since values in clock domain CD1 2601 have already changed because of the CK1 2605 capture. That is, the total memory usage for this capture clock order is proportional to A=2*S (CD1)+S(CCD1)+S (CD2)+2*S(CCD2).

Second, consider the capture order of CK2 2606 to CK1 2605. When CK2 2606 captures, S(CCD1)+S(CD2) of memory is needed for circuit transformation since values in clock domain CD1 2601 have yet changed; then, when CK1 2605 captures, S(CD1)+S(CD2)+S(CCD1)+S(CCD2) of memory is needed for circuit transformation. That is, the total memory usage for this capture clock order is proportional to B=S(CD1)+2*S(CCD1)+2*S(CD2)+S(CCD2).

The difference in memory usage is A−B=(S(CD1)+S(CCD2))−(S(CD2)+S(CCD1)). Obviously, depending on the sizes of clock domains CD1 2601 and CD2 2602 as well as crossing clock domain logic blocks CCD1 2603 and CCD2 2604, one can identify the best order for capture clocks CK1 2605 and CK2 2606.

Figure 27A:
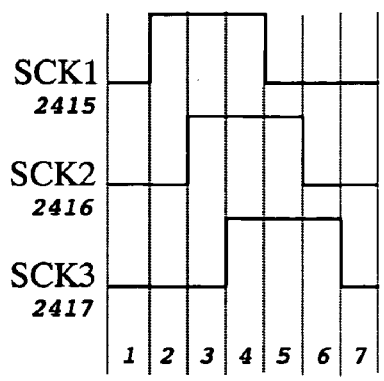
FIG. 27 shows a timing diagram for the design given in FIG. 24 in accordance with the present invention, where a single-frequency multiple-capture test generation technique using multiple time frames is applied for detecting or locating stuck-at faults within each clock domain and stuck-at faults crossing clock domains in full-scan or feed-forward partial-scan mode.
Figure 27B:
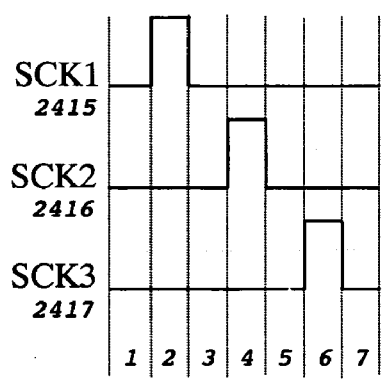

FIG. 27 shows a timing diagram for the design given in FIG. 24 in accordance with the present invention, where a single-frequency multiple-capture test generation technique using multiple time frames is applied for detecting or locating stuck-at faults within each clock domain and stuck-at faults crossing clock domains in full-scan or feed-forward partial-scan mode;

As shown in FIG. 24, by clock-domain analysis, it can be found that only 3 system clocks, SCK1 2415 to SCK3 2417, are needed for test. Assume that the capture clock order has been determined to be SCK1 2415 first, SCK2 2416 second, and SCK3 2417 third. If an overlapping capture clock scheme is used, the 3 system clocks, SCK1 2415 to SCK3 2417, can be specified as 0111000, 0011100, and 0001110, respectively, which have a total of 7 clock phases, as shown in FIG. 27A. The 7 clock phases need 7 time frames in the transformed equivalent combinational circuit model. If a non-overlapping capture clock scheme is used, the 3 system clocks, SCK1 2415 to SCK3 2417, can be specified as 0100000, 0001000, and 0000010, respectively, which have a total of 7 clock phases, as shown in FIG. 27B. The 7 clock phases also need 7 time frames in the transformed equivalent combinational circuit model.

Figure 27C:
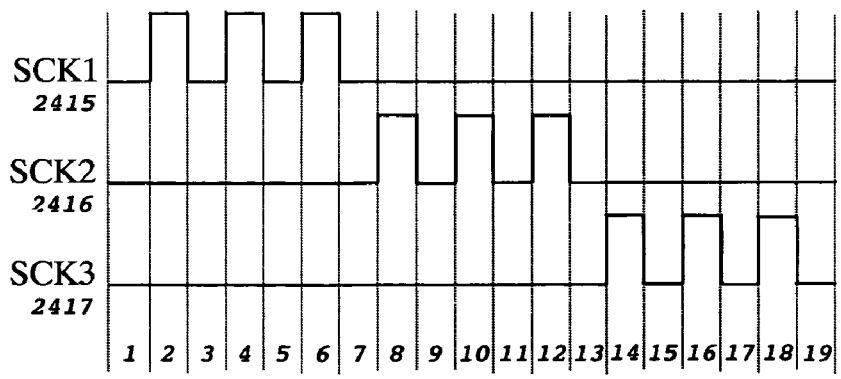

In feed-forward partial-scan mode, more time frames are needed to detect or locate stuck-at faults. In the above example, if a non-overlapping clock scheme is used for a feed-forward partial-scan design with a cell depth of 2, then two functional pulses and one capture pulse will be applied for each clock domain. In this case, the 3 system clocks, SCK1 2415 to SCK3 2417, can be specified as 0101010000000000, 0000000101010000000, and 0000000000000101010, respectively. In this case, a total of 19 time frames are used, as shown in FIG. 27C.

Note that transforming a design database into an equivalent combinational circuit model means duplicating the design database as many time frames as needed according to an optimal ordered sequence of capture clocks. Furthermore, it should be noted that circuit transformation involves removing or pruning constant logic tied to logic value 0, 1, unknown (X) or high-impedance (Z), uncontrollable logic, unobservable logic, and uncontrollable/unobservable logic from the original design database. This will reduce memory usage.

FIG. 28 shows a timing diagram for the design given in FIG. 25 in accordance with the present invention, where a multiple-frequency multiple-capture test generation technique using multiple time frames is applied for detecting or locating delay faults within each clock domain and stuck-at faults crossing clock domains in full-scan or feed-forward partial-scan mode.

Figure 28A:
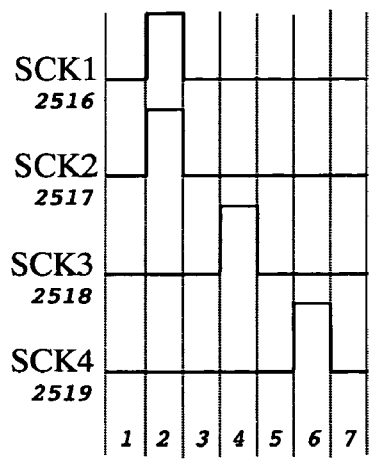
FIG. 28 shows a timing diagram for the design given in FIG. 25 in accordance with the present invention, where a multiple-frequency multiple-capture test generation technique using multiple time frames is applied for detecting or locating delay faults within each clock domain and stuck-at faults crossing clock domains in full-scan or feed-forward partial-scan mode.

As shown in FIG. 25, by clock-domain analysis, it can be found that only 4 system clocks, SCK1 2516 to SCK4 2519, are needed for test. Since both SCK2 2517 and SCK4 2519 do not interact with each other, they can operate concurrently but at different frequencies. Assume that the capture clock order has been determined to be SCK1 2516 first, SCK2 (and hence SCK4 2517) second, and SCK3 2518 third. In this case, the 4 system clocks, SCK1 2516 to SCK4 2519, can be specified as 0100000, 0001000, 0000010, and 0001000 as shown in FIG. 28A. In this case, a total of 7 clock phases are used. As a result, a total of 7 time frames are needed for the transformed equivalent combinational circuit model.

Figure 28B:
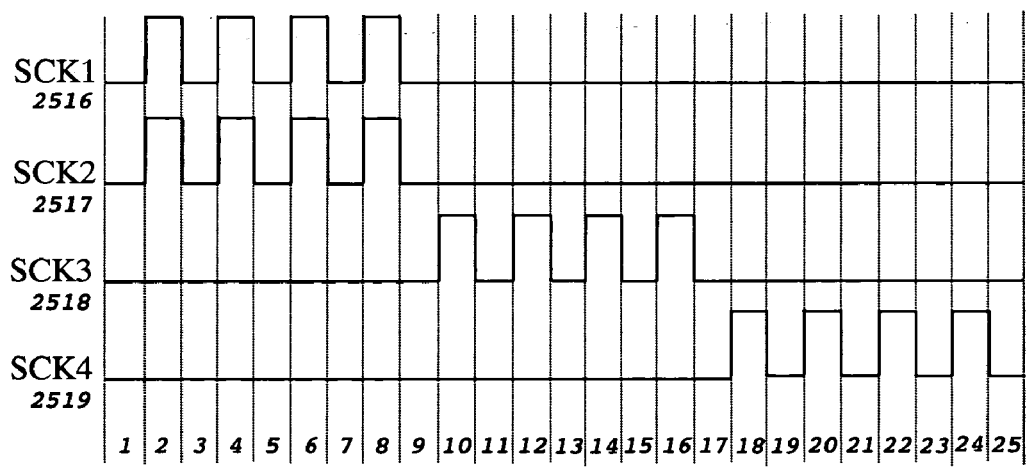

In feed-forward partial-scan mode, more time frames are needed to detect or locate delay faults. Assume that the design shown in FIG. 25 is a feed-forward partial-scan design with a cell depth of 2. In this case, one shift pulse, two functional pulses, and one capture pulse will be needed for each clock domain. The 4 system clocks, SCK1 2516 to SCK4 2519, can be specified as 0101010100000000000000, 0001010101000000000, 00000000000000010101010, and 000000000101010100000000 respectively. In this case, a total of 25 clock phases are used, as shown in FIG. 28B. As a result, a total of 25 time frames are needed for the transformed equivalent combinational circuit model.

Note that transforming a design database into an equivalent combinational circuit model means duplicating the design database as many time frames as needed according to an optimal ordered sequence of capture clocks. Furthermore, it should be noted that circuit transformation involves removing or pruning constant logic tied to logic value 0, 1, unknown (X) or high-impedance (Z), uncontrollable logic, unobservable logic, and uncontrollable/unobservable logic from the original design database. This will reduce memory usage.

FIG. 29 shows an example of transparent scan cell retiming, in accordance with the present invention. FIG. 29A shows two neighboring scan cells SC1 2901 and SC2 2902 in a scan chain, before a shift operation is conducted. Here, the values on scan inputs 2903 and 2904 are assumed to be Vp and Vq. FIG. 29B shows the shift result after one shift pulse is applied to the circuit shown in FIG. 29A, assuming that there is no clock skew between CK1 2906 and CK2 2907. Note that, the scan cell outputs 2904 and 2905 have values Vp and Vq, which is the correct shift result. This is usually the case where SC1 2901 and SC2 2902 are in the same clock domain whose clock skew is minimized. FIG. 29C shows the shift result after one shift pulse is applied to the circuit shown in FIG. 29A, assuming that there is substantial clock skew between CK1 2906 and CK2 2907, which causes the shift clock pulse to arrive at CK2 2907 later than CK1 2906. This is the case where SC1 2901 and SC2 2902 are in the same clock domain whose clock skew is not minimized or SC1 2901 and SC2 2902 are in different clock domains. Note that, the scan cell outputs 2904 and 2905 now both have the value Vp, which is not a correct shift result. This problem can be corrected by adjusting layout; however, this solution is costly and often impossible due to a tight schedule.

Figure 29A:
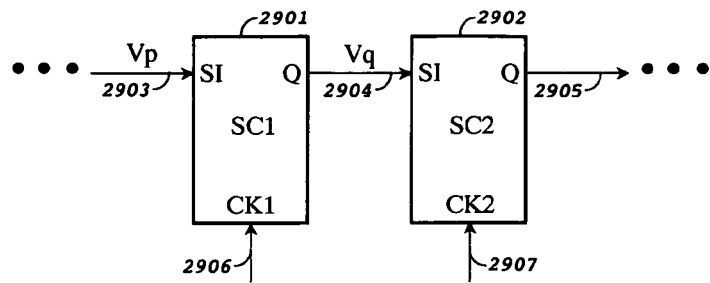
FIG. 29 shows an example design showing transparent scan cell retiming in accordance with the present invention, where any specified scan cell is treated as a buffer and where a single-frequency or multiple-frequency multiple-capture test generation technique using multiple time frames is used to generate valid scan patterns, even in the presence of hold-time violations in scan chains, for detecting or locating faults in full-scan or feed-forward partial-scan mode.
Figure 29B:
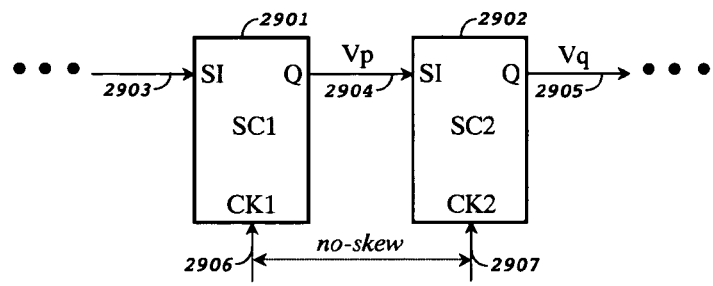
Figure 29C:
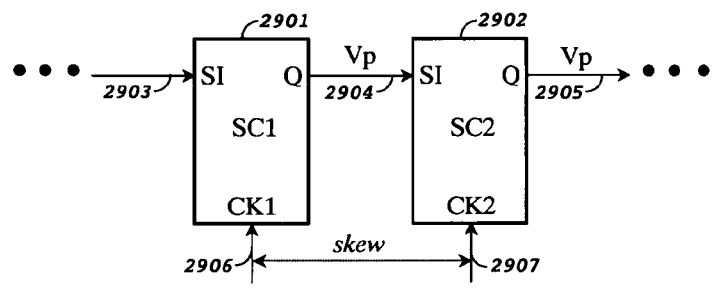
Figure 29D:
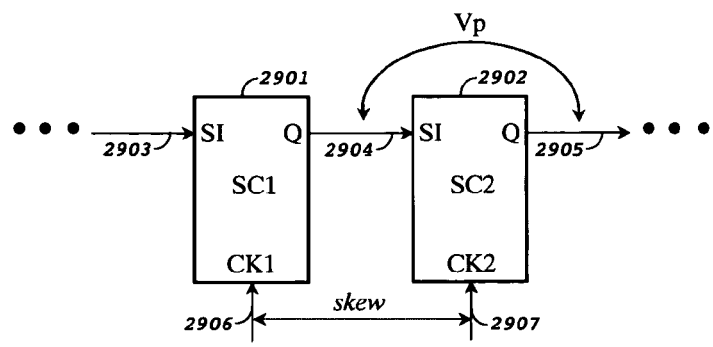
Figure 30A:
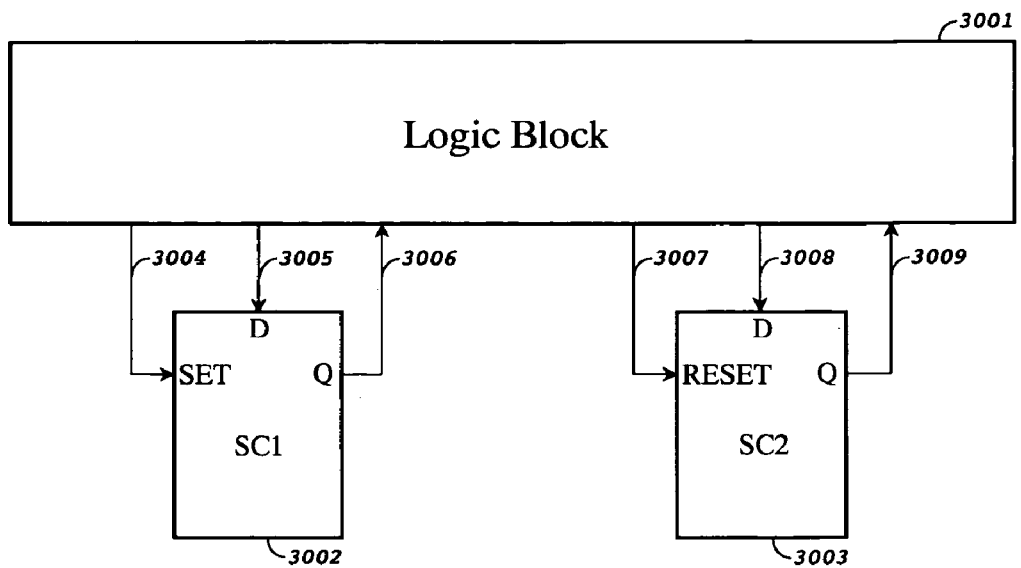
FIG. 30 shows an example asynchronous set/reset design and its reconfigured circuitry in accordance with the present invention, where safe shift operations are guaranteed and where a single-frequency or multiple-frequency multiple-capture test generation technique using multiple time frames is used to generate race-free scan patterns for detecting or locating faults associated with asynchronous set/reset signals in full-scan or feed-forward partial-scan mode.
Figure 30B:
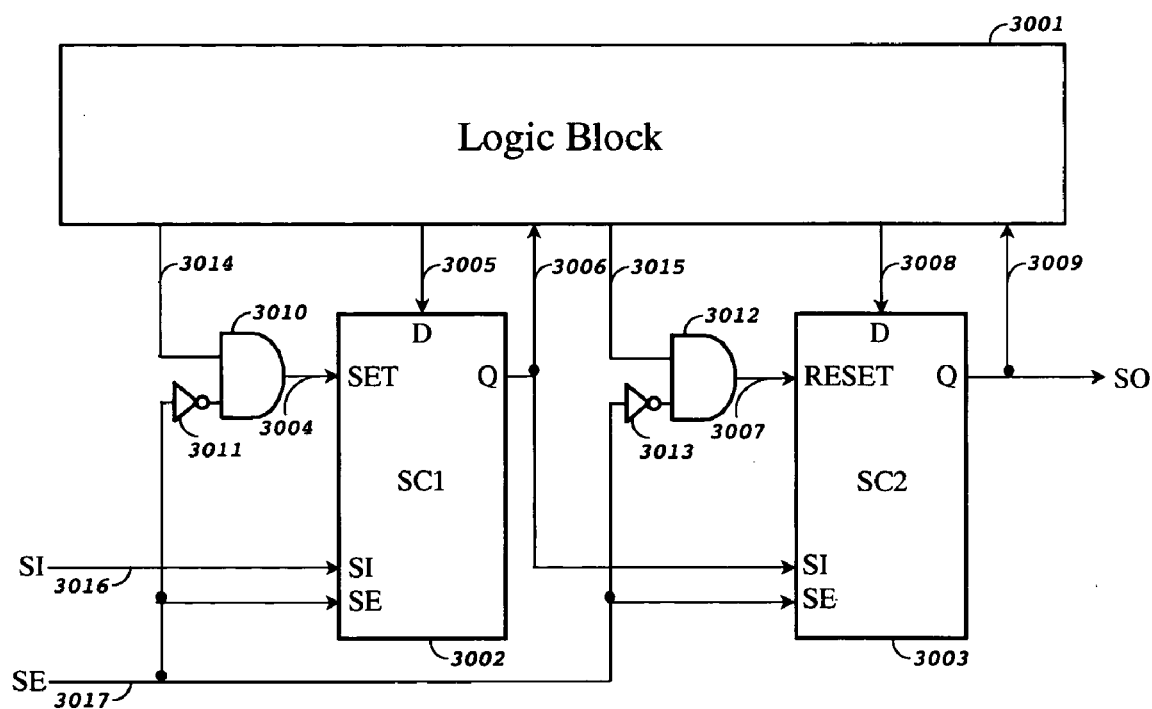

The test pattern generation technique in the present invention can remove the need for layout fixes by taking the transparent data passing into consideration. That is, when so specified as shown in FIG. 29D, the test pattern generation algorithm will treat scan cell SC2 2902 as a transparent scan cell or virtually as a buffer, thus guaranteeing correcting data recognition even in the presence of hold-time violations. FIG. 30 shows an example for handling asynchronous set/reset signals, in accordance with the present invention. FIG. 30A shows an original design with one asynchronous set signal 3004 and one asynchronous reset signal 3007. In this case, when scan cells SC1 3002 and SC2 3003 are in shift mode, it is possible that the asynchronous set signal 3004 or the asynchronous reset signal 3007 is set to logic value 1. This will destroy what has been shifted into the corresponding scan cell. The problem can be solved by disabling the asynchronous set/reset signals during a shift cycle, as shown in FIG. 30B. Here, a combination of a NOT gate 3011 and an AND gate 3010 are used for SC1 3002, while a combination of a NOT gate 3013 and an AND gate 3012 are used for SC2 3003.

Since the scan enable signal SE 3017 has logic value 1 during a shift cycle, the asynchronous set signal 3004 and reset signal 3007 are disabled in a shift cycle, thus guaranteeing a correct shift operation.

In addition, in order to guarantee race-free before-capture (when system clocks are held at logic value 0) and after-capture (when system clocks are triggered), the multiple-capture test generation algorithm must make sure that the content of any scan cell will not be destroyed due to any hazard created on its asynchronous set or reset port, during a hold or capture cycle. For this purpose, constraints are embedded on the test pattern generation algorithm. Since a scan enable signal can be enabled or disabled in a capture cycle, its value can be changed to either logic value 0 or logic value 1 as desired. As a result, all faults feeding into asynchronous set/reset signals of scan cells will be tested. In addition, the generated scan patterns will be guaranteed to be race-free.

Figure 31A:
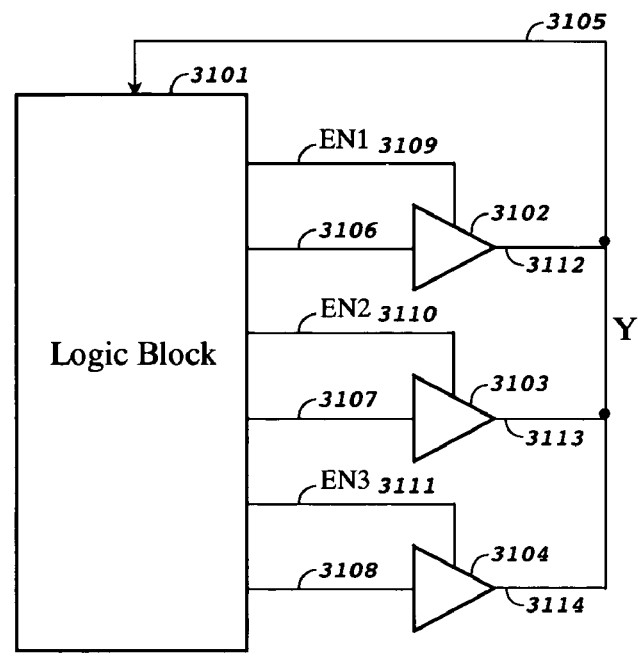
FIG. 31 shows an example tri-state bus design and its reconfigured circuitry in accordance with the present invention, where safe shift operations are guaranteed and where a single-frequency or multiple-frequency multiple-capture test generation technique using multiple time frames is used to generate contention-free scan patterns for detecting or locating faults associated with tri-state busses in full-scan or feed-forward partial-scan mode.
Figure 31B:
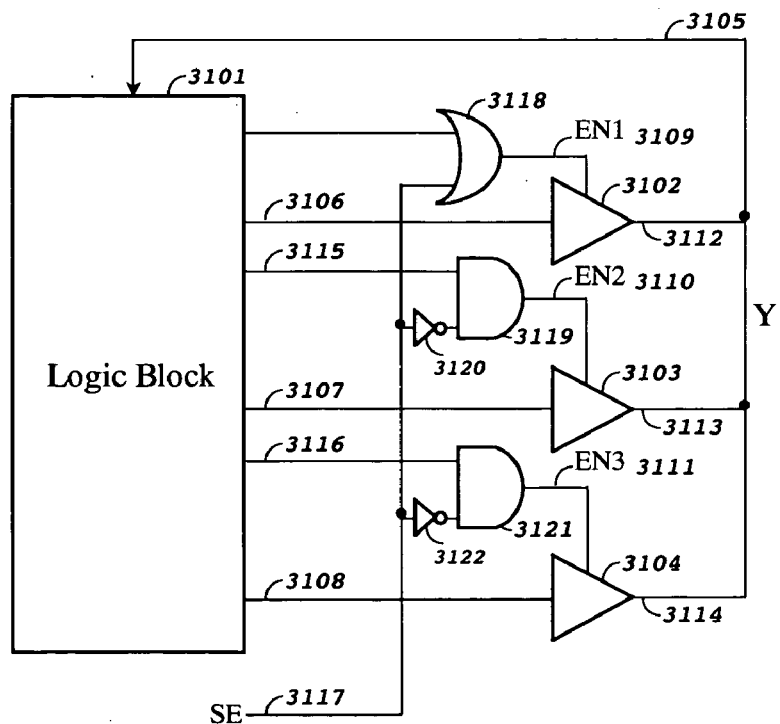

FIG. 31 shows an example for handling tri-state bus logic, in accordance with the present invention. FIG. 31A shows a tri-state bus structure, where 3 bus drivers 3102 to 3104 drive a bus Y 3105. Here, the bus enable signals EN1 3109 to EN3 3111 may be not fully decoded. In this case, when scan chains in the logic block 3101 are in shift mode, it is possible that more than one bus drivers are activated, thus creating a bus contention. This problem can be solved by disabling all but one bus driver during a shift cycle, as shown in FIG. 31B. Here, in a shift cycle, the enable signal EN1 3109 will be logic value 1 while the enable signals EN2 3110 and EN3 3111 will always be logic value 0. As a result, no bus contention will occur in a shift cycle.

In addition, during a capture cycle where a scan pattern is generated, in order to guarantee contention-free before-capture (when system clocks are held at logic value 0) and after-capture (when system clocks are triggered), constraints are embedded on the test pattern generation algorithm. As a result, the test generation algorithm will generate a contention-free scan patterns. During a hold or capture cycle, the test generation algorithm must observe the embedded constraints while generating scan patterns. Since a scan enable (SE) signal can be enabled or disabled in a capture cycle, its value can be changed to either logic value 0 or logic value 1 as desired. As a result, all faults associated with tri-state busses will be tested. In addition, generated scan patterns will be guaranteed to be contention-free.

Figure 32A:
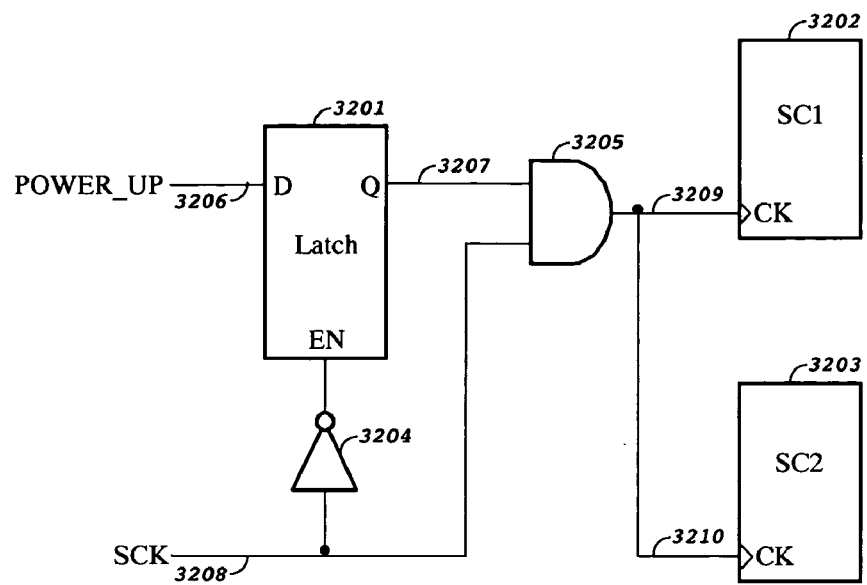
FIG. 32 shows an example low-power gated clock design and its reconfigured circuitry in accordance with the present invention, where a single-frequency or multiple-frequency multiple-capture test generation technique using multiple time frames is used to generate scan patterns for detecting or locating faults associated with a low-power gated clock design circuitry in full-scan or feed-forward partial-scan mode.
Figure 32B:
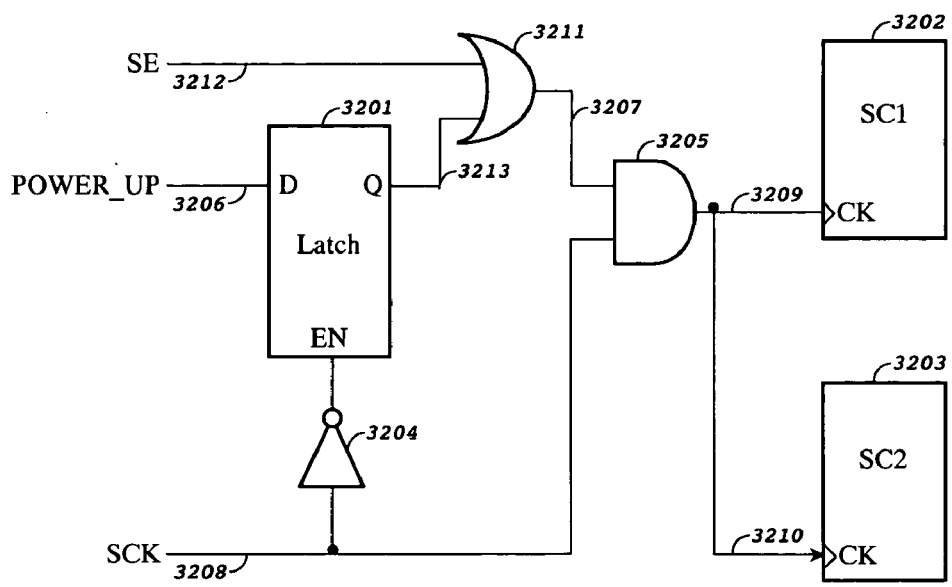

FIG. 32 shows an example for handling low-power gated clocks, in accordance with the present invention. FIG. 32A shows a logic design with the low-power feature. Since clocks 3209 and 3210, which are used to drive scan cells SC1 3202 and SC2 3203, are gated with the output of the latch 3201, there is no guarantee that scan cells SC1 3202 and SC2 3203 will shift properly by reacting to each SCK 3208 pulse in a shift cycle. The solution to this problem is shown in FIG. 32B, where an OR gate 3211 is added. It is also possible to add such an OR gate 3211 at the POWER_UP 3206 input. Since SE 3212 is logic value 1 in a shift cycle, SCK3208 will in effect drive or enable scan cells SC1 3202 and SC2 3203 directly in a shift cycle. As a result, scan cells SC1 3202 and SC2 3203 will shift properly in a shift cycle.

Figure 33:
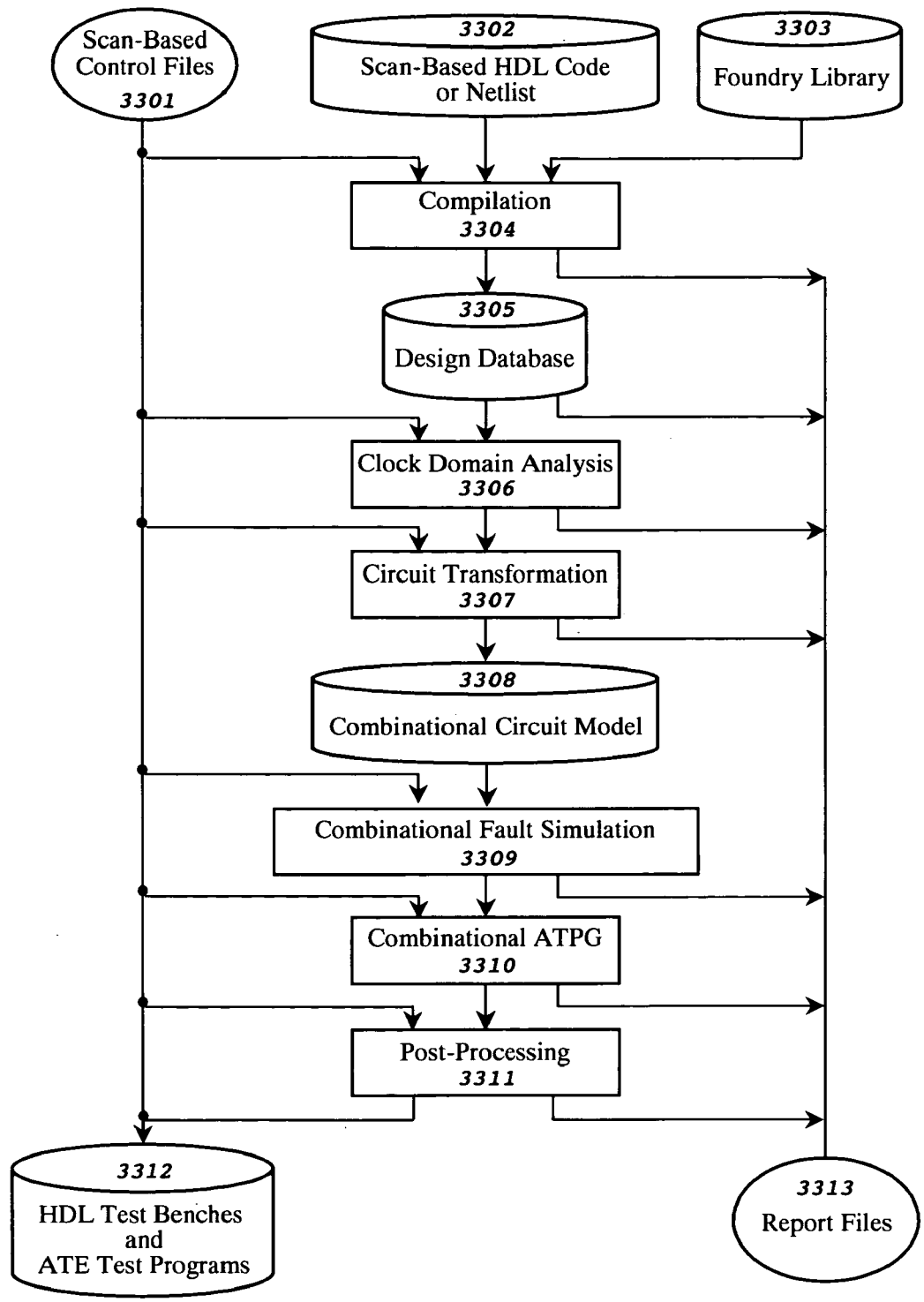
FIG. 33 shows a multiple-capture computer-aided design (CAD) method in accordance with the present invention to test a scan-based integrated circuit or circuit assembly in full-scan or feed-forward partial-scan mode.

FIG. 33 shows a flow chart of one embodiment of the present invention. The multiple-capture scan test computer-aided design (CAD) system 3300 accepts a user-supplied scan-based HDL (hardware description language) code or gate-level netlist 3302 together with scan-test control files 3301 and a chosen foundry library 3303. The scan-based HDL code or netlist is either a self-test HDL code or netlist when self-test is employed or a scan HDL code or netlist when scan-test is employed.

The scan-based control files contain all set-up information and scripts required for design compilation 3304 to prepare a design into an internal database 3305, clock-domain analysis 3306, circuit transformation 3307 to convert the original design into an equivalent combinational circuit model 3308 corresponding to multiple time frames, selected combinational fault simulation 3309 with a selected number of pseudorandom stimuli, and selected combinational ATPG (automatic test pattern generation) 3310 to generate a plurality of scan patterns or predetermined stimuli. The combinational fault simulation can be used for self-test or scan-test, while the combinational ATPG is mainly used for scan-test.

The CAD system can produce HDL test benches and ATE (automatic test equipment) test programs 3312 as its output. All reports and errors are logged in the report files 3313. This CAD system will accept any tester-specific timing diagram, specified in the ASCII format, as shown by the following example:

```
%TEST_CONVERSION
{
    %SET_TIMING
    {
        %CYCLE = 100;              // The chosen ATE cycle time is 100ns
        %PI_TIME = 5 scan_en, test_en;    // Both scan_en & test_en change value at 5ns
        %DEFAULT_PI_TIME = 10;     // All data inputs change value at 10ns
        %P_CLOCK = 20 30 SCK1;     // The SCK1 clock rises at 20ns and falls at 30ns
        %P_CLOCK = 40 50 SCK2;     // The SCK2 clock rises at 40ns and falls at 50ns
        %P_CLOCK = 60 70 SCK3;     // The SCK3 clock rises at 60ns and falls at 70ns
        %P_CLOCK = 80 90 SCK4;     // The SCK4 clock rises at 80ns and falls at 90ns
        %DEFAULT_PO_TIME = 99;     // All primary outputs will be strobed at 99ns
        %DEFAULT_IO_TIME = 10 99;  // All bi-directional inputs change value at 10ns;
                                    // All bi-directional outputs will be strobed at 99ns
    }
}
```

Figure 34:
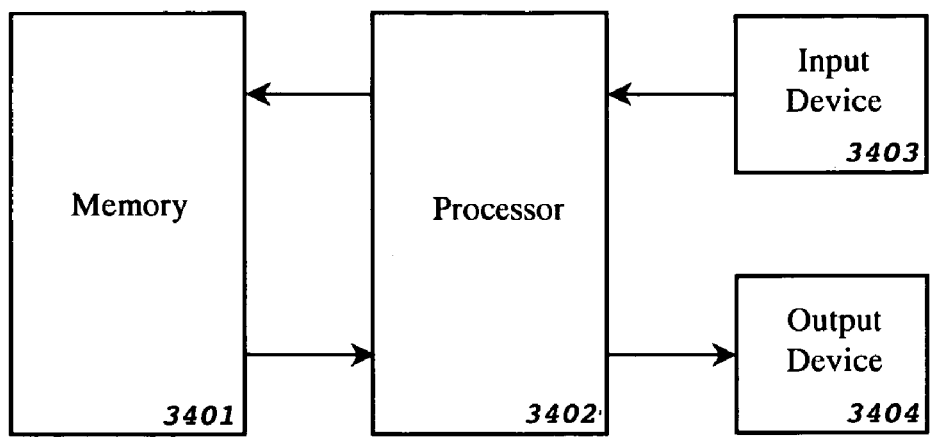
FIG. 34 shows an example system in which the multiple-capture computer-aided design (CAD) method, in accordance with the present invention, may be implemented.

FIG. 34 shows an example system in which the multiple-capture computer-aided design (CAD) method, in accordance with the present invention, may be implemented. The system 3400 includes a processor 3402, which operates together with a memory 3401 to run a set of the multiple-capture DFT design software. The processor 3402 may represent a central processing unit of a personal computer, workstation, mainframe computer or other suitable digital processing device. The memory 3402 can be an electronic memory or a magnetic or optical disk-based memory, or various combinations thereof. A designer interacts with the multiple-capture DFT design software run by processor 3402 to provide appropriate inputs via an input device 3403, which may be a keyboard, disk drive or other suitable source of design information. The processor 3402 provides outputs to the designer via an output device 3404, which may be a display, a printer, a disk drive or various combinations of these and other elements.

Having thus described presently preferred embodiments of the present invention, it can now be appreciated that the objectives of the present invention have been fully achieved.

And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for providing ordered capture clocks to detect or locate faults within N clock domains and faults crossing any two clock domains in an integrated circuit or circuit assembly during scan-test, where N >1, each clock domain having one or more capture clocks and one or more scan cells, each capture clock comprising a selected number of shift clock pulses and a selected number of capture clock pulses, each shift clock pulse comprising a clock pulse applied in scan mode, each capture clock pulse comprising a clock pulse applied in normal mode; said method comprising the steps of:
   (a) generating and loading N predetermined stimuli to all said scan cells within said N clock domains in said integrated circuit or circuit assembly, by applying first selected shift clock pulses to all said scan cells in said scan mode for loading or shifting-in said N predetermined stimuli to all said scan cells, during a shift operation;
   (b) applying an ordered sequence of clock pulses to all said scan cells within said N clock domains during a capture operation, the ordered sequence of clock pulses comprising at least a second selected shift clock pulse and a capture clock pulse from two or more selected capture clocks, for controlling two or more clock domains, in a sequential order, wherein one said selected capture clock must contain at least one said second selected shift clock pulse and the other said selected capture clock must contain at least one said capture clock pulse, and when detecting or locating selected delay faults within a clock domain, said selected capture clock controlling the clock domain selectively contains at least two consecutive capture clock pulses or a second selected shift clock pulse followed by at least one capture clock pulse to launch the transition and capture the output response; and
   (c) comparing N output responses directly with their expected output responses for all said scan cells within said N clock domains and indicating errors immediately, by applying said first selected shift clock pulses to all said scan cells in said scan mode for comparing or shifting-out said N output responses for comparison with said expected output responses, during a compare operation.

2. The method of claim 1, wherein each said capture clock is programmable to contain said ordered sequence of clock pulses, for performing said capture operation on all said scan cells within a selected clock domain controlled by said capture clock.

3. The method of claim 1, further comprising providing two or more scan enable (SE) signals each for controlling a selected clock domain; wherein all said scan enable (SE) signals are used to switch said shift/compare and capture operation; and wherein each said scan enable (SE) signal is selectively generated internally or controlled externally, and can be selectively operated at said selected clock domain?s rated clock speed or at a selected clock speed.

4. The method of claim 3, wherein all said scan enable (SE) signals are used to switch said shift/compare and capture operation further comprises selectively operating a said scan enable (SE) signal in a selected clock domain at said selected clock domain?s rated clock speed, when a said capture clock controlling said selected clock domain contains one or more said second selected shift clock pulses, during each said capture operation.

5. The method of claim 3, wherein said providing two or more scan enable (SE) signals further comprises using a global scan enable (GSE) signal to drive one or more said scan enable (SE) signals, when the clock domains controlled by said one or more scan enable (SE) signals do not contain any said second selected shift clock pulse during each said capture operation; wherein said global scan enable (GSE) signal is operated at a selected reduced clock speed.

6. The method of claim 1, wherein said generating and loading N predetermined stimuli to all said scan cells further comprises operating all said first selected shift clock pulses at selected clock speeds or at the same clock speed; wherein all said first selected shift clock pulses are selectively skewed so that at any given time only one or more said scan cells are changing states to reduce power consumption.

7. The method of claim 1, wherein said applying an ordered sequence of clock pulses further comprises applying said clock pulses concurrently to two or more selected clock domains which do not interact with each other or do not have any combinational logic block crossing each other, for detecting or locating said faults in said selected clock domains.

8. The method of claim 1, wherein said applying an ordered sequence of clock pulses further comprises applying a reversed ordered sequence of clock pulses from said ordered sequence of clock pulses, for detecting or locating additional faults in said integrated circuit or circuit assembly.

9. The method of claim 1, wherein said applying an ordered sequence of clock pulses further comprises selectively applying a shortened or expanded ordered sequence of clock pulses from said ordered sequence of clock pulses, for detecting or locating additional faults in said integrated circuit or circuit assembly.

10. The method of claim 1, wherein said applying an ordered sequence of clock pulses further comprises disabling all clock pulses in one or more capture clocks, to facilitate fault diagnosis.

11. The method of claim 1, wherein said applying an ordered sequence of clock pulses further comprises selectively operating all said clock pulses controlling a selected clock domain at a selected clock speed, for detecting or locating stuck-at faults within said selected clock domain.

12. The method of claim 1, wherein said applying an ordered sequence of clock pulses further comprises selectively operating all said clock pulses controlling a selected clock domain at their rated clock speed, for detecting or locating delay faults within said selected clock domain.

13. The method of claim 1, wherein said applying an ordered sequence of clock pulses further comprises selectively reducing the speed of all said clock pulses controlling a selected clock domain to the level, where delay faults associated with all multiple-cycle paths of equal cycle latency within said selected clock domain are detected or located at a predetermined rated clock speed.

14. The method of claim 1, wherein said applying an ordered sequence of clock pulses further comprises selectively operating all said clock pulses controlling two selected clock domains at selected clock speeds, for detecting or locating stuck-at faults crossing said two selected clock domains.

15. The method of claim 1, wherein said applying an ordered sequence of clock pulses further comprises selectively adjusting the relative clock delay of two said clock pulses controlling two selected clock domains, for detecting or locating delay faults crossing said two selected clock domains.

16. The method of claim 1, wherein said applying an ordered sequence of clock pulses further comprises selectively adjusting the relative clock delay of two said clock pulses controlling two selected clock domains to the level, where delay faults associated with all multiple-cycle paths of equal cycle latency crossing said two selected clock domains are detected or located at a predetermined rated clock speed.

17. The method of claim 1, wherein said applying an ordered sequence of clock pulses further comprises controlling the relative clock delay between any two adjacent clock pulses inside or external to said integrated circuit or circuit assembly.

18. The method of claim 1, providing an automatic test equipment (ATE) and wherein said comparing N output responses directly with their expected output responses during a compare operation further comprises selectively comparing said N output responses directly with said expected output responses in said ATE.

19. The method of claim 1, wherein said comparing N output responses directly with their expected output responses during a compare operation further comprises selectively compacting said N output responses to signatures using a compact operation.

20. The method of claim 19, providing an automatic test equipment (ATE) and wherein said compacting said N output responses to signatures further comprises comparing said signatures with their expected signatures after a predetermined limiting criterion is reached; wherein said said integrated circuit or circuit assembly, or shifting-out comparing said signatures with their expected signatures further comprises selectively comparing said signatures inside said integrated circuit or circuit assembly, or shifting-out said signatures for comparison in said ATE.

21. The method of claim 1, wherein said scan cell is selectively a multiplexed D flip-flop or a level-sensitive scan latch, and further wherein said integrated circuit or circuit assembly under test is a full-scan or partial-scan design.

22. The method of claim 1, wherein said faults further comprise stuck-at faults and delay faults; wherein said stuck-at faults further comprise other stuck-type faults, including open faults, IDDQ (IDD quiescent current) faults, and bridging faults, and wherein said delay faults further comprise other non-stuck-type delay faults, including transition (gate delay) faults, multiple-cycle delay faults, and path delay faults.

23. An apparatus for providing ordered capture clocks to detect or locate faults within N clock domains and faults crossing any two clock domains in an integrated circuit or circuit assembly during scan-test, where N >1, each clock domain having one or more capture clocks and one or more scan cells, each capture clock comprising a selected number of shift clock pulses and a selected number of capture clock pulses, each shift clock pulse comprising a clock pulse applied in scan mode, each capture clock pulse comprising a clock pulse applied in normal mode; said apparatus comprising:

(a) a first hardware for generating and loading N predetermined stimuli to all said scan cells within said N clock domains in said integrated circuit or circuit assembly, by applying first selected shift clock pulses to all said scan cells in said scan mode for loading or shifting-in said N predetermined stimuli to all said scan cells, during a shift operation;

(b) a second hardware for applying an ordered sequence of clock pulses to all said scan cells within said N clock domains during a capture operation, the ordered sequence of clock pulses comprising at least a second selected shift clock pulse and a capture clock pulse from two or more selected capture clocks, for controlling two or more clock domains, in a sequential order, wherein one said selected capture clock must contain at least one said second selected shift clock pulse and the other said selected capture clock must contain at least one said capture clock pulse, and when detecting or locating selected delay faults within a clock domain, said selected capture clock controlling the clock domain selectively contains at least two consecutive capture clock pulses or a second selected shift clock pulse followed by at least one capture clock pulse to launch the transition and capture the output response; and (c) a third hardware for comparing N output responses directly with their expected output responses for all said scan cells within said N clock domains and indicating errors immediately, by applying said first selected shift clock pulses to all said scan cells in said scan mode for comparing or shifting-out said N output responses for comparison with said expected output responses, during a compare operation.

24. The apparatus of claim 23, further comprising a fourth hardware for indicating errors after a predetermined limiting criterion is reached.

25. The apparatus of claim 23, further comprising a fifth hardware for programming each said capture clock to contain said ordered sequence of clock pulses, for performing said capture operation on all said scan cells within a selected clock domain controlled by said capture clock.

26. The apparatus of claim 23, providing an automatic test equipment (ATE) and wherein said first hardware for generating and loading N predetermined stimuli to all said scan cells further comprises a first additional hardware for loading and shifting-in said N predetermined stimuli to all said scan cells selectively within said integrated circuit or circuit assembly, or through said ATE.

27. The apparatus of claim 23, wherein said second hardware for applying an ordered sequence of clock pulses further comprises a second additional hardware for generating said ordered sequence of clock pulses during each said capture operation.

28. The apparatus of claim 23, providing an automatic test equipment (ATE) and wherein said third hardware for comparing N output responses directly with their expected output responses during a compare operation further comprises a third additional hardware for selectively comparing said N output responses directly with their expected output responses in said ATE.

29. The apparatus of claim 23, wherein said third hardware for comparing N output responses directly with their expected output responses during a compare operation further comprises a fourth additional hardware for selectively compacting said N output responses to signatures using a compact operation.

30. The apparatus of claim 29, providing an automatic test equipment (ATE) and wherein said fourth additional hardware for selectively compacting said N output responses to signatures further comprises a fifth additional hardware for comparing said signatures with their expected signature after a predetermined limiting criterion is reached; wherein said fifth additional hardware for comparing said signatures with their expected signatures further comprises a sixth additional hardware for selectively comparing said signatures inside said integrated circuit or circuit assembly, or shifting out said signatures for comparison in said ATE.

31. The apparatus of claim 23, wherein said scan cell is selectively a multiplexed D flip-flop or a level-sensitive scan latch, and further wherein said integrated circuit or circuit assembly under test is a full-scan or partial-scan design.

32. The apparatus of claim 23, wherein said faults further comprise stuck-at faults and delay faults; wherein said stuck-at faults further comprise other stuck type faults, including open faults, IDDQ (IDD quiescent current) faults, and bridging faults, and wherein said delay faults further comprise other non-stuck-type delay faults, including transition (gate-delay) faults, multiple-cycle delay faults, and path-delay faults.

33. The apparatus of claim 23, wherein each said hardware of (a)-(c) is selectively placed inside or external to said integrated circuit or circuit assembly.

* * * * *